(12) United States Patent
Son

(10) Patent No.: US 11,637,104 B2
(45) Date of Patent: Apr. 25, 2023

(54) SEMICONDUCTOR MEMORY DEVICES INCLUDING STACKED TRANSISTORS AND METHODS OF FABRICATING THE SAME

(71) Applicant: Samsung Electronics Co., Ltd., Suwon-si (KR)

(72) Inventor: Yong-Hoon Son, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 284 days.

(21) Appl. No.: 17/036,462

(22) Filed: Sep. 29, 2020

(65) Prior Publication Data

US 2021/0257370 A1    Aug. 19, 2021

(30) Foreign Application Priority Data

Feb. 13, 2020   (KR) .................. 10-2020-0017517

(51) Int. Cl.
*H01L 27/108* (2006.01)
*G11C 7/18* (2006.01)

(52) U.S. Cl.
CPC ......... *H01L 27/10808* (2013.01); *G11C 7/18* (2013.01); *H01L 27/10897* (2013.01)

(58) Field of Classification Search
CPC ......... H01L 27/10808; H01L 27/10897; H01L 27/1085; H01L 27/10873; H01L 27/10805; H01L 27/11521; H01L 27/11526; H01L 27/11551; H01L 27/11568; H01L 27/11573; H01L 27/11578; G11C 7/18
See application file for complete search history.

(56) References Cited

U.S. PATENT DOCUMENTS

| 9,876,013 | B1* | 1/2018 | Park | H01L 29/66545 |
|---|---|---|---|---|
| 2004/0000684 | A1* | 1/2004 | Park | H01L 28/91 |
| | | | | 257/E21.018 |
| 2008/0299760 | A1* | 12/2008 | Maekawa | H01L 27/10891 |
| | | | | 257/E21.256 |
| 2013/0267092 | A1* | 10/2013 | Shin | H01L 21/31144 |
| | | | | 438/666 |
| 2019/0006376 | A1 | 1/2019 | Ramaswamy | |
| 2019/0074277 | A1 | 3/2019 | Ramaswamy | |
| 2019/0103407 | A1 | 4/2019 | Kim et al. | |
| 2019/0164985 | A1 | 5/2019 | Lee et al. | |

(Continued)

FOREIGN PATENT DOCUMENTS

KR    1020190095138    8/2019

*Primary Examiner* — Duy T Nguyen
(74) *Attorney, Agent, or Firm* — Myers Bigel, P.A.

(57) ABSTRACT

Semiconductor memory devices and methods of forming the same are provided. The semiconductor devices may include a vertical insulating structure extending in a first direction on a substrate, a semiconductor pattern extending along a sidewall of the vertical insulating structure, a bitline on a first side of the semiconductor pattern, an information storage element on a second side of the semiconductor pattern and including first and second electrodes, and a gate electrode on the semiconductor pattern and extending in a second direction that is different from the first direction. The bitline may extend in the first direction and may be electrically connected to the semiconductor pattern. The first electrode may have a cylindrical shape that extends in the first direction, and the second electrode may extend along a sidewall of the first electrode.

20 Claims, 58 Drawing Sheets

(56) References Cited

U.S. PATENT DOCUMENTS

2019/0206869 A1    7/2019  Kim et al.
2019/0237467 A1*   8/2019  Kim .................. H01L 27/10885
2019/0295623 A1    9/2019  Derner et al.

* cited by examiner

SEMICONDUCTOR MEMORY DEVICES INCLUDING STACKED TRANSISTORS AND METHODS OF FABRICATING THE SAME

CROSS-REFERENCE TO RELATED APPLICATION

This application claims priority under 35 U.S.C. § 119 to Korean Patent Application No. 10-2020-0017517, filed on Feb. 13, 2020, in the Korean Intellectual Property Office, the disclosure of which is incorporated herein by reference in its entirety.

FIELD

The present disclosure generally relates to a semiconductor memory device and a method of fabricating the same, and more particularly, to a three-dimensional (3D) semiconductor memory device with improved electrical properties and a method of fabricating the 3D semiconductor memory device.

BACKGROUND

Increasing the integration density of semiconductor devices may be beneficial for high performance and low price thereof. Particularly, for semiconductor devices, the integration density is one of various factors affecting their price and thus it may be desirable to increase the integration density.

The integration density of a two-dimensional (2D) or planar semiconductor device may be affected by the area occupied by each unit memory cell and thus may be considerably affected by the level of fine pattern-forming technology. However, since expensive equipment may be used for the miniaturization of patterns, there still may exist a limit in increasing the integration density of a 2D semiconductor device. Accordingly, a three-dimensional (3D) semiconductor memory device or device including memory cells that are arranged three-dimensionally has been suggested.

SUMMARY

Embodiments of the present disclosure provide three-dimensional (3D) semiconductor memory devices with improved reliability and electrical properties.

Embodiments of the present disclosure also provide methods of fabricating a 3D semiconductor memory device with improved reliability and electrical properties.

According to some embodiments of the inventive concept, semiconductor memory devices are provided. The semiconductor memory devices may include a vertical insulating structure extending in a first direction on a substrate, a semiconductor pattern extending along a sidewall of the vertical insulating structure, a bitline on a first side of the semiconductor pattern, an information storage element on a second side of the semiconductor pattern and including first and second electrodes, and a gate electrode on the semiconductor pattern and extending in a second direction that is different from the first direction. The bitline may extend in the first direction and may be electrically connected to the semiconductor pattern. The first electrode may have a cylindrical shape that extends in the first direction, and the second electrode may extend along a sidewall of the first electrode.

According to some embodiments of the inventive concept, semiconductor memory devices are provided. The semiconductor memory devices may include a bitline on a substrate and a gate electrode including upper and lower gate electrodes and a plurality of connecting gate electrodes. The bitline may extend in a first direction that is perpendicular to a top surface of the substrate. Each of the upper and lower gate electrodes may extend in a second direction that is parallel to the top surface of the substrate, and the plurality of connecting gate electrodes may be arranged in the second direction. The upper gate electrode may be spaced apart from the lower gate electrode in the first direction, and each of the plurality of connecting gate electrodes may connect the upper and lower gate electrodes to each other. The semiconductor memory devices may also include a semiconductor pattern between the lower and upper gate electrodes and between a pair of adjacent connecting gate electrodes of the plurality of connecting gate electrodes, a vertical insulating structure between the pair of adjacent connecting gate electrodes, and an information storage element electrically connected to the semiconductor pattern. The semiconductor pattern may be electrically connected to the bitline. The vertical insulating structure may extend through the upper and lower gate electrodes and the semiconductor pattern and extending in the first direction.

According to some embodiments of the inventive concept, semiconductor memory devices are provided. The semiconductor memory devices may include a bitline on a substrate, a semiconductor pattern on the substrate, a gate electrode on the semiconductor pattern and extending in a second direction that is parallel to the top surface of the substrate, and an information storage element electrically connected to the semiconductor pattern. The bitline may extend in a first direction that is perpendicular to a top surface of the substrate. The semiconductor pattern may be electrically connected to the bitline and may have a first loop shape. The information storage element may include a first electrode electrically connected to the semiconductor pattern, a second electrode spaced apart from the first electrode, and a dielectric film between the first and second electrodes. The first electrode may have a second loop shape.

According to some embodiments of the inventive concept, semiconductor memory devices are provided. The semiconductor memory devices may include semiconductor memory devices may include a plurality of vertical insulating structures arranged on a substrate in a first direction that is parallel to a top surface of the substrate. Each of the plurality of vertical insulating structures may extend in a second direction that is perpendicular to the top surface of the substrate. The semiconductor memory devices may also include a gate electrode intersecting the plurality of vertical insulating structures and extending in the first direction, a plurality of semiconductor patterns on sidewalls of the plurality of vertical insulating structures, respectively, and arranged in the first direction, a plurality of bitlines arranged in the first direction and electrically connected to the plurality of semiconductor patterns, respectively, and a plurality of information storage elements electrically connected to the plurality of semiconductor patterns, respectively. The plurality of semiconductor patterns may be spaced apart from the gate electrode. Each of the plurality of bitlines may extend in the second direction. Each of the plurality of information storage elements may include a first electrode, a second electrode extending through the first electrode in the second direction, and a dielectric film between the first and second electrodes.

According to some embodiments of the inventive concept, methods of fabricating a semiconductor memory device are provided. The methods may include forming a mold structure including a plurality of mold layers that are vertically stacked. Each of the plurality of mold layers may include first and second insulating films. The methods may also include forming first, second, and third holes extending through the mold structure and being sequentially arranged in a first direction, forming a gate recess by etching a portion of the first insulating film exposed by the second hole, and forming a gate electrode in the gate recess. The gate electrode may define a channel recess in the gate recess and may extend in a second direction that may be different from the first direction. The methods may further include forming a semiconductor pattern in the channel recess, exposing a first side of the semiconductor pattern by removing a first portion of the gate electrode exposed by the first hole, forming a bitline electrically connected to the semiconductor pattern in the first hole, exposing a second side of the semiconductor pattern by removing a second portion of the gate electrode exposed by the third hole, and forming an information storage element electrically connected to the semiconductor pattern in the third hole.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

BRIEF DESCRIPTION OF THE DRAWINGS

The above and other embodiments and features of the present disclosure will become more apparent by describing in detail some embodiments thereof with reference to the attached drawings, in which.

DETAILED DESCRIPTION

Figure 1:
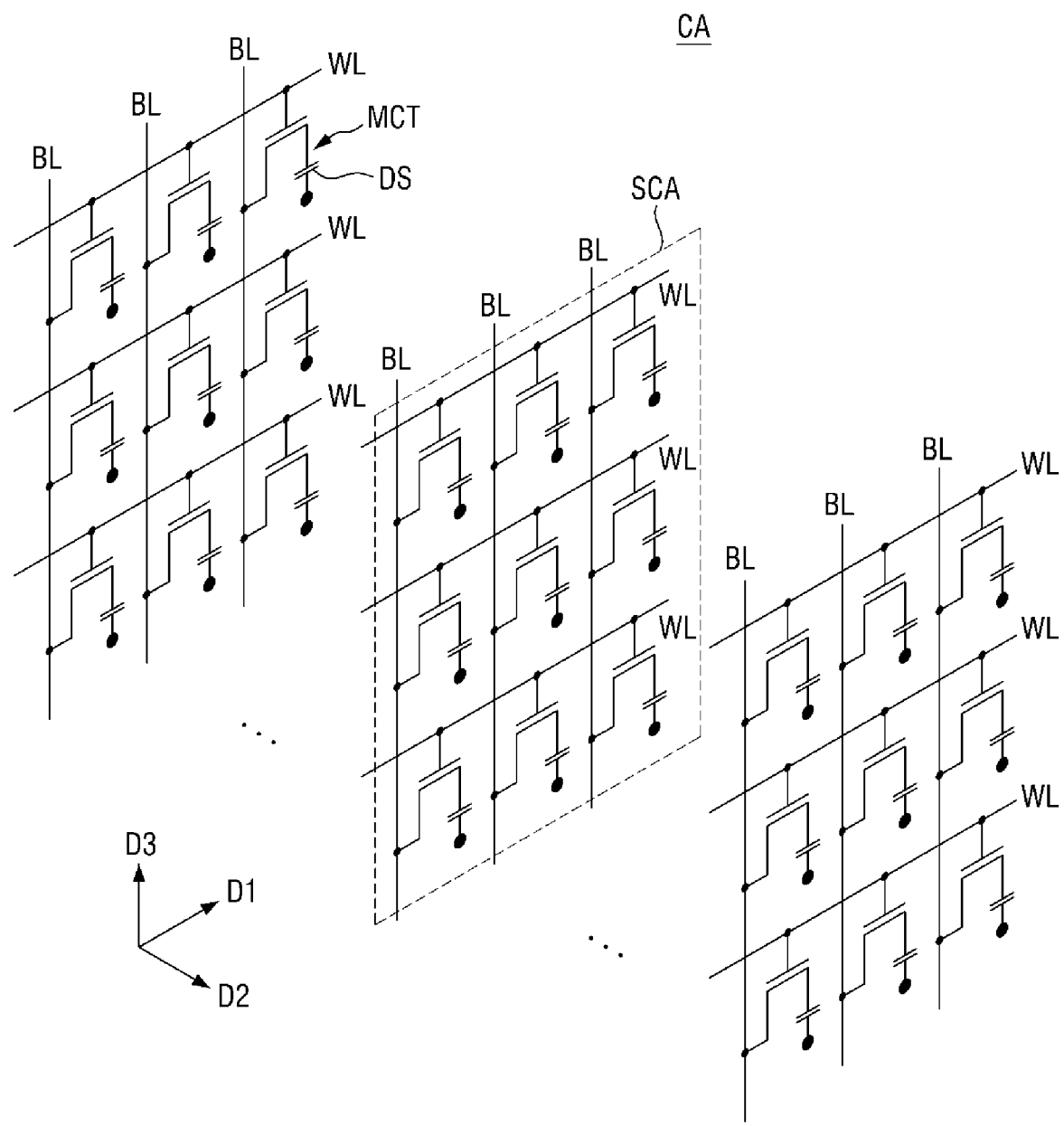
FIG. 1 is a circuit diagram of a cell array of a three-dimensional (3D) semiconductor memory device according to some embodiments of the present disclosure.

FIG. 1 is a circuit diagram of a cell array of a three-dimensional (3D) semiconductor memory device according to some embodiments of the present disclosure.

Referring to FIG. 1, a cell array CA of the 3D semiconductor memory device may include a plurality of sub-cell arrays SCA. For example, the sub-cell arrays SCA may be arranged along a second direction D2 and may be spaced apart from each other in the second direction D2.

Each of the sub-cell arrays SCA may include a plurality of bitlines BL, a plurality of wordlines WL, and a plurality of memory cell transistors MCT. A single memory cell transistor MCT may be disposed between one wordline WL and one bitline BL. In some embodiments, a single memory cell transistor MCT may be electrically connected to one wordline WL and one bitline BL.

The bitlines BL may be conductive patterns (e.g., metal lines) that extend in a vertical direction (i.e., a third direction D3) from a substrate. In each of the sub-cell arrays SCA, the bitlines BL may be arranged in a first direction D1. Each pair of adjacent bitlines BL may be spaced apart in the first direction D1. As used herein, "an element A extends in a direction X" (or similar language) may mean that the element A extends longitudinally in the direction X. As used herein, "elements B are arranged in a direction Y" (or similar language) may mean that the elements B are spaced apart from each other in the direction Y and are aligned in the direction Y.

The wordlines WL may be conductive patterns (e.g., metal lines) that are stacked on the substrate in the third direction D3. The wordlines WL may extend in the first direction D1. Each pair of adjacent wordlines WL may be spaced apart in the third direction D3.

Gates of the memory cell transistors MCT may be connected to the wordlines WL, and first source/drains of the memory cell transistors MCT may be connected to the bitlines BL. Second source/drains of the memory cell transistors MCT may be connected to information storage elements DS. For example, the information storage elements DS may be capacitors. The second source/drains of the memory cell transistors MCT may be connected to first electrodes of the capacitors.

Figure 2:
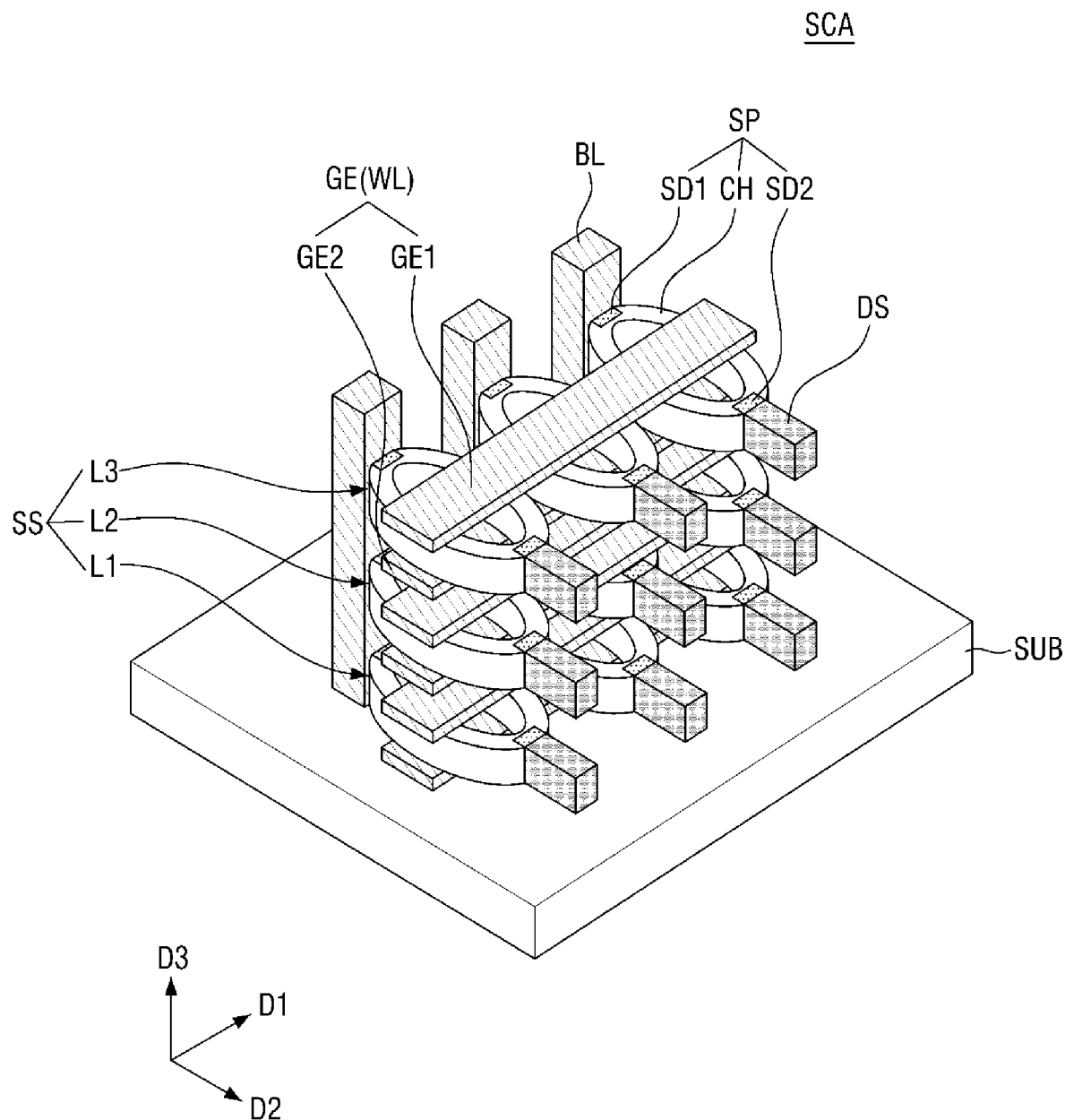
FIGS. 2, 3A and 3B are perspective views of 3D semiconductor memory devices according to some embodiments of the present disclosure.
Figure 3A:
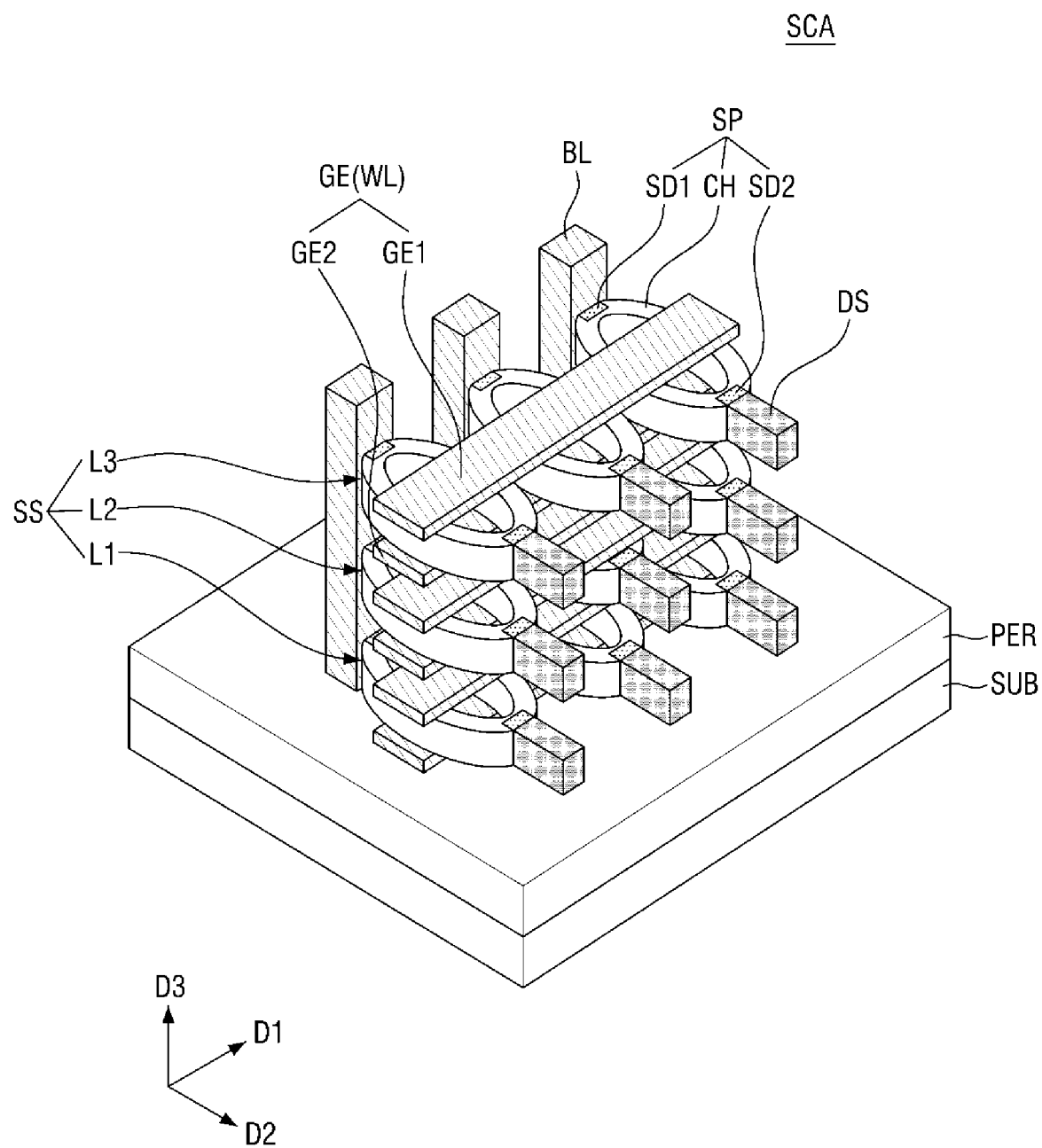
Figure 3B:
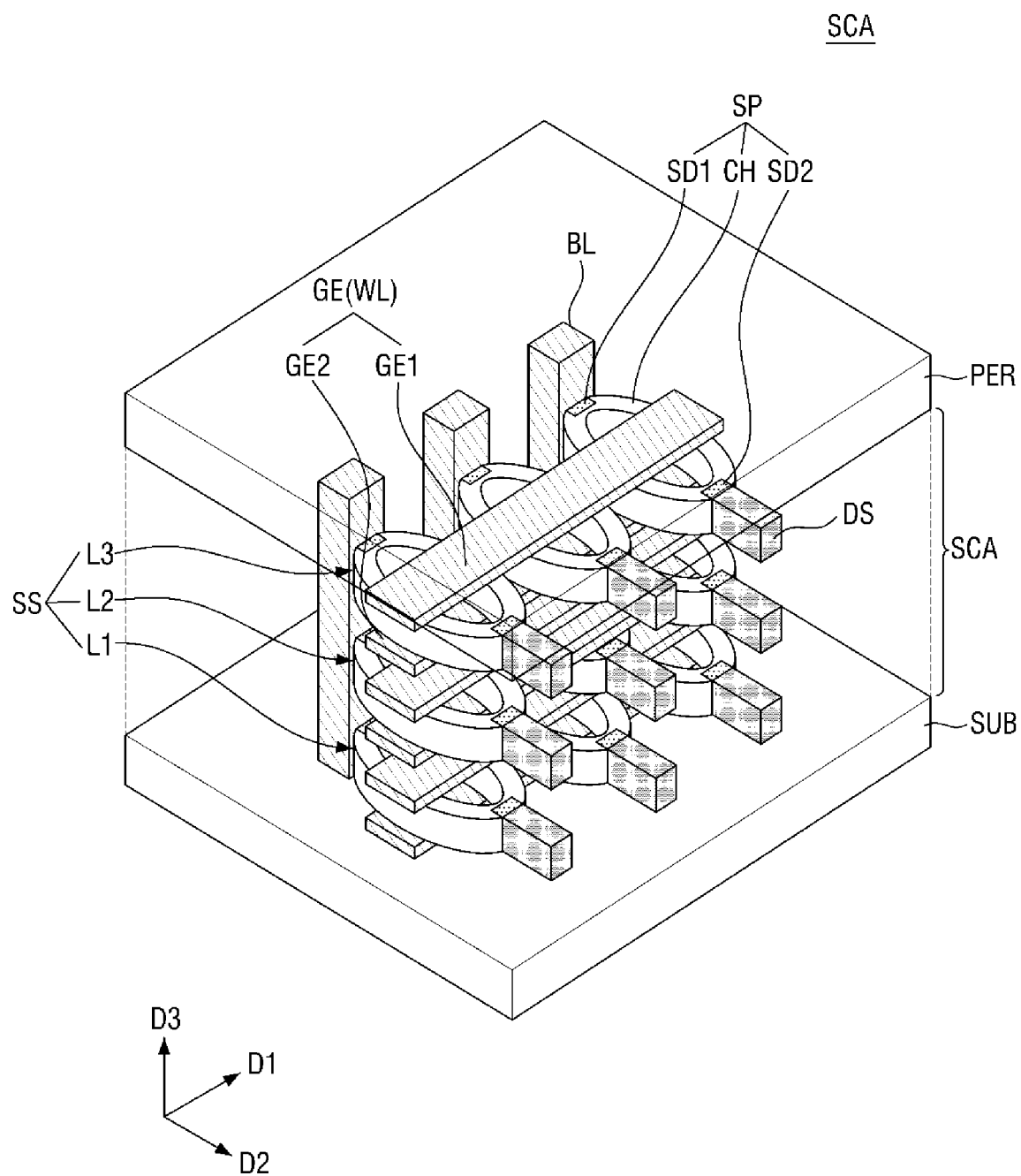

FIGS. 2, 3A and 3B are perspective views of 3D semiconductor memory devices according to some embodiments of the present disclosure.

Referring to FIGS. 1 and 2, a sub-cell array SCA, which corresponds to the sub-cell arrays SCA of FIG. 1, may be disposed on a substrate SUB.

The substrate SUB may be a bulk silicon substrate or a silicon-on-insulator (SOI) substrate. In some embodiments, the substrate SUB may be a silicon substrate or may include various materials such as, for example, indium antimony, lead tellurium compounds, indium arsenide, indium phosphide, gallium arsenide, and/or gallium antimony, or may be a silicon germanium-on-insulator (SGOI) substrate but the present disclosure is not limited thereto. The substrate SUB will hereinafter be described as being, for example, a silicon substrate. As used herein the term "and/or" includes any and all combinations of one or more of the associated listed items.

A stack structure SS, which includes first, second, and third layers L1, L2, and L3, may be disposed on the substrate SUB. The first, second, and third layers L1, L2, and L3 of the stack structure SS may be stacked in a direction perpendicular to the top surface of the substrate SUB, i.e., in the third direction D3, to be spaced apart from one another in the direction. Each of the first, second, and third layers L1, L2, and L3 may include a plurality of semiconductor patterns SP, a plurality of information storage elements DS, and gate electrodes GE.

In a plan view, the semiconductor patterns SP may have a closed loop shape. For example, the semiconductor patterns SP may have a ring shape. In some embodiments, the semiconductor patterns SP may have a rectangular loop shape with the outer circumferential surfaces thereof chamfered. The semiconductor patterns SP may include a semiconductor material such as silicon, germanium, silicon-germanium, or a metal oxide. For example, the semiconductor patterns SP may include polysilicon. In some embodiments, the semiconductor patterns SP may include an amorphous metal oxide, a polycrystalline metal oxide, or a combination thereof. In a case where the semiconductor patterns SP include a metal oxide, the semiconductor patterns SP may include indium gallium oxide (IGO), indium zinc oxide (IZO), and/or indium gallium zinc oxide (IGZO).

Each of the semiconductor patterns SP may include a channel region CH, a first impurity region SD1, and a second impurity region SD2. The channel region CH may be interposed between the first and second impurity regions SD1 and SD2. The channel region CH may correspond to the channels of the memory cell transistors MCT of FIG. 1. The first and second impurity regions SD1 and SD2 may correspond to the first source/drains and the second source/drains, respectively, of the memory cell transistors MCT of FIG. 1.

First impurity regions SD1 and second impurity regions SD2 may be regions of the semiconductor patterns SP that are doped with impurities. Thus, the first impurity regions SD1 and second impurity regions SD2 may have a conductivity type such as an n type or a p type. The first impurity regions SD1 may be formed adjacent to the bitlines BL. The second impurity regions SD2 may be formed adjacent to the information storage elements DS. The second impurity regions SD2 may be connected to the information storage elements DS. As used herein, "an element A is connected to an element B" (or similar language) may mean that the element A is electrically and/or physically connected to the element B.

The information storage elements DS may be memory elements capable of storing data. The information storage elements DS may be memory elements using capacitors, memory elements using magnetic tunnel junction patterns, or memory elements using variable resistors that include a phase-change material. For example, the information storage elements DS may be capacitors.

The gate electrodes GE may have a linear or bar shape that extends in the first direction D1. The gate electrodes GE may be stacked along the third direction D3 to be spaced apart from one another. The gate electrodes GE may extend in the first direction D1 across the semiconductor patterns SP. The gate electrodes GE thus may correspond to the wordlines WL of FIG. 1.

The gate electrodes GE may include upper gate electrodes GE1, which are disposed on the top surfaces of the semiconductor patterns SP, and lower gate electrodes GE2, which are disposed on the bottom surfaces of the semiconductor patterns SP. The memory cell transistors MCT of FIG. 1 may be double-gate transistors where two gate electrodes GE are provided on both sides of the channel region CH.

The gate electrodes GE may include a conductive material. For example, the conductive material may be one of a doped semiconductor material (e.g., doped silicon or doped germanium), a conductive metal nitride (e.g., titanium nitride or tantalum nitride), a metal (e.g., tungsten, titanium, or tantalum), and a metal-semiconductor compound (e.g., tungsten silicide, cobalt silicide, or titanium silicide).

A plurality of bitlines BL may extend in the direction perpendicular to the substrate SUB, i.e., in the third direction D3. The bitlines BL may have a linear or cylindrical shape (e.g., pillar shape) that extends in the third direction D3. The bitlines BL may be arranged along the first direction D1. The bitlines BL may be electrically connected to the first impurity regions SD1. As used herein, "an element C having a cylindrical shape" may refer to an element extending longitudinally in a vertical direction (e.g., the third direction D3) and including a bottom portion and a vertical portion protruding from the bottom portion in the vertical direction. A side of the vertical portion of the element C may or may not be perpendicular to a surface of the bottom portion. The side of the vertical portion of the element C may be straight or curved. The element C may include only a vertical portion extending longitudinally in a vertical direction without a bottom portion.

The bitlines BL may include a conductive material. For example, the bitlines BL may include one of a doped semiconductor material, a conductive metal nitride, a metal, and a metal-semiconductor compound. The bitlines BL may correspond to the bitlines BL of FIG. 1.

The first, second, and third layers L1, L2, and L3, particularly, the first layer L1, will hereinafter be described. The semiconductor patterns SP of the first layer L1 may be arranged in the first direction D1. The semiconductor patterns SP of the first layer L1 may all be disposed on the same level. The semiconductor patterns SP may be spaced apart from one another. The gate electrodes GE may extend in the first direction D1 across the semiconductor patterns SP. For example, the gate electrodes GE may be disposed on the top surfaces and the bottom surfaces of the semiconductor patterns SP. The upper and lower gate electrodes GE1 and GE2, which have the semiconductor patterns SP disposed therebetween, may be connected to each other.

Although not specifically illustrated, gate insulating films may be interposed between the gate electrodes GE and the channel regions CH of the semiconductor patterns SP. The gate insulating film may include at least one of a high-k insulating film, a silicon oxide film, a silicon nitride film, and a silicon oxynitride film. For example, the high-k insulating film may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The bitlines BL may be connected to the first impurity regions SD1. Although not specifically illustrated, metal silicide films may be formed between the bitlines BL and the semiconductor patterns SP. The second and third layers L2 and L3 may be substantially the same as the first layer L1.

Although not specifically illustrated, an insulating material may be formed in (e.g., may fill) spaces between elements of the stack structure SS. For example, the insulating material may include at least one of a silicon oxide film, a silicon nitride film, and a silicon oxynitride film. A wiring layer, which is electrically connected to the sub-cell array SCA, may be disposed on the stack structure SS. Although not specifically illustrated, peripheral circuits for operating the sub-cell array SCA may be formed on the substrate SUB. The peripheral circuits and the sub-cell array SCA may be connected via the wiring layer. "An element A filling an element B" (or similar language) as used herein may mean that the element A is in the element B but does not necessarily mean that the element A fills the element B entirely.

FIGS. 3A and 3B will hereinafter be described, focusing mainly on the differences from FIG. 2.

Referring to FIGS. 3A and 3B, a peripheral circuit region PER and a sub-cell array SCA may be stacked in a vertical direction (i.e., a third direction D3).

Referring to FIG. 3A, a peripheral circuit region PER may be disposed between a substrate SUB and a sub-cell array SCA. The peripheral circuit region PER may include peripheral circuit transistors, which are formed on the substrate SUB. The peripheral circuit region PER may include circuits for operating the sub-cell array SCA according to some embodiments of the present disclosure.

The sub-cell array SCA may be electrically connected to the peripheral circuit region PER via, for example, through electrodes.

Referring to FIG. 3B, a sub-cell array SCA may be disposed on the substrate SUB. A peripheral circuit region PER may be disposed on the sub-cell array SCA. As already mentioned above, the peripheral circuit region PER may include circuits for operating the sub-cell array SCA.

For example, the first, second, and third directions D1, D2, and D3 may be perpendicular to one another, but the present disclosure is not limited thereto. Also, for example, the first and second directions D1 and D2 may be parallel to the top surface of the substrate SUB, and the third direction D3 may be perpendicular to the top surface of the substrate SUB.

Figure 4:
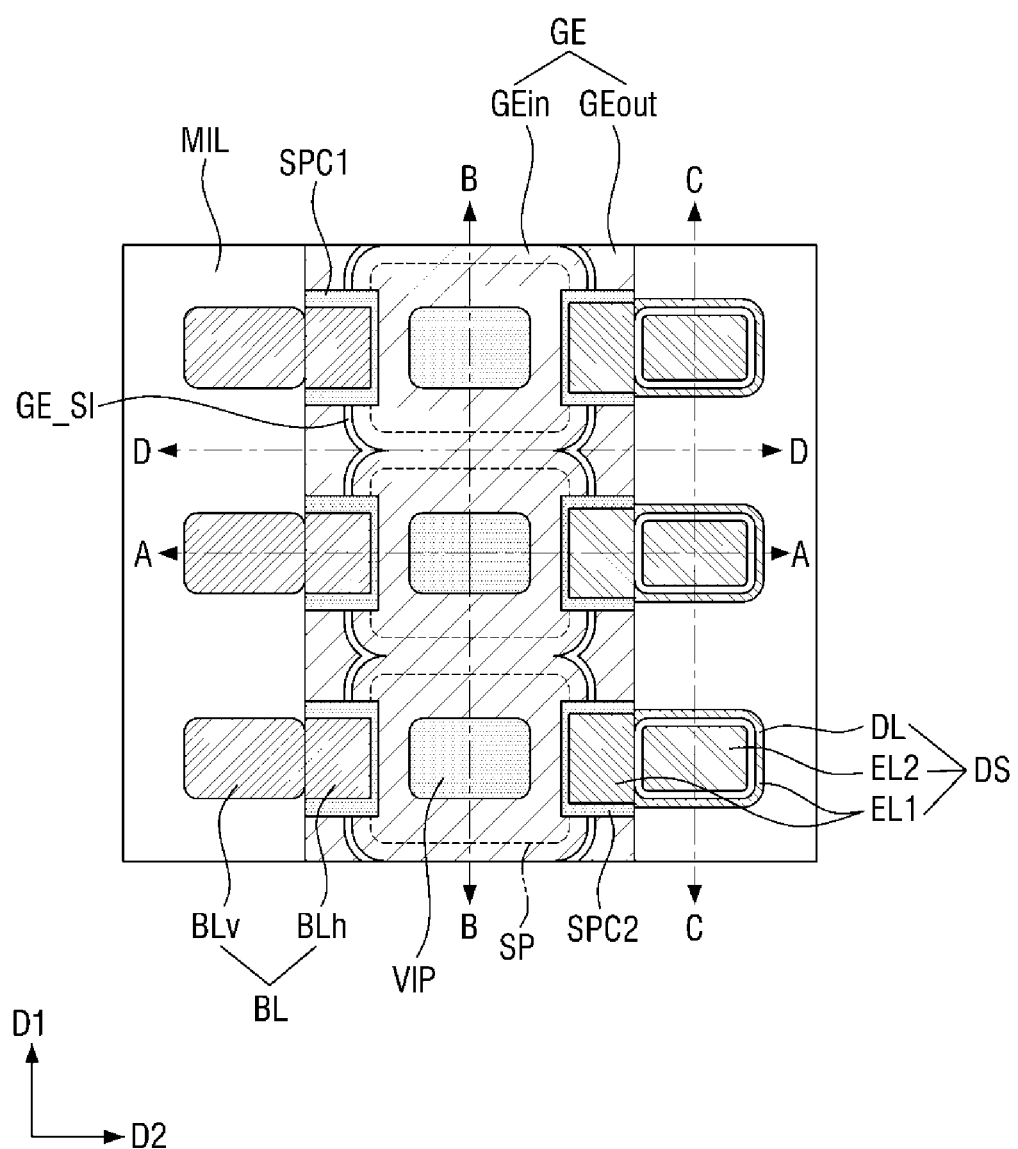
FIG. 4 is a plan view of a semiconductor memory device according to some embodiments of the present disclosure.

FIG. 4 is a plan view of a semiconductor memory device according to some embodiments of the present disclosure. FIGS. 5A through 5D are cross-sectional views taken along lines A-A, B-B, C-C, and D-D, respectively, of FIG. 4. FIGS. 4 and 5A through 5D will hereinafter be described, focusing mainly on the differences from FIG. 2.

Figure 5A:
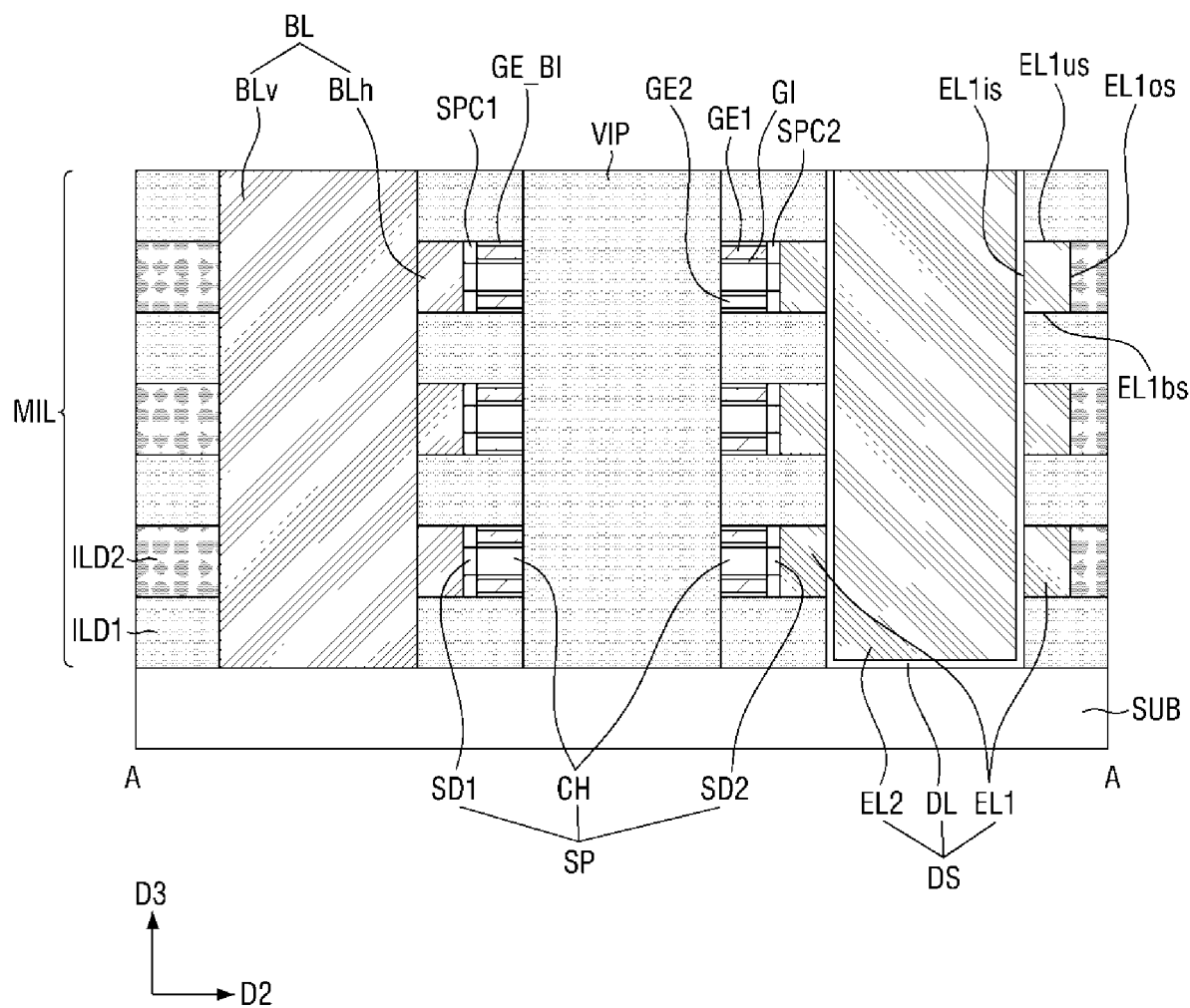
FIGS. 5A through 5D are cross-sectional views taken along lines A-A, B-B, C-C, and D-D, respectively, of FIG. 4.
Figure 5B:
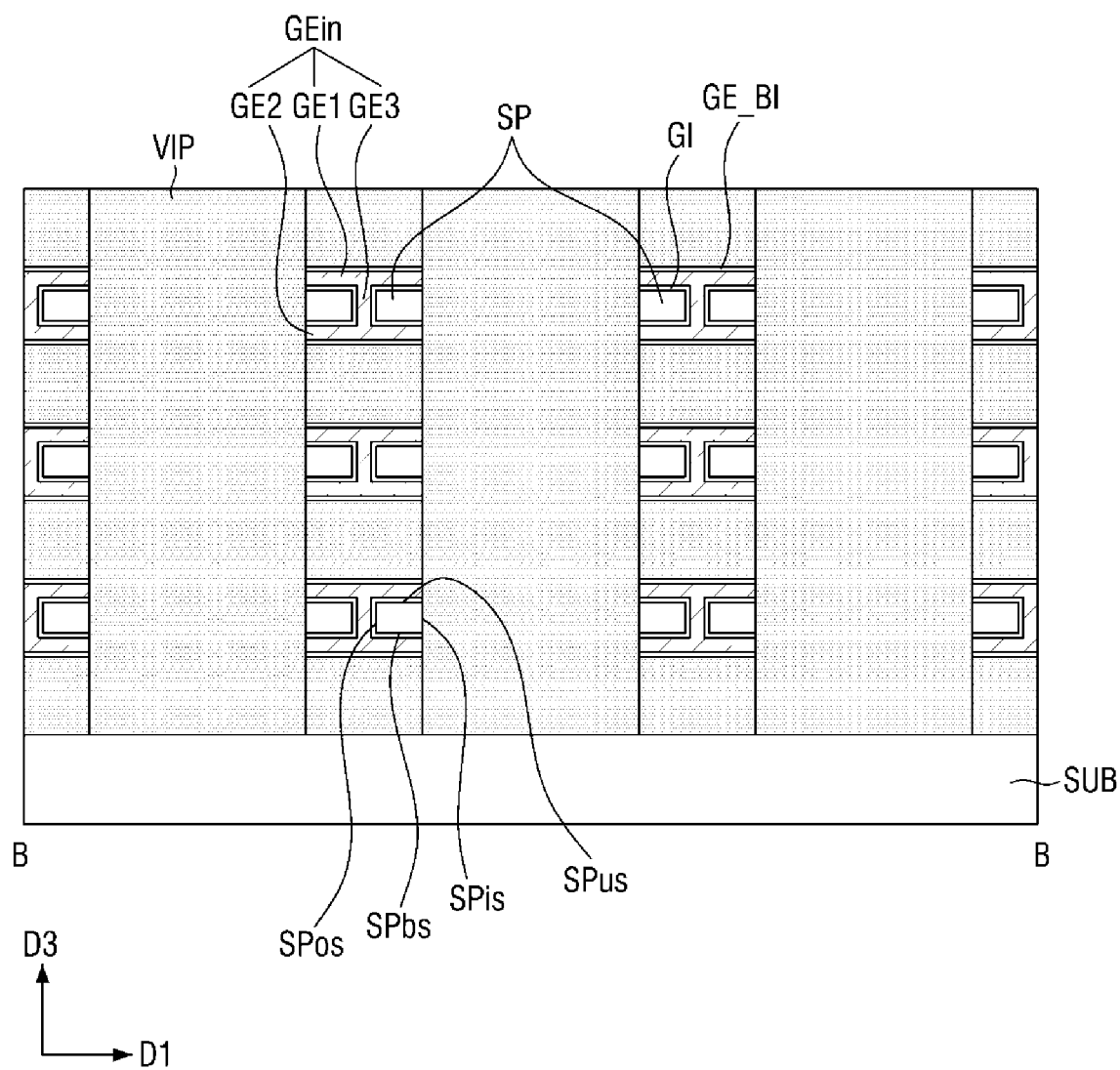
Figure 5C:
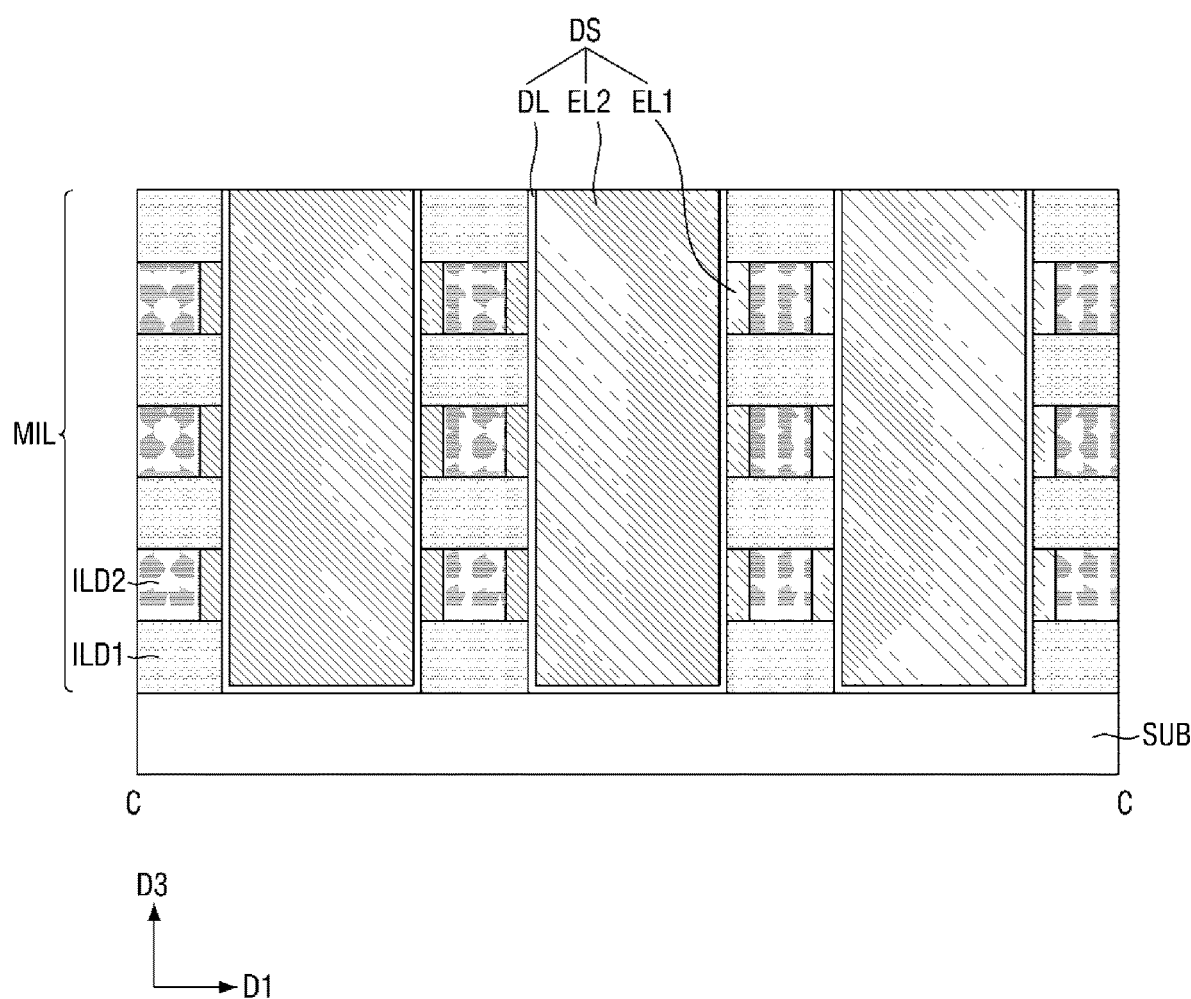
Figure 5D:
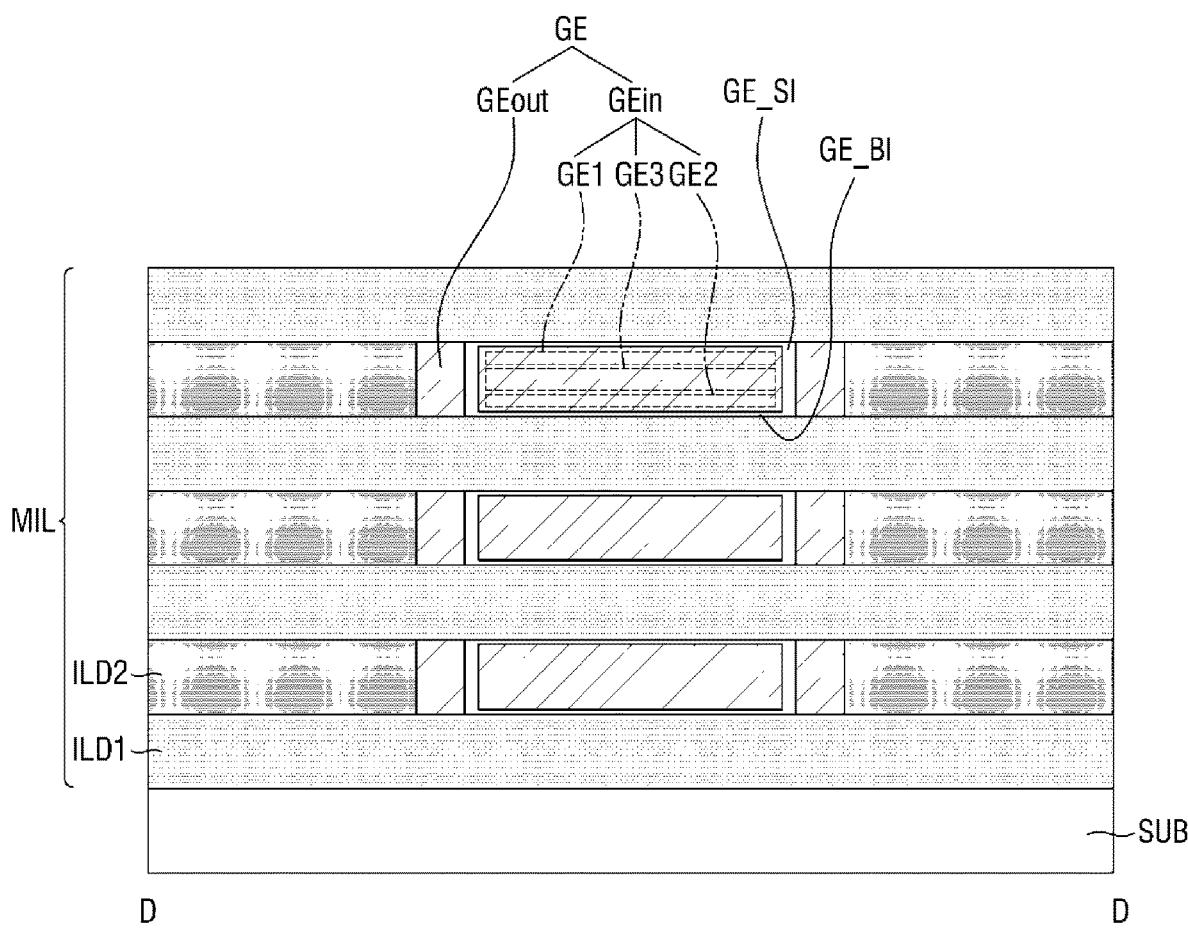

Referring to FIGS. 4 through 5D, the semiconductor memory device may include bitlines BL, gate electrodes GE, semiconductor patterns SP, information storage elements DS, and vertical insulating structures VIP.

A mold structure MIL may be disposed on a substrate SUB. The mold structure MIL may include first mold insulating layers ILD1 and second mold insulating layers ILD2. In some embodiments, the first mold insulating layers ILD1 and the second mold insulating layers ILD2 may be alternately stacked on the substrate SUB.

FIGS. 5A, 5C, and 5D illustrate four first mold insulating layers ILD1 and three second mold insulating layers ILD2, but the present disclosure is not limited thereto. FIGS. 5A through 5D illustrate a layer of the mold structure MIL adjacent to the substrate SUB as one of the first mold insulating layers ILD1, but the present disclosure is not limited thereto.

The first mold insulating layers ILD1 may include a first insulating material, and the second mold insulating layers ILD2 may include a second insulating material. The first insulating material may have etching selectivity with respect to the second insulating material. The first mold insulating layers ILD1 and the second mold insulating layers ILD2 may each include at least one of, for example, a silicon oxide film, a silicon nitride film, a silicon oxynitride film, a carbon-based silicon oxide film, a carbon-based silicon nitride film, and a carbon-based silicon oxynitride film. For example, the first mold insulating layers ILD1 may include silicon oxide films, and the second mold insulating layers ILD2 may include silicon nitride films. For example, the mold structure MIL may be an oxide-nitride (ON) mold structure.

A plurality of semiconductor patterns SP may be disposed on the substrate SUB. The semiconductor patterns SP may be disposed to be spaced apart from one another in a first direction D1. The semiconductor patterns SP may be stacked along a third direction D3. The semiconductor patterns SP that are stacked in the third direction D3 may be spaced apart from one another in the third direction D3. The semiconductor patterns SP that are stacked in the third direction D3 may be disposed between pairs of adjacent first mold insulating layers ILD1 in the third direction D3 or between pairs of adjacent second mold insulating layers ILD2 in the third direction D3. The first mold insulating layers ILD1 may be disposed between pairs of adjacent semiconductor patterns SP in the third direction D3.

The semiconductor patterns SP may have a loop shape, for example, a closed-loop shape.

Each of the semiconductor patterns SP may have top and bottom surfaces SPus and SPbs, which are opposite to each other in the third direction D3. Each of the semiconductor patterns SP may have an outer sidewall SPos and an inner sidewall SPis, which connect the top and bottom surfaces SPus and SPbs. Each of the semiconductor patterns SP may include first and second impurity regions SD1 and SD2. The first and second impurity regions SD1 and SD2 may be formed to be opposite to each other in a second direction D2.

The semiconductor patterns SP may include a semiconductor material such as silicon, germanium, silicon-germanium, or a metal oxide.

The gate electrodes GE include upper gate electrodes GE1, which are disposed on the top surfaces SPus of the semiconductor patterns SP, and lower gate electrodes GE2, which are disposed on the bottom surfaces SPbs of the semiconductor patterns SP. The gate electrodes GE may further include connecting gate electrodes GE3, which connect the upper gate electrodes GE1 and the lower gate electrodes GE2. The gate electrodes GE, like the semiconductor patterns SP, may be disposed between the pairs of adjacent first mold insulating layers ILD1 in the third direction D3. The gate electrodes GE may form the wordlines WL of FIG. 1.

The upper gate electrodes GE1 may be spaced apart in the third direction D3 from the lower gate electrodes GE2 by the semiconductor patterns SP interposed therebetween. The semiconductor patterns SP may be sandwiched between the upper gate electrodes GE1 and the lower gate electrodes GE2. The upper gate electrodes GE1 and the lower gate electrodes GE2 may extend in parallel in the first direction D1.

The semiconductor patterns SP may be disposed between pairs of adjacent connecting gate electrodes GE3 in the first direction D1. The connecting gate electrodes GE3 may separate pairs of adjacent semiconductor patterns SP in the first direction D1. That is, the pairs of adjacent semiconductor patterns SP in the first direction D1 may be separated by the gate electrodes GE. The connecting gate electrodes GE3 may be disposed between the outer sidewalls SPos of the pairs of adjacent semiconductor patterns SP in the first direction D1. The gate electrodes GE may not be disposed on the inner sidewalls SPis of the semiconductor patterns SP.

The gate electrodes GE may include inner gate electrodes GEin, which extend in the first direction D1, and outer gate electrodes GEout, which extend along parts of the inner gate electrodes GEin. The outer gate electrodes GEout may be electrically insulated from the inner gate electrodes GEin. Insertion insulating films GE_SI may be disposed between the inner gate electrodes GEin and the outer gate electrodes GEout. The outer gate electrodes GEout may be electrically isolated from the inner gate electrodes GEin by the insertion insulating films GE_SI.

The inner gate electrodes GEin may include the upper gate electrodes GE1, the lower gate electrodes GE2, and the connecting gate electrodes GE3. For example, the outer gate electrodes GEout may be disposed on sidewalls of the connecting gate electrodes GE3. The insertion insulating films GE_SI may be disposed between the connecting gate electrodes GE3 and the outer gate electrodes GEout. The insertion insulating films GE_SI may be disposed on both sides of each of the connecting gate electrodes GE3. The insertion insulating films GE_SI and the connecting electrodes GE3 may be disposed between pairs of adjacent outer gate electrodes GEout in the second direction D2. The connecting gate electrodes GE3, the insertion insulating films GE_SI, and the outer gate electrodes GEout may be sequentially arranged in rows in the second direction D2. The term "part" as used herein may be interchangeable with "portion."

Blocking insulating films GE_BI may be disposed between the upper gate electrodes GE1 and the first mold insulating layers ILD1 and between the lower gate electrodes GE2 and the first mold insulating layers ILD1. The blocking insulating films GE_BI may include the same material as the insertion insulating films GE_SI. The blocking insulating films GE_BI and the insertion insulating films GE_SI may each include at least one of, for example, a silicon oxide film, a silicon nitride film, a silicon oxynitride film, a carbon-based silicon oxide film, a carbon-based silicon nitride film, and a carbon-based silicon oxynitride film.

The inner gate electrodes GEin may be normal gate electrodes. The outer gate electrodes GEout may be dummy gate electrodes that do not function as wordlines. The inner gate electrodes GEin of the gate electrodes GE may function as wordlines. The gate electrodes GE may include at least one of a doped semiconductor material, a conductive metal nitride, a metal, and a metal-semiconductor compound.

Gate insulating films GI may be disposed between the gate electrodes GE and the semiconductor patterns SP. The gate insulating films GI may extend along the top surfaces SPus, the bottom surfaces SPbs, and the outer sidewalls SPos of the semiconductor patterns SP. The gate insulating films GI may not be disposed on the inner sidewalls SPis of the semiconductor patterns SP. Each of the gate insulating film GI may include a single film selected from among a high-k insulating film, a silicon oxide film, a silicon nitride film, a silicon oxynitride film, and a combination thereof.

A plurality of vertical insulating structures VIP may be arranged along the first direction D1. The vertical insulating structures VIP may extend in the third direction D3. The vertical insulating structures VIP may have a cylindrical shape (e.g., pillar shape).

The vertical insulating structures VIP may penetrate the semiconductor patterns SP that are stacked in the third direction D3. In other words, the semiconductor patterns SP that are stacked in the third direction D3 may be disposed along the circumferences of the vertical insulating structures VIP. The inner sidewalls SPis of the semiconductor patterns SP may face the vertical insulating structures VIP. For example, the vertical insulating structures VIP may be in contact with the inner sidewalls SPis of the semiconductor patterns SP.

The vertical insulating structures VIP may penetrate the gate electrodes GE. The vertical insulating structures VIP, which are arranged along the first direction D1, may penetrate one gate electrode GE. The vertical insulating structures VIP may intersect the gate electrodes GE. The vertical insulating structures VIP may penetrate the lower gate electrodes GE2 and the upper gate electrodes GE1. The vertical insulating structures VIP do not penetrate the connecting gate electrodes GE3. The vertical insulating structures VIP may be disposed between the pairs of adjacent connecting gate electrodes GE3 in the first direction D1.

Each of the vertical insulating structures VIP may include at least one of, for example, a silicon oxide film, a silicon nitride film, a silicon oxynitride film, a carbon-based silicon oxide film, a carbon-based silicon nitride film, and a carbon-based silicon oxynitride film.

A plurality of bitlines BL may be arranged along the first direction D1. The bitlines BL may extend in a direction perpendicular to the top surface of the substrate SUB, i.e., in the third direction D3. The bitlines BL may be separated from one another by the mold structure MIL.

The bitlines BL may be disposed on first sides of the semiconductor patterns SP. The bitlines BL may be electrically connected to the semiconductor patterns SP that are stacked in the third direction D3. In some embodiments, a single bitline BL may be electrically connected to the semiconductor patterns SP that are stacked in the third direction D3 as illustrated in FIG. 5A. Each of the bitlines BL may include horizontal parts BLh, which are stacked on the substrate SUB, and a vertical part BLv, which extends in the third direction D3. The vertical part BLv may connect the horizontal parts BLh, which are spaced apart from one another in the third direction D3. The horizontal parts BLh may protrude from the vertical part BLv. The horizontal parts BLh may be electrically connected to the semiconductor patterns SP that are stacked in the third direction D3. The horizontal parts BLh may be connected to the first impurity regions SD1. Although not specifically illustrated, silicide patterns may be interposed between the first impurity regions SD1 and the bitlines BL.

First spacers SPC1 may be interposed between the horizontal parts BLh and the gate electrodes GE. The first spacers SPC1 may insulate the bitlines BL from the gate electrodes GE. The first spacers SPC1 may also be disposed between pairs of adjacent bitlines BL in the first direction D1. Accordingly, the first spacers SPC1 may electrically insulate the pairs of adjacent bitlines BL in the first direction D1 from the outer gate electrodes GEout.

Each of the information storage elements DS may include a first electrode EL1, a dielectric film DL, and a second electrode EL2. The first electrode EL1 may be spaced apart from the second electrode EL2. The dielectric film DL may be interposed between the first electrode EL1 and the second electrode EL2. The information storage elements DS may be connected to the semiconductor patterns SP. The first electrodes EL1 may be connected to the semiconductor patterns SP. The information storage elements DS may be disposed on second sides of the semiconductor patterns SP.

Information storage elements DS that are electrically connected to the semiconductor patterns SP that are stacked in the third direction D3 may share a single dielectric film DL and a single second electrode EL2. In some embodiments, a plurality of first electrodes EL1 may be disposed to be connected to the semiconductor patterns SP that are stacked in the third direction D3, a single dielectric film DL may be formed along the surfaces of the plurality of first electrodes EL1, and a single second electrode EL2 may be disposed on the dielectric film DL as illustrated in FIG. 5A.

First electrodes EL1 may be electrically connected to the second impurity regions SD2. The first electrodes EL1 may be disposed between the pairs of adjacent first mold insulating layers ILD1 in the third direction D3. In a plan view, the first electrodes EL1 may have a loop shape, for example, a closed-loop shape.

Each of the first electrodes EL1 may include top and bottom surfaces EL1*us* and EL1*bs*, which are opposite to each other in the third direction D3, and outer and inner sidewalls EL1*os* and EL1*is*, each of which connects the top and bottom surfaces EL1*us* and EL1*bs*. Each of the inner sidewalls EL1*is* of the first electrodes EL1 may face the dielectric film DL, and each of the outer sidewalls of EL1*os* of the first electrodes EL1 may be opposite to a respective one of the inner sidewalls EL1*is* of the first electrodes EL1. The first electrodes EL1 may be connected to the second impurity regions SD2 via the outer sidewalls EL1*os* of the first electrodes EL1.

Dielectric films DL may be formed along the inner sidewalls EL1*os* of the first electrodes EL1, but not on the top and bottom surfaces EL1*us* and EL1*bs* of the first electrodes EL1.

Second electrodes EL2 may be disposed on the dielectric films DL. Each of the second electrodes EL2 may penetrate first electrodes EL1 that are stacked in the third direction D3. The second electrodes EL2 may have, for example, a cylindrical shape (e.g., a pillar shape) that extends in the third direction D3. In other words, first electrodes EL1 may be disposed along the circumference of each of the second electrodes EL2.

The first electrodes EL1 and the second electrodes EL2 may include, for example, a doped semiconductor material, a conductive metal nitride (e.g., titanium nitride, tantalum nitride, niobium nitride, or tungsten nitride), a metal (e.g., ruthenium, iridium, titanium, or tantalum), or a conductive metal oxide (e.g., iridium oxide or niobium oxide), but the present disclosure is not limited thereto.

The dielectric films DL may include, for example, a high-k material (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof). The dielectric film DL may include a stacked layer structure in which zirconium oxide, aluminum oxide, and zirconium oxide are sequentially stacked. The dielectric film DL may include hafnium (Hf).

Second spacers SPC2 may be interposed between the first electrodes EL1 and the gate electrodes GE. The second spacers SPC2 may insulate the first electrodes EL1 from the gate electrodes GE. The second spacers SPC2 may also be disposed between pairs of adjacent first electrodes EL1 in the first direction D1. Accordingly, the pairs of adjacent first electrodes EL1 in the first direction D1 may be electrically insulated from the outer gate electrodes GEout.

The bitlines BL may be disposed on the first sides of the semiconductor patterns SP, and the information storage elements DS may be disposed on the second sides of the semiconductor patterns SP. The bitlines BL, the semiconductor patterns SP, and the information storage elements DS may be arranged in rows in the second direction D2.

Silicide patterns may be interposed between the first electrodes EL1 and the semiconductor patterns SP. The dielectric films DL and the second electrodes EL2, which are spaced apart from each other in the first direction D1, are illustrated as not being connected directly to each other, but the present disclosure is not limited thereto. In some embodiments, dielectric films DL that are spaced apart from one another in the first direction D1 may be connected directly to one another by parts of dielectric films DL that extend along the top surface of the mold structure MIL. Also, in some embodiments, second electrodes EL2 that are spaced apart from one another in the first direction D1 may be connected directly to one another by parts of second electrodes EL2 that extend along the top surface of the mold structure MTh.

Figure 6A:
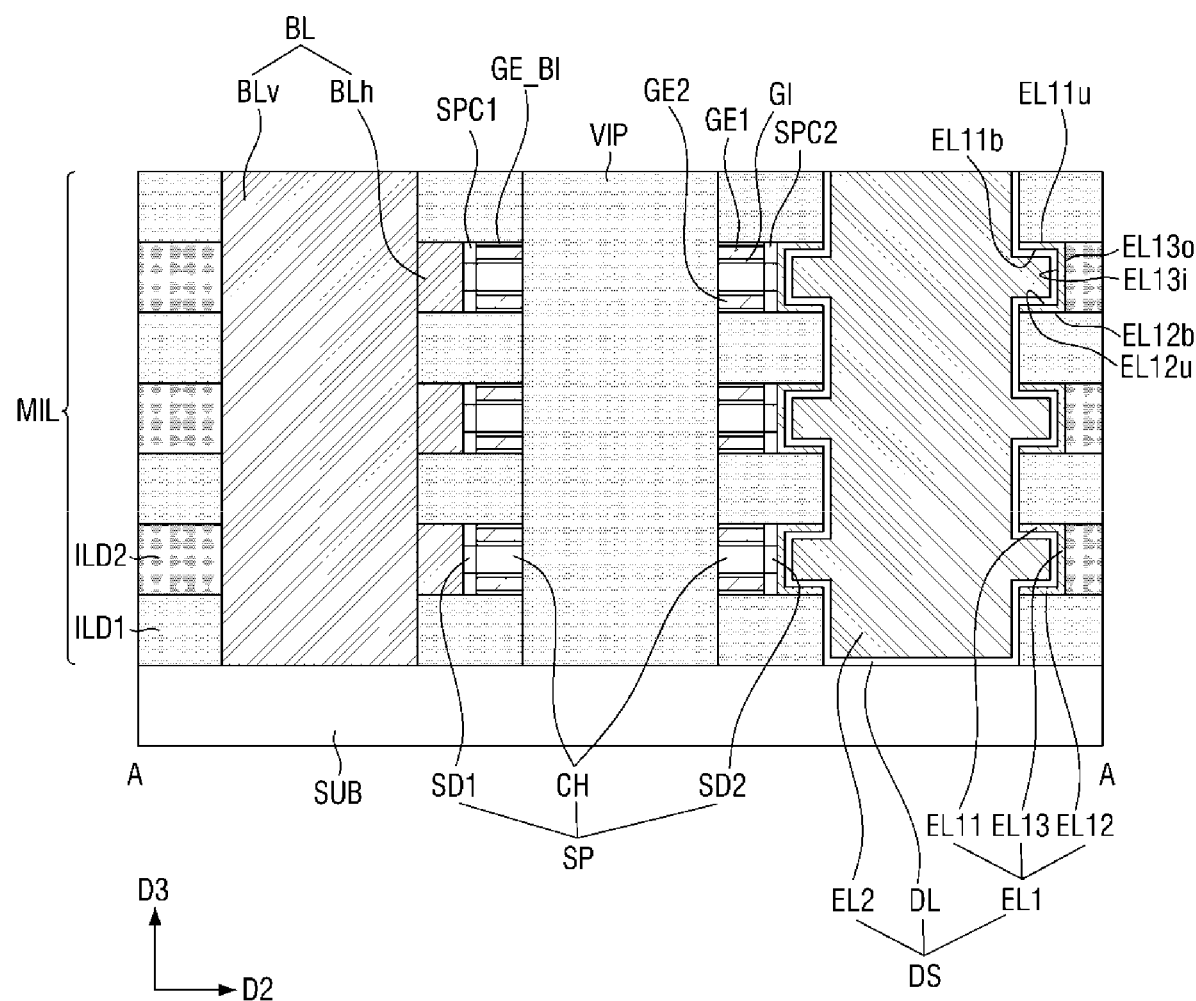
FIGS. 6A and 6B are cross-sectional views of a semiconductor memory device according to some embodiments of the present disclosure.
Figure 6B:
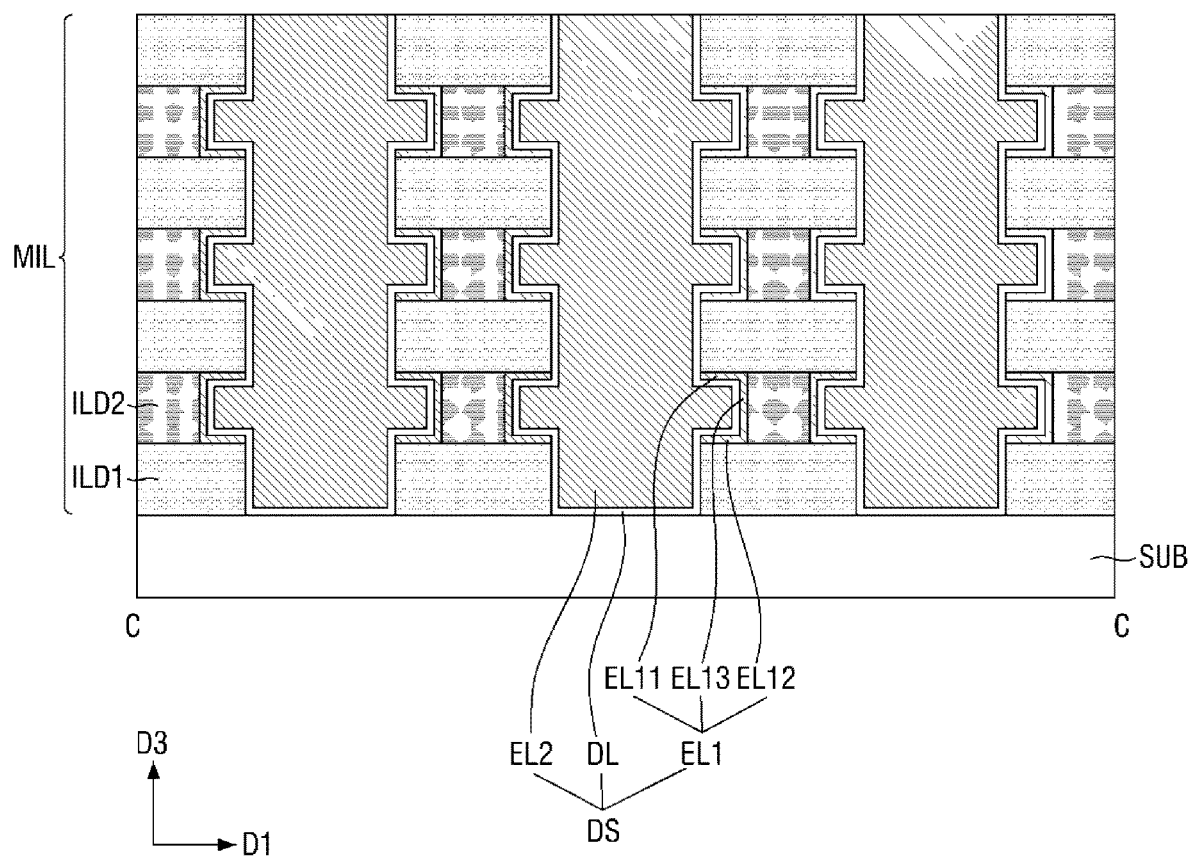
Figure 7:
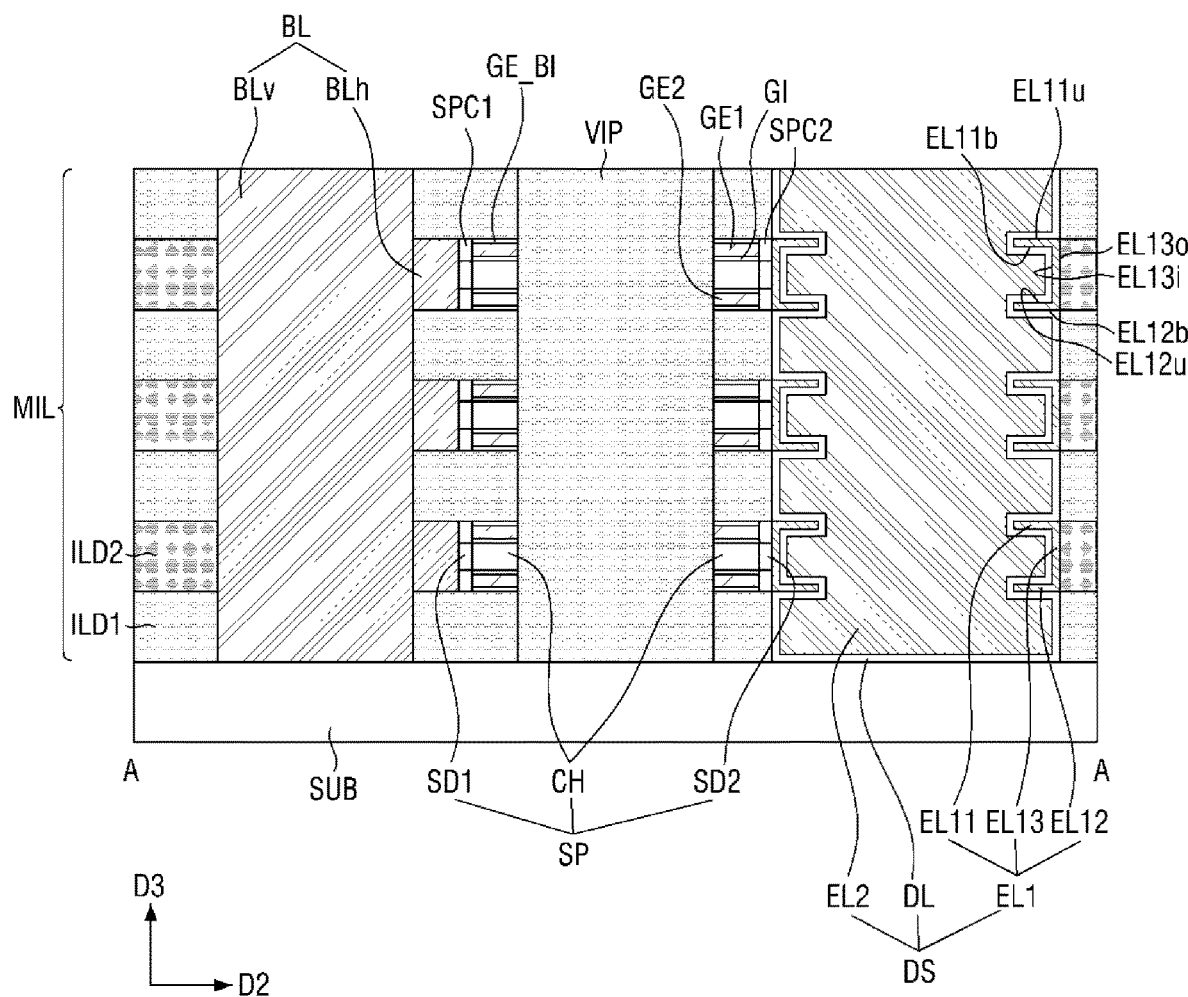
FIG. 7 is a cross-sectional view of a semiconductor memory device according to some embodiments of the present disclosure.
Figure 8:
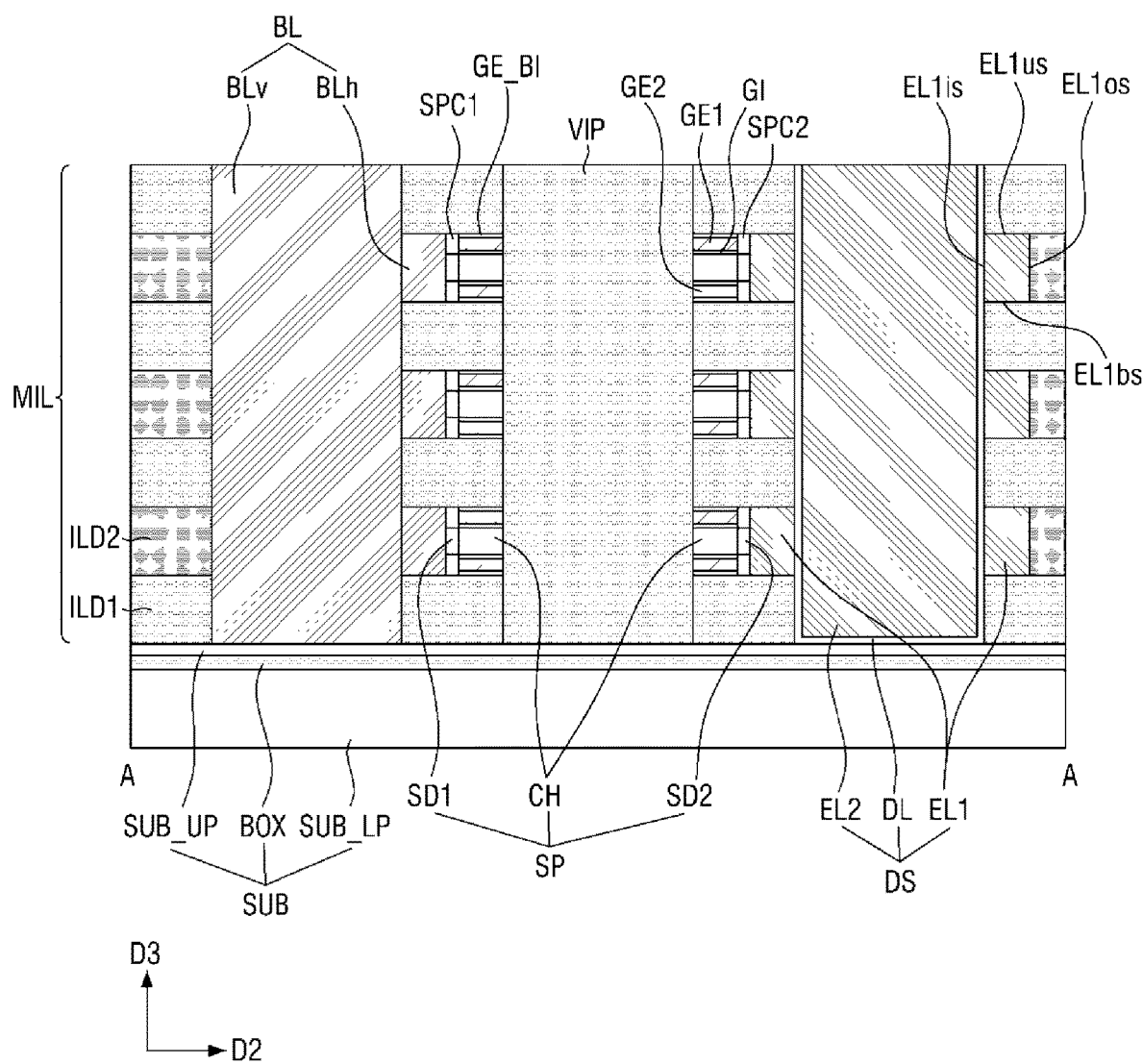
FIG. 8 is a cross-sectional view of a semiconductor memory device according to some embodiments of the present disclosure.

FIGS. 6A and 6B are cross-sectional views of a semiconductor memory device according to some embodiments of the present disclosure. FIG. 7 is a cross-sectional view of a semiconductor memory device according to some embodiments of the present disclosure. FIG. 8 is a cross-sectional view of a semiconductor memory device according to some embodiments of the present disclosure. FIGS. 6A and 6B, 7, and 8 will hereinafter be described, focusing mainly on the differences from FIGS. 1, 2, and 4 through 5D.

Specifically, FIGS. 6A, 7, and 8 are cross-sectional views taken along line A-A of FIG. 4, and FIG. 6B is a cross-sectional view taken along line C-C of FIG. 4.

Referring to FIGS. 6A, 6B and 7, first electrodes EL1 may include upper plate regions EL11 and lower plate regions EL12, which are spaced apart in a third direction D3, and connecting regions EL13, which connect the upper plate regions EL11 and the lower plate regions EL12. The term "region" as used herein may be interchangeable with "portion."

Each of the upper plate regions EL11 may include first and second surfaces EL11*u* and EL11*b*, which are opposite to each other in the third direction D3. Each of the lower plate regions EL12 may include third and fourth surfaces EL12*u* and EL12*b*, which are opposite to each other in the third direction D3. Each of the connecting regions EL13 may include outer and inner sidewalls EL13*o* and EL13*i*.

Referring to FIGS. 6A and 6B, dielectric films DL may extend along the inner sidewalls EL13*i* of the connecting regions EL13, the second surfaces EL11*b* of the upper plate regions EL11, and the third surfaces EL12*u* of the lower plate regions EL12. The second surfaces EL11*b* of the upper plate regions EL11 and the third surfaces EL12*u* of the lower plate regions EL12 may face each other.

Referring to FIG. 7, the dielectric films DL may extend along the inner sidewalls EL13*i* of the connecting regions EL13, the first surfaces EL11*u* of the upper plate regions EL11, the second surfaces EL11*b* of the upper plate regions EL11, the third surfaces EL12*u* of the lower plate regions EL12, and the fourth surfaces EL12*b* of the lower plate regions EL12.

Referring to FIG. 8, a substrate SUB may include a lower semiconductor film SUB_LP, an upper semiconductor film SUB UP, and a buried insulating film BOX, which is disposed between the lower semiconductor film SUB_LP and the upper semiconductor film SUB UP. For example, the substrate SUB may be an SOI substrate.

Figure 9:
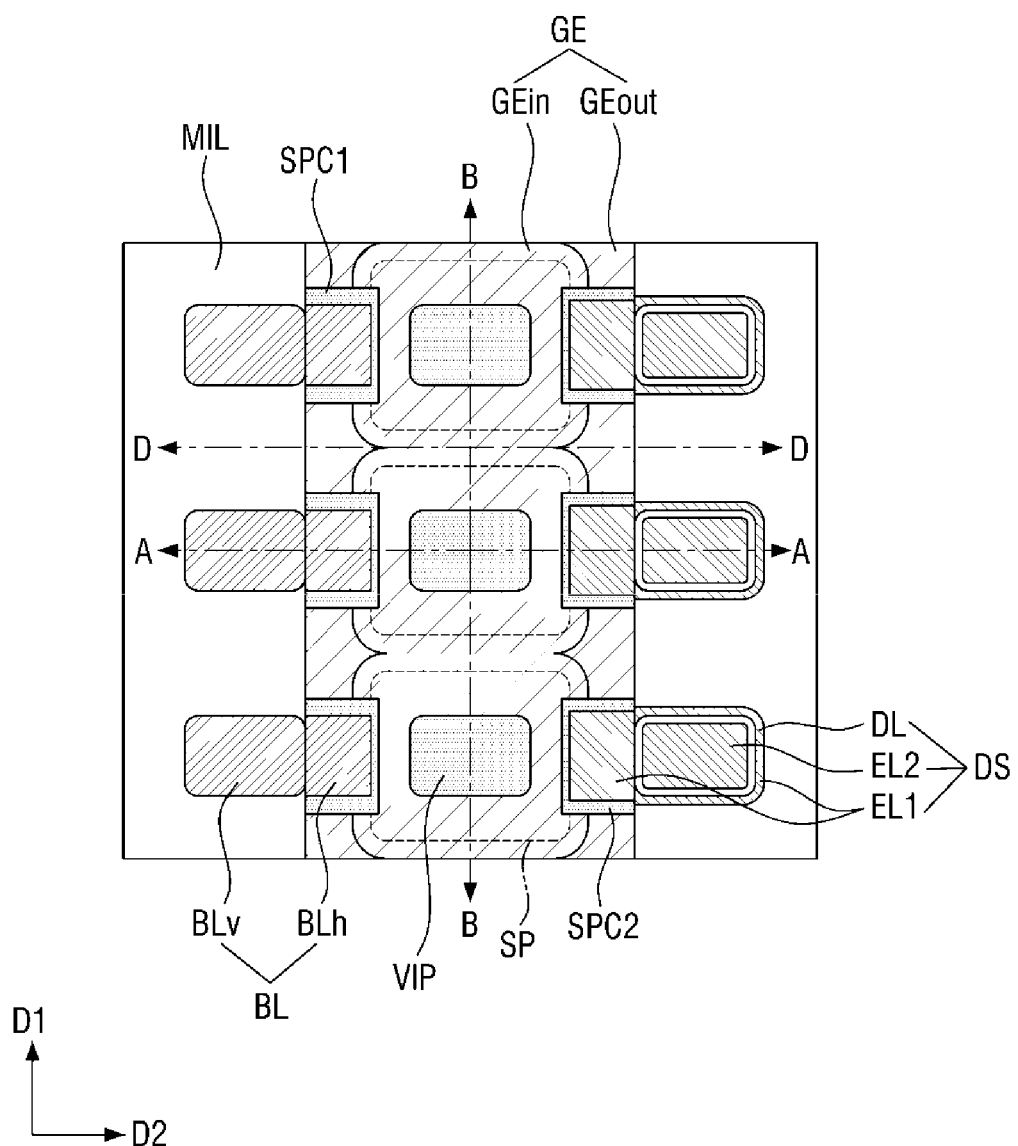
FIG. 9 is a plan view and FIGS. 10A through 10C are cross-sectional views of a semiconductor memory device according to some embodiments of the present disclosure.
Figure 10A:
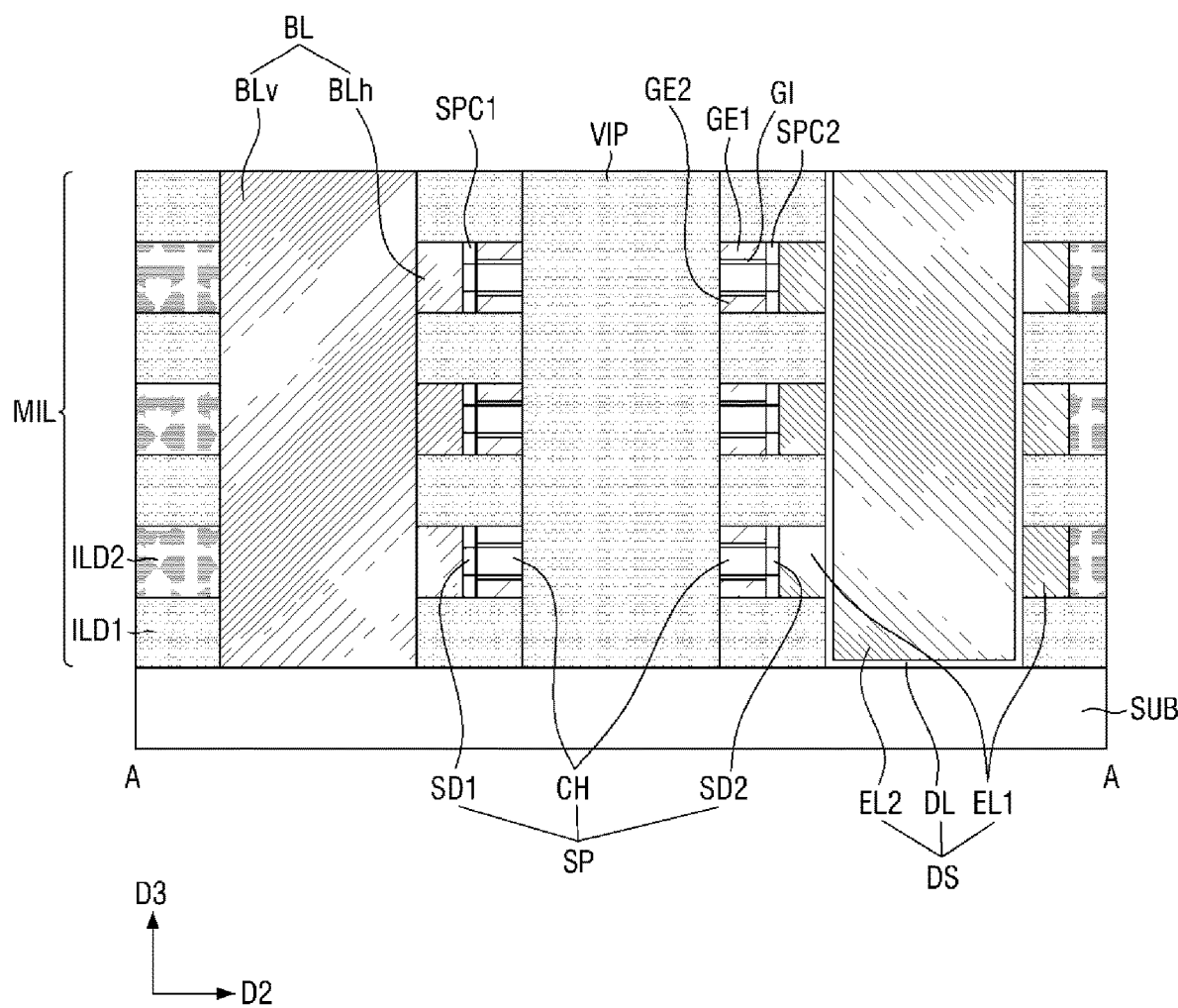
Figure 10B:
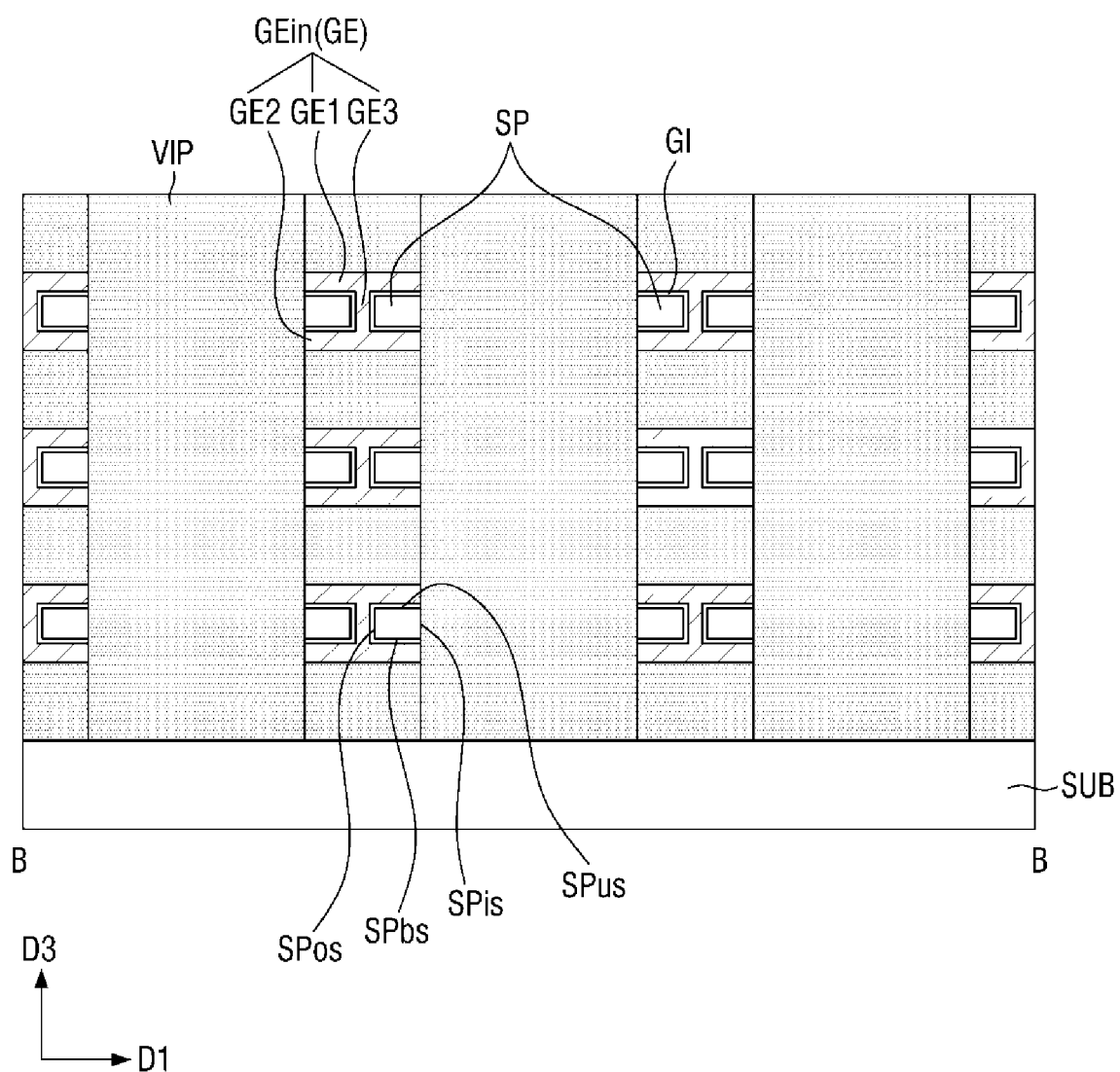
Figure 10C:
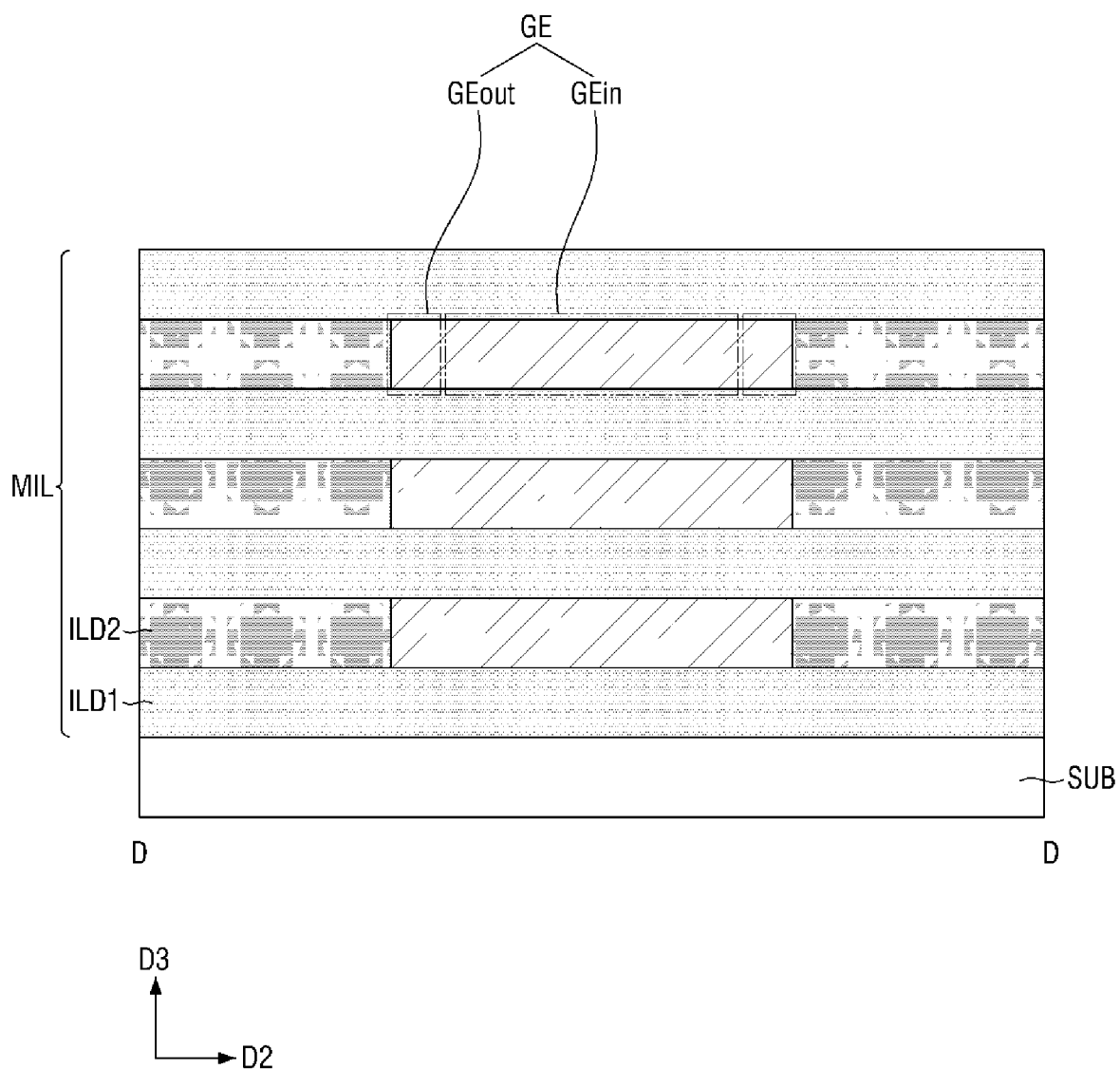

FIGS. 9 through 10C illustrate a semiconductor memory device according to some embodiments of the present disclosure. Specifically, FIG. 9 is a plan view of a semiconductor memory device according to some embodiments of the present disclosure. FIGS. 10A through 10C are cross-sectional views taken along lines A-A, B-B, and D-D, respectively, of FIG. 9. FIGS. 9 through 10C will hereinafter be described, focusing mainly on the differences from FIGS. 4 through 5D.

Referring to FIGS. 9 through 10C, inner gate electrodes GEin and outer gate electrodes GEout may be electrically connected to each other.

Insertion insulating films (e.g., GE_SI of FIG. 4) may not be interposed between the inner gate electrodes GEin and the outer gate electrodes GEout. In some embodiments, the inner gate electrodes GEin and the outer gate electrodes GEout contact each other. That is, the outer gate electrodes GEout may operate as wordlines.

Blocking insulating films (e.g., GE_BI of FIGS. 5A and 5B) may not be interposed between upper gate electrodes GE1 and first mold insulating layers ILD1 between lower gate electrodes GE2 and the first mold insulating layers ILD1.

Figure 11:
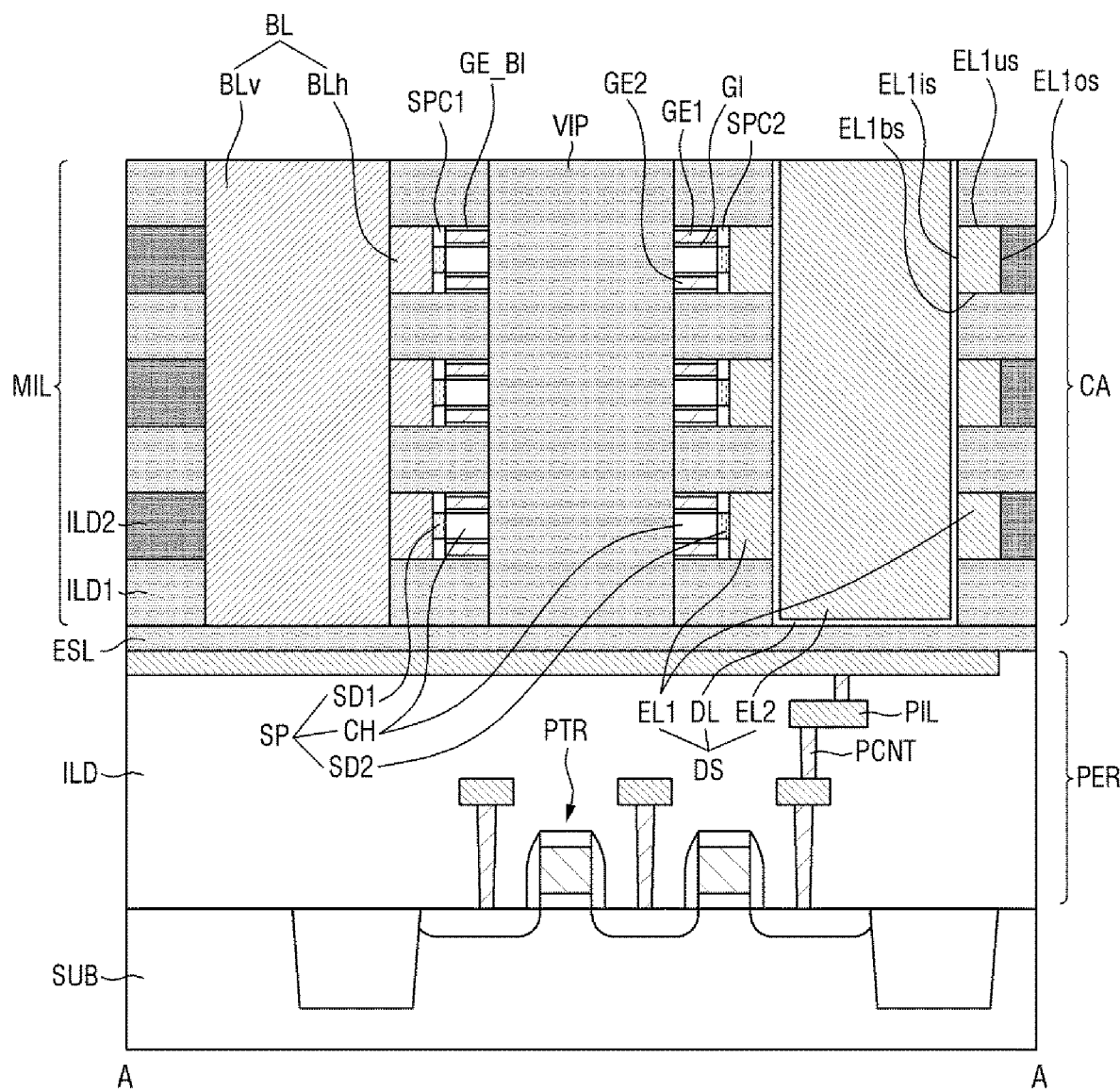
FIG. 11 is a cross-sectional view of a semiconductor memory device according to some embodiments of the present disclosure.
Figure 12:
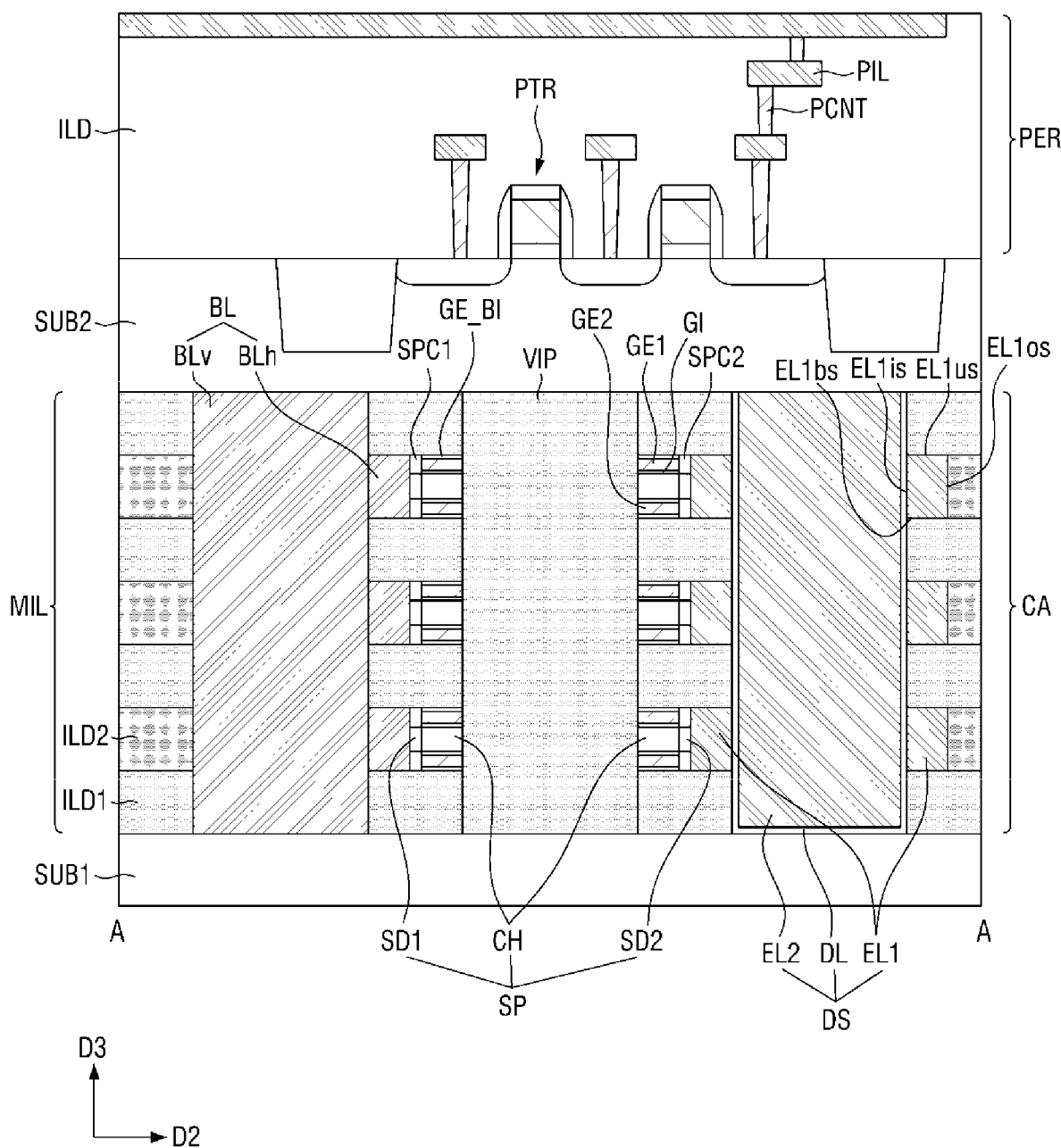
FIG. 12 is a cross-sectional view of a semiconductor memory device according to some embodiments of the present disclosure.

FIG. 11 is a cross-sectional view of a semiconductor memory device according to some embodiments of the present disclosure. FIG. 12 is a cross-sectional view of a semiconductor memory device according to some embodiments of the present disclosure. FIGS. 11 and 12 will hereinafter be described, focusing mainly on the differences from FIGS. 4 through 5D.

A cell array CA of FIGS. 11 and 12 may be the same as or similar to, for example, the cell array CA of FIG. 5A, but the present disclosure is not limited thereto. The cell array CA of FIGS. 11 and 12 may be the same as or similar to any of the cell arrays CA described herein.

Referring to FIG. 11, the cell array CA that has been described above with reference to FIG. 1 may be provided on a substrate SUB. A peripheral circuit region PER may be provided between the cell array CA and the substrate SUB. The peripheral circuit region PER may include circuits for operating the cell array CA.

Specifically, the peripheral circuit region PER may include peripheral transistors PTR, peripheral wires PIL on the peripheral transistors PTR, and peripheral contacts PCNT vertically connecting the peripheral wires PIL. Although not specifically illustrated, the peripheral wires PIL may be electrically connected to the cell array CA via through electrodes.

For example, an etch stopper film ESL may be additionally interposed between the cell array CA and the peripheral circuit region PER. In some embodiments, the etch stopper film ESL may be omitted and may not be interposed between the cell array CA and the peripheral circuit region PER. In some embodiments, an insulating layer ILD may be provided in the peripheral circuit region PER.

As already mentioned above with reference to FIGS. 1 and 3A, the semiconductor memory device may have a Cell-On-Peri (COP) structure in which memory cells are provided on the peripheral circuit region PER. By stacking the peripheral circuit region PER and the cell array CA three-dimensionally, the size of the semiconductor memory device can be reduced, and high integration density can be realized.

Referring to FIG. 12, the cell array CA may be provided on a first substrate SUB1. A second substrate SUB2 may be provided on the cell array CA. A peripheral circuit region PER may be provided on the second substrate SUB2. The peripheral circuit region PER may include circuits for operating the cell array CA.

The forming of the semiconductor memory device may include forming the cell array CA on the first substrate SUB1, forming the peripheral circuit region PER on the second substrate SUB2, and bonding the second substrate SUB2 on the cell array CA via, for example, wafer bonding.

The semiconductor memory device may have a Peri-On-Cell (POC) structure in which the peripheral circuit region PER is provided on memory cells. By stacking the cell array CA and the peripheral circuit region PER three-dimensionally, the size of the semiconductor memory device can be reduced, and high integration density can be realized.

FIGS. 13 through 44 are plan views or cross-sectional views illustrating a method of fabricating a semiconductor memory device according to some embodiments of the present disclosure. Specifically, FIGS. 14, 18A, 20A, 22A, 24A, 26A, 28A, 30, 32A, 32B, 34, 36, 38, 40, 42, and 44 are cross-sectional views taken along lines A-A of FIGS. 13, 17, 19, 21, 23, 25, 27, 29, 31, 33, 35, 37, 39, 41, and 43. FIGS. 16, 18B, 20B, 22B, 24B, 26B, and 28B are cross-sectional views taken along lines B-B of FIGS. 15, 17, 19, 21, 23, 25, and 27.

Figure 13:
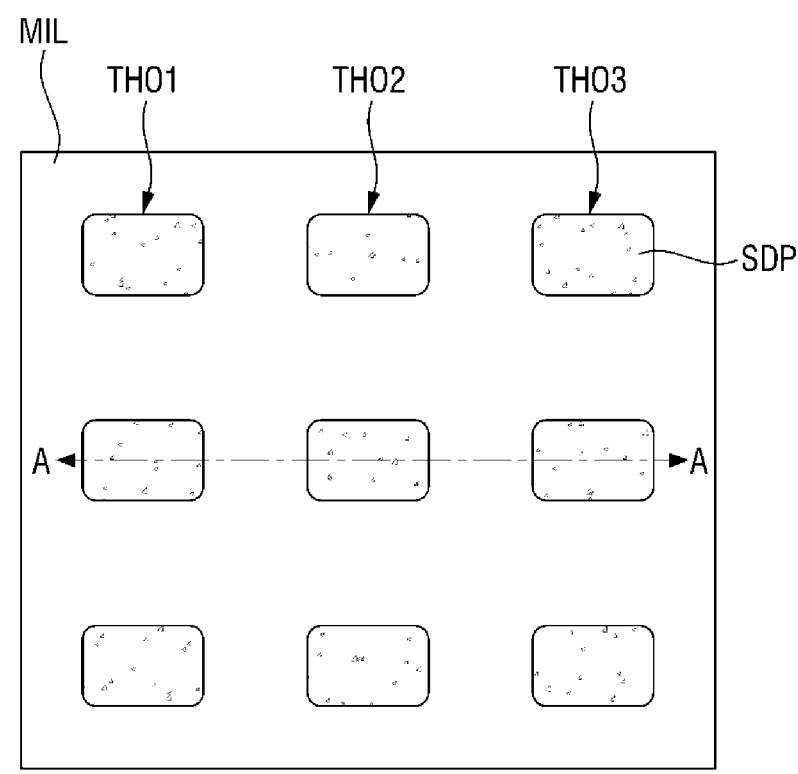
FIGS. 13 through 44 are views illustrating a method of fabricating a semiconductor memory device according to some embodiments of the present disclosure.
Figure 14:
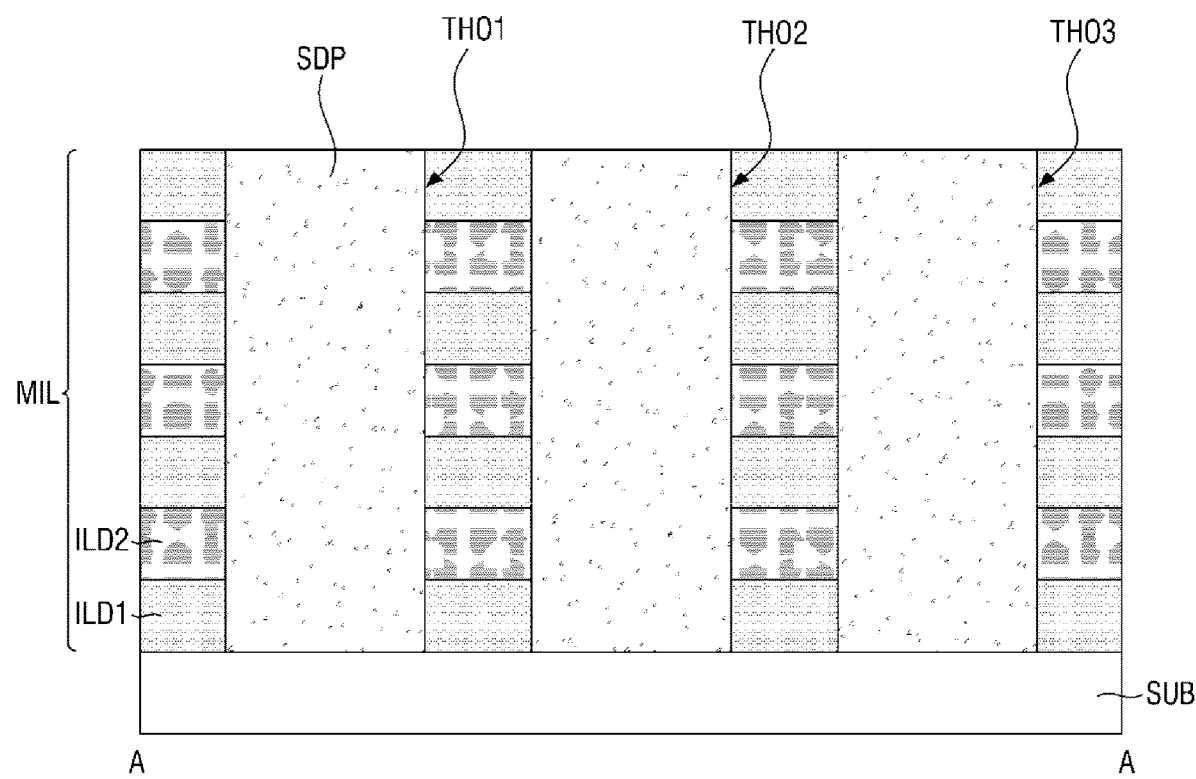

Referring to FIGS. 13 and 14, a mold structure MIL, which includes a plurality of mold layers (e.g., ILD1 and ILD2) that are vertically stacked, may be formed on a substrate SUB. Each of the mold layers (e.g., ILD1 and ILD2) may include first and second mold insulating layers ILD1 and ILD2.

Thereafter, first through holes THO1, second through holes THO2, and third through holes THO3 may be formed to penetrate or extend through the mold structure MIL. The first through holes THO1, the second through holes THO2, and the third through holes THO3 may be sequentially arranged in rows in a second direction D2.

Thereafter, sacrificial insulating patterns SDP may be formed in the first through holes THO1, the second through holes THO2, and the third through holes THO3. The sacrificial insulating patterns SDP may fill the first through holes THO1, the second through holes THO2, and the third through holes THO3.

In some embodiments, the first through holes THO1, the second through holes THO2, and the third through holes THO3 may have a chamfered rectangular shape as illustrated in FIG. 13, but the present disclosure is not limited thereto. In some embodiments, each of the first through holes THO1, the second through holes THO2, and the third through holes THO3 may have, for example, a circular or elliptical shape.

Figure 15:
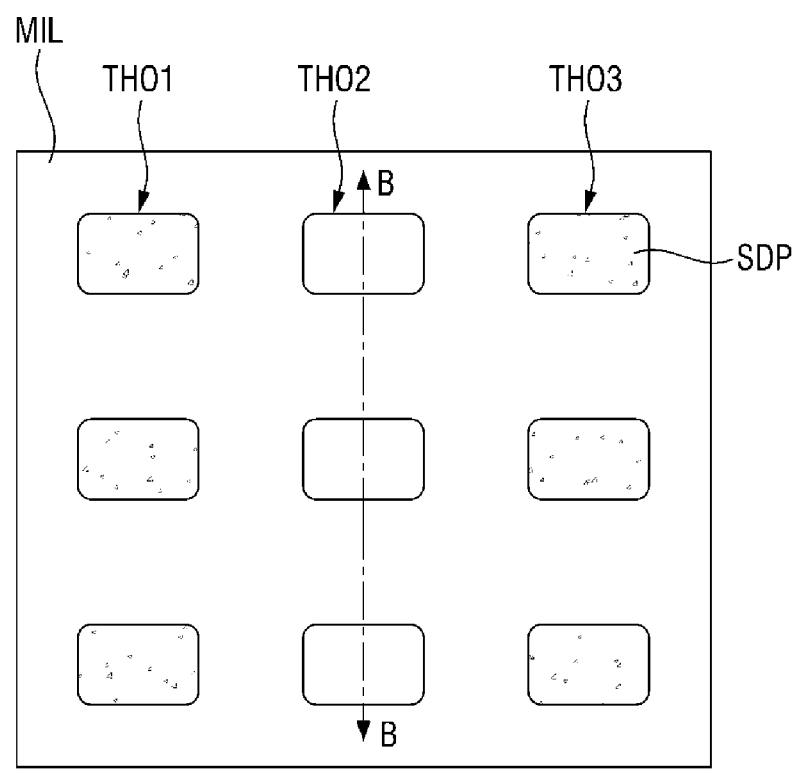
Figure 16:
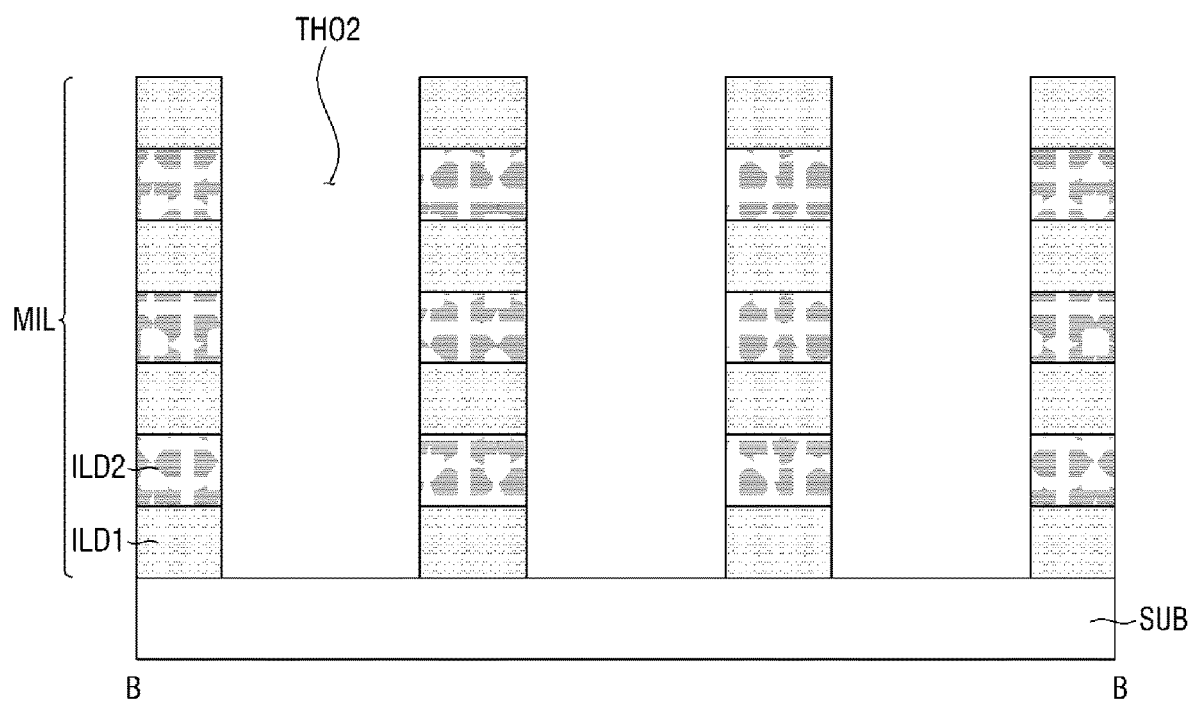
Figure 16:
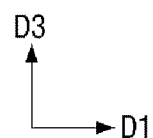

Referring to FIGS. 15 and 16, the sacrificial insulating patterns SDP in the second through holes THO2 may be removed. In some embodiments, the sacrificial insulating patterns SDP in the second through holes THO2 may be removed entirely as illustrated in FIG. 16 but the present disclosure is not limited thereto. In some embodiments, portion(s) of the sacrificial insulating patterns SDP in the second through holes THO2 may remain.

The first mold insulating layers ILD1 and the second mold insulating layers ILD2, included in the mold structure MIL, may be exposed by the second through holes THO2.

Figure 17:
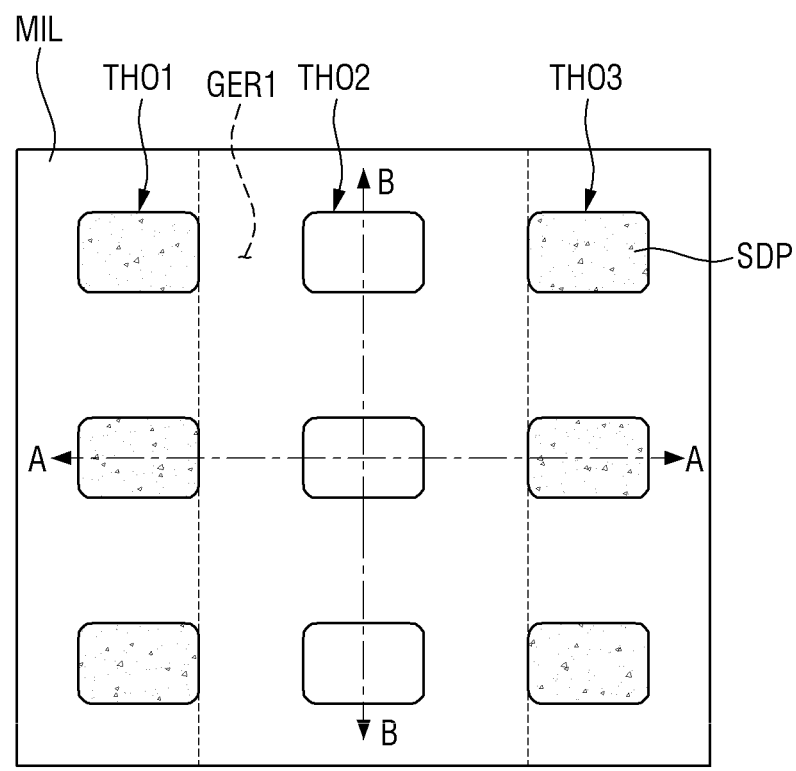
Figure 18A:
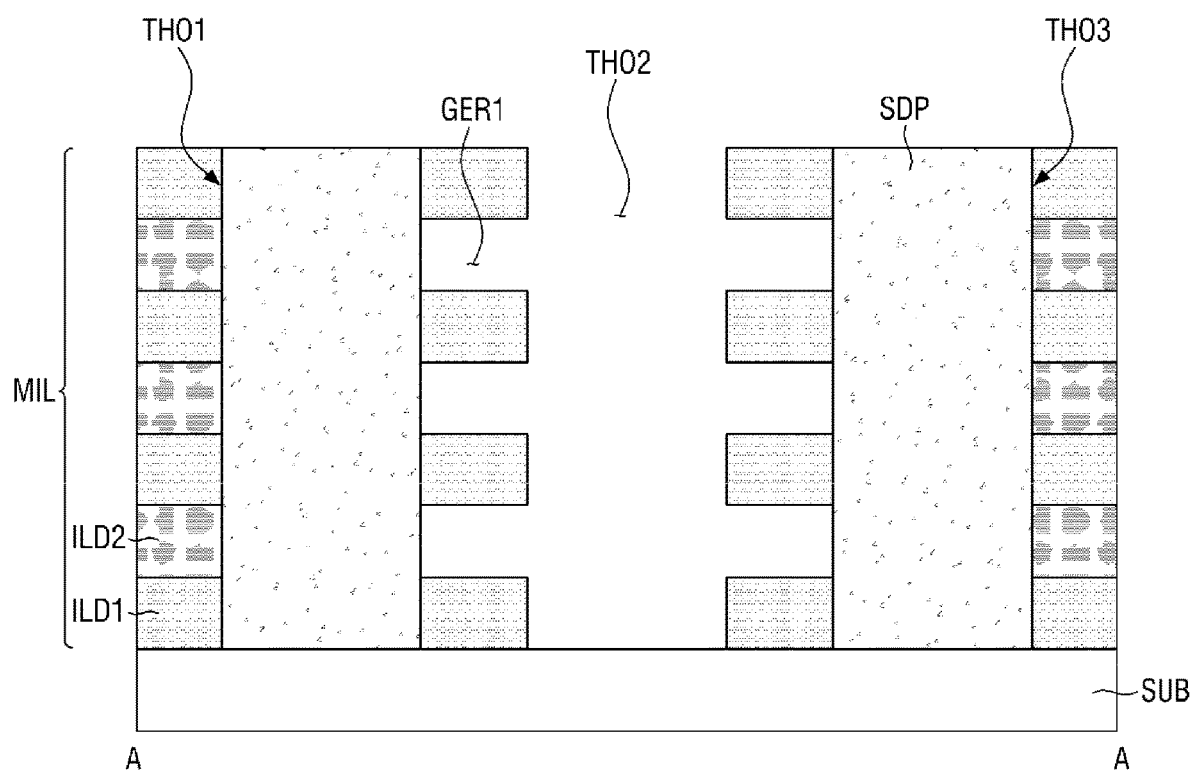
Figure 18B:
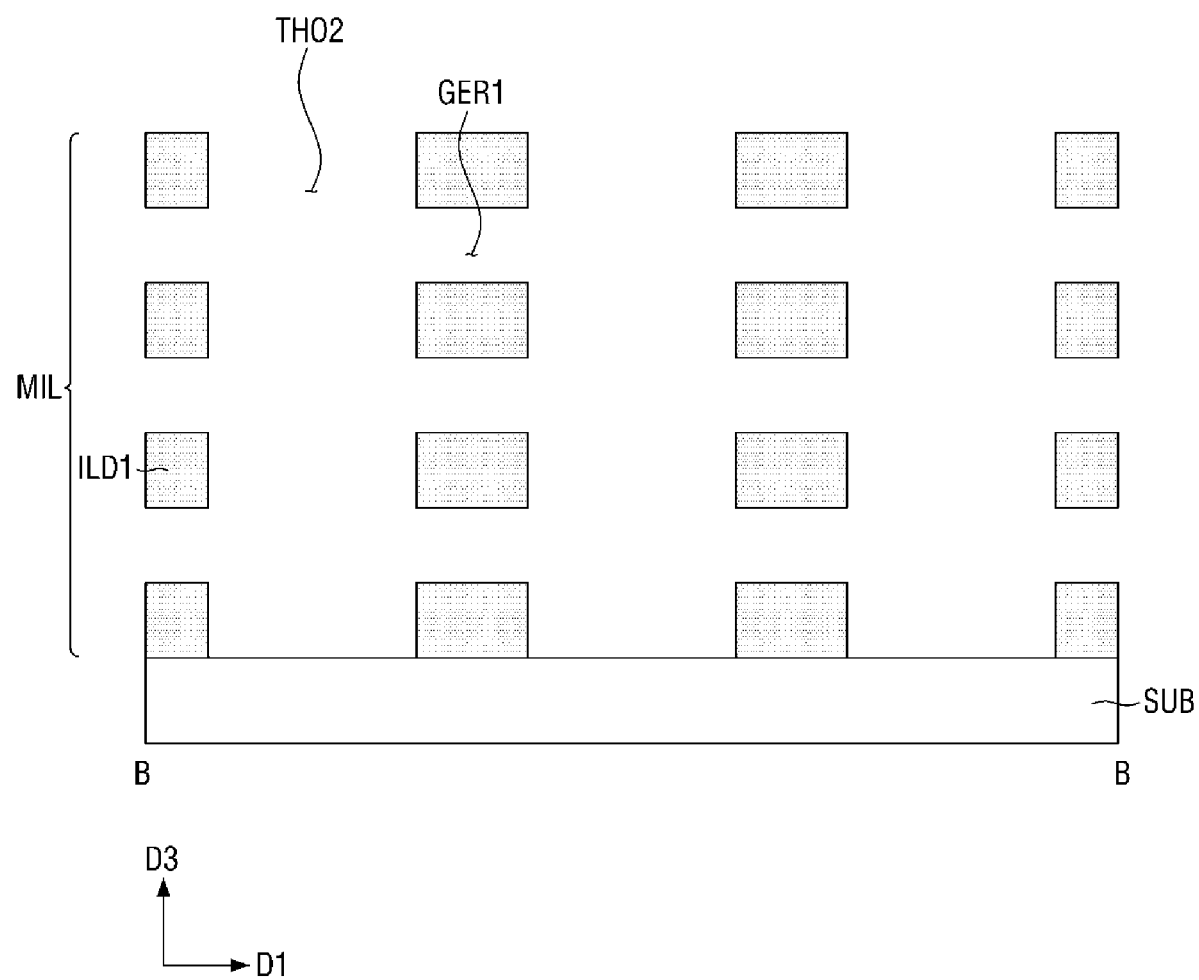

Referring to FIGS. 17 through 18B, parts of the second mold insulating layers ILD2, exposed by the second through holes THO2, may be etched.

By etching the parts of the second mold insulating layers ILD2, first gate recesses GER1 may be formed in the mold structure MIL.

The sacrificial insulating patterns SDP in the first through holes THO1 and the third through holes THO3 may be partially exposed by the first gate recesses GER1 as illustrated in FIG. 18A.

Referring to FIG. 18B, which is a cross-sectional view taken along the first direction D1, the top surfaces and the bottom surfaces of the first mold insulating layers ILD1 between the second through holes THO2 may be exposed by the first gate recesses GER1, and sides of the first mold insulating layers ILD1 between the second through holes THO2 may be exposed by the second through holes THO2.

Figure 19:
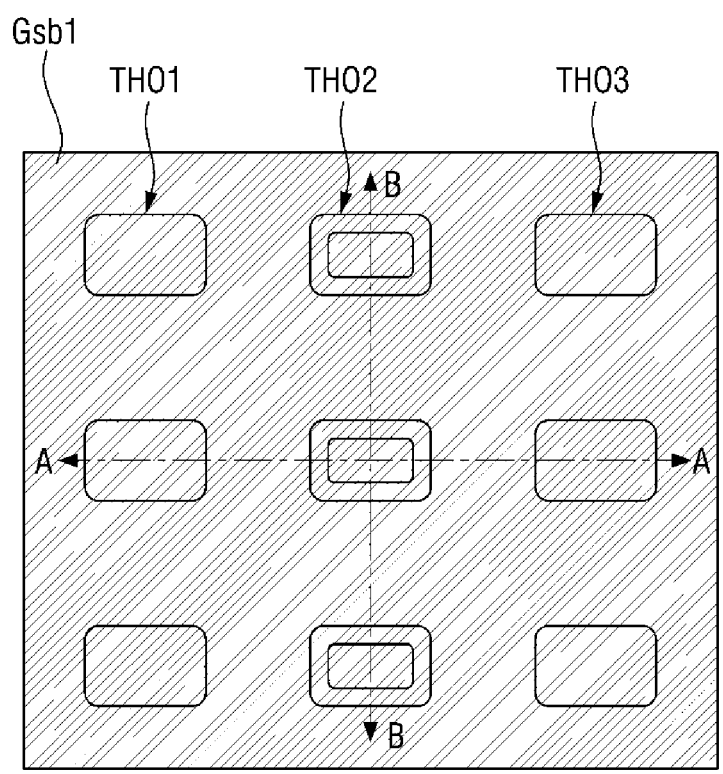
Figure 20A:
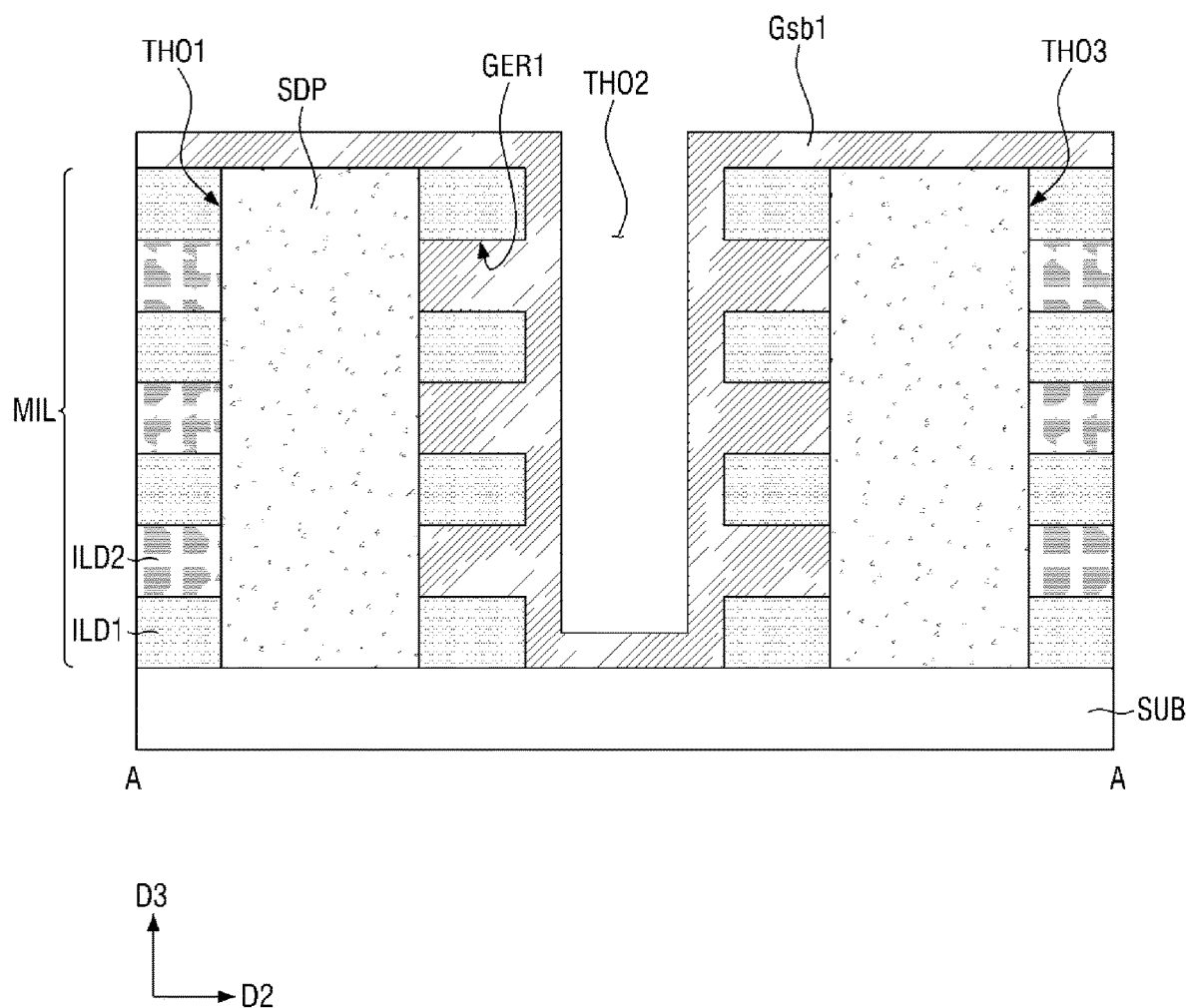
Figure 20B:
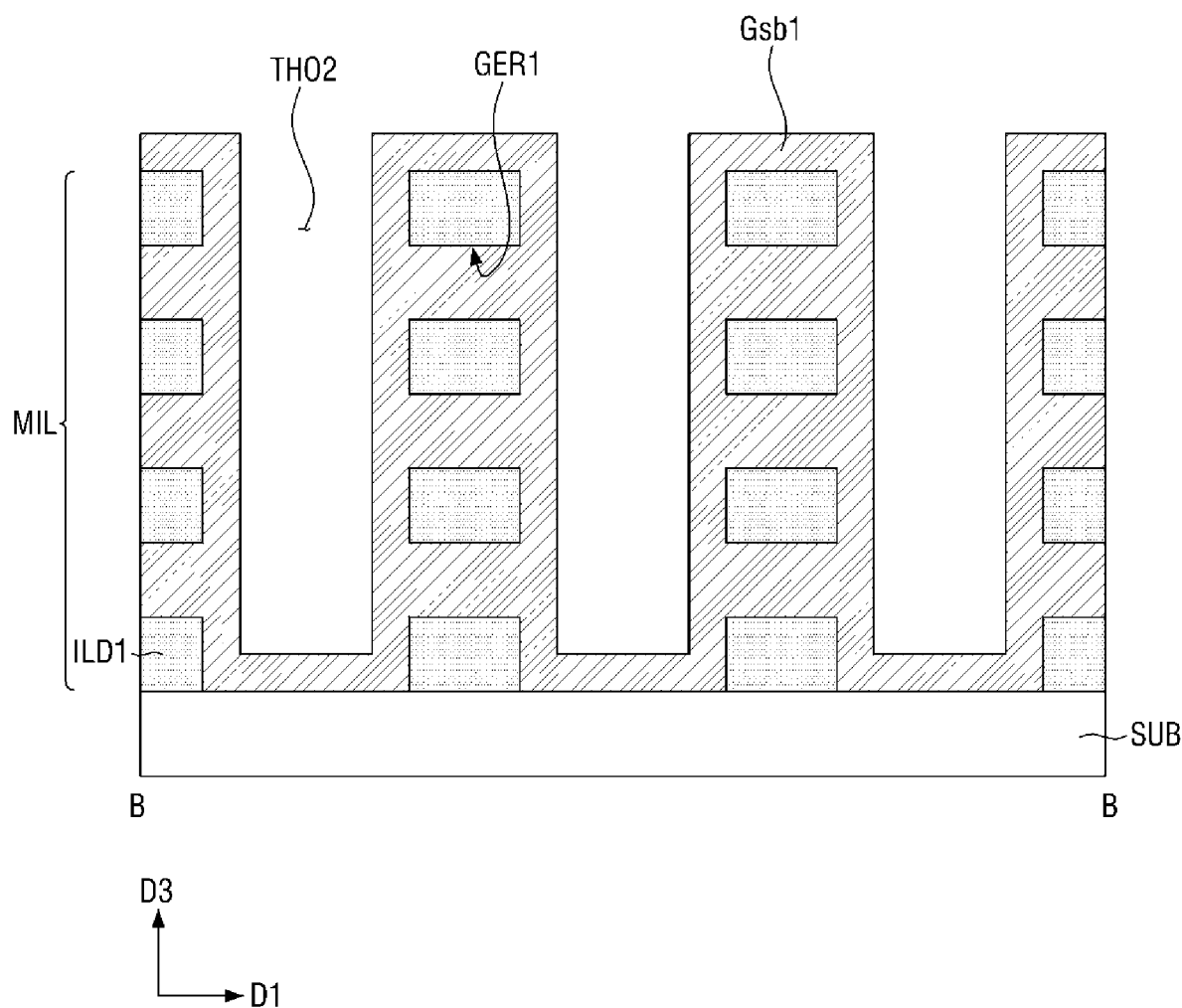

Referring to FIGS. 19 through 20B, first sub-gate films Gsb1 may be formed in the first gate recesses GER1. In some embodiments, the first sub-gate films Gsb1 may fill the first gate recesses GER1 as illustrated in FIGS. 20A and 20B.

The first sub-gate films Gsb1 may be formed on the sidewalls and the bottom of each of the second through holes THO2.

Figure 21:
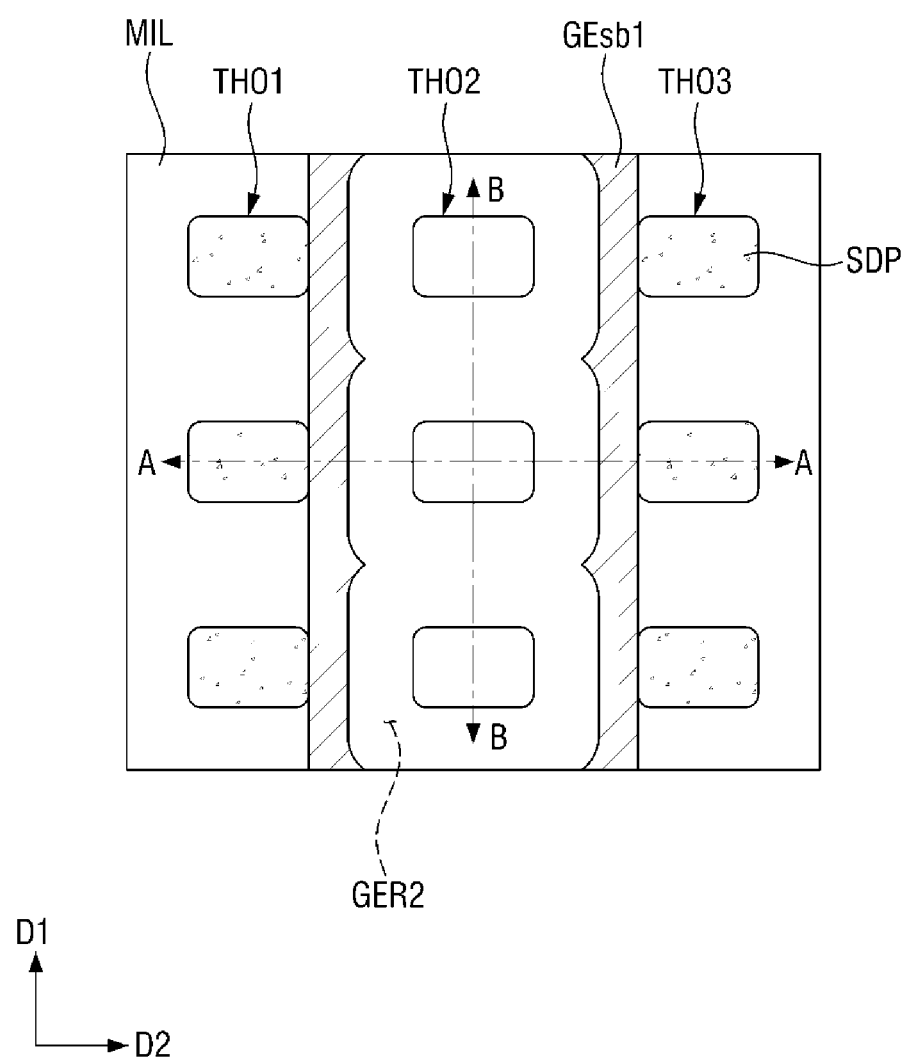
Figure 22A:
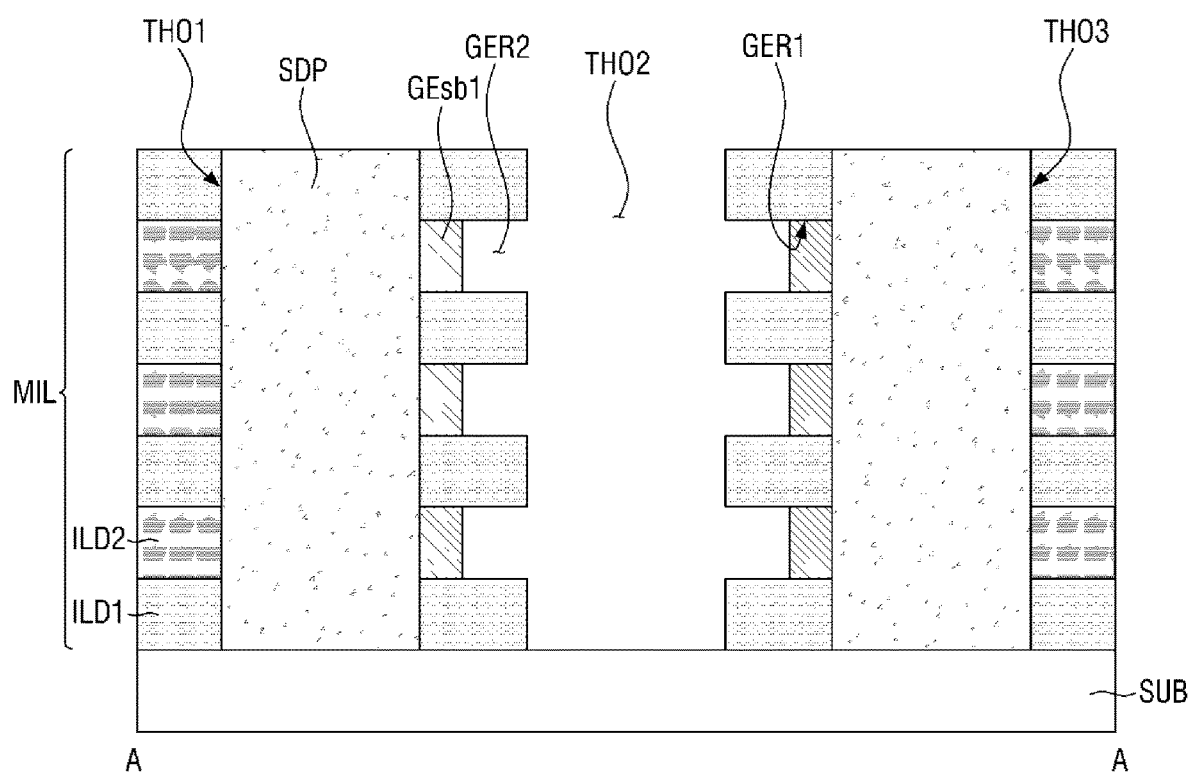
Figure 22A:
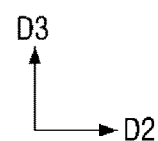
Figure 22B:
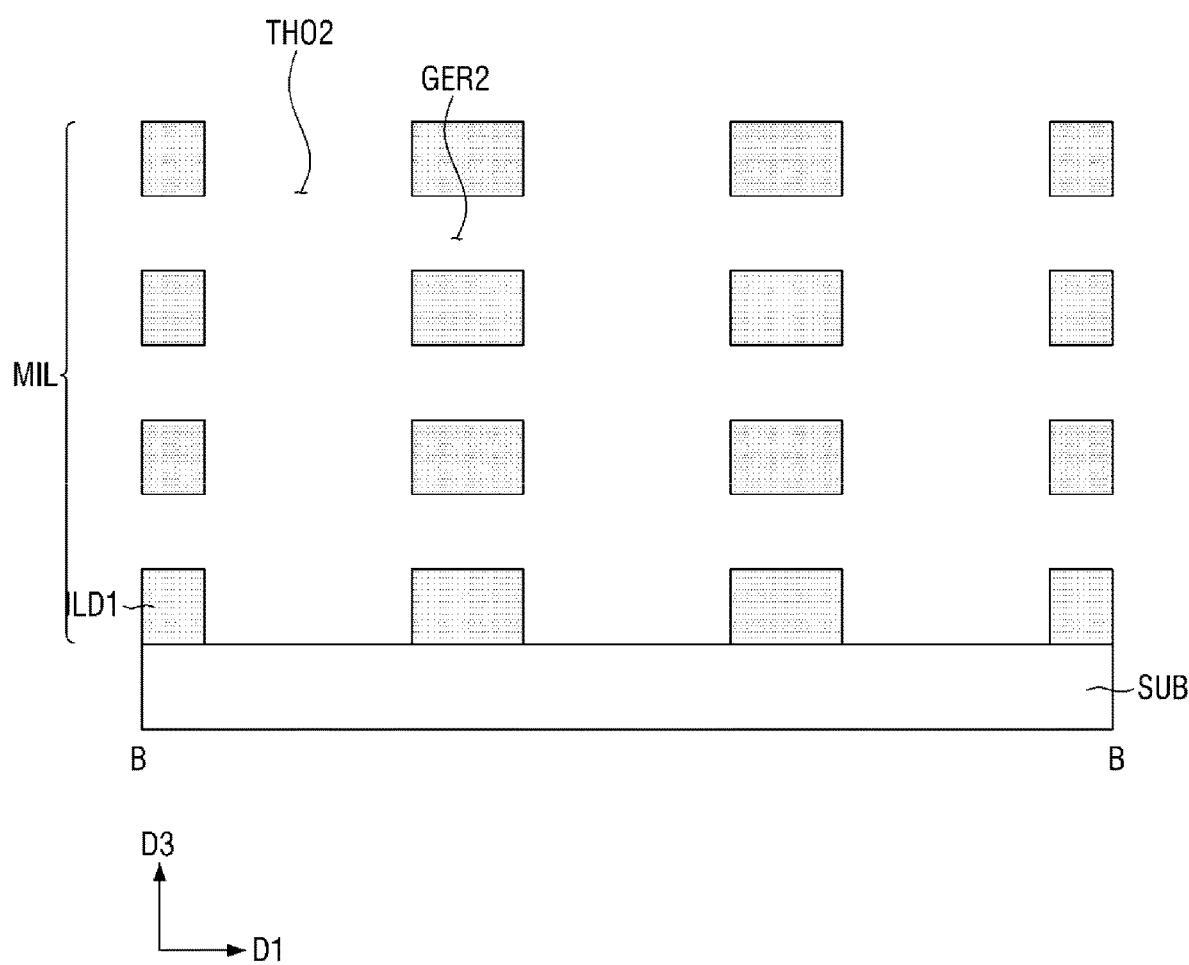

Referring to FIGS. 21 through 22B, first sub-gates GEsb1 may be formed in the first gate recesses GER1 by partially etching the first sub-gate films Gsb1.

For example, the first sub-gate films Gsb1 may be partially etched through, for example, isotropic etching.

As the first sub-gates GEsb1 are formed in the first gate recesses GER1, second gate recesses GER2 may be formed in the mold structure MTh. Parts of the second gate recesses GER2 may be defined by the first sub-gates GEsb1.

The first sub-gates GEsb1 may be formed on the sidewalls of each of the sacrificial insulating patterns SDP that are formed in (e.g. fill) the first through holes THO1 and the third through holes THO3. However, referring to FIG. 22B, which is a cross-sectional view taken along the first direction D1, parts of the first sub-gate Gsb1 (see FIG. 20B) between pairs of adjacent first mold insulating layers ILD1 in a third direction D3 may be removed.

As a result, the top surfaces and the bottom surfaces of the first mold insulating layers ILD1 between the second through holes THO2 may be exposed by the second gate recesses GER2.

Figure 23:
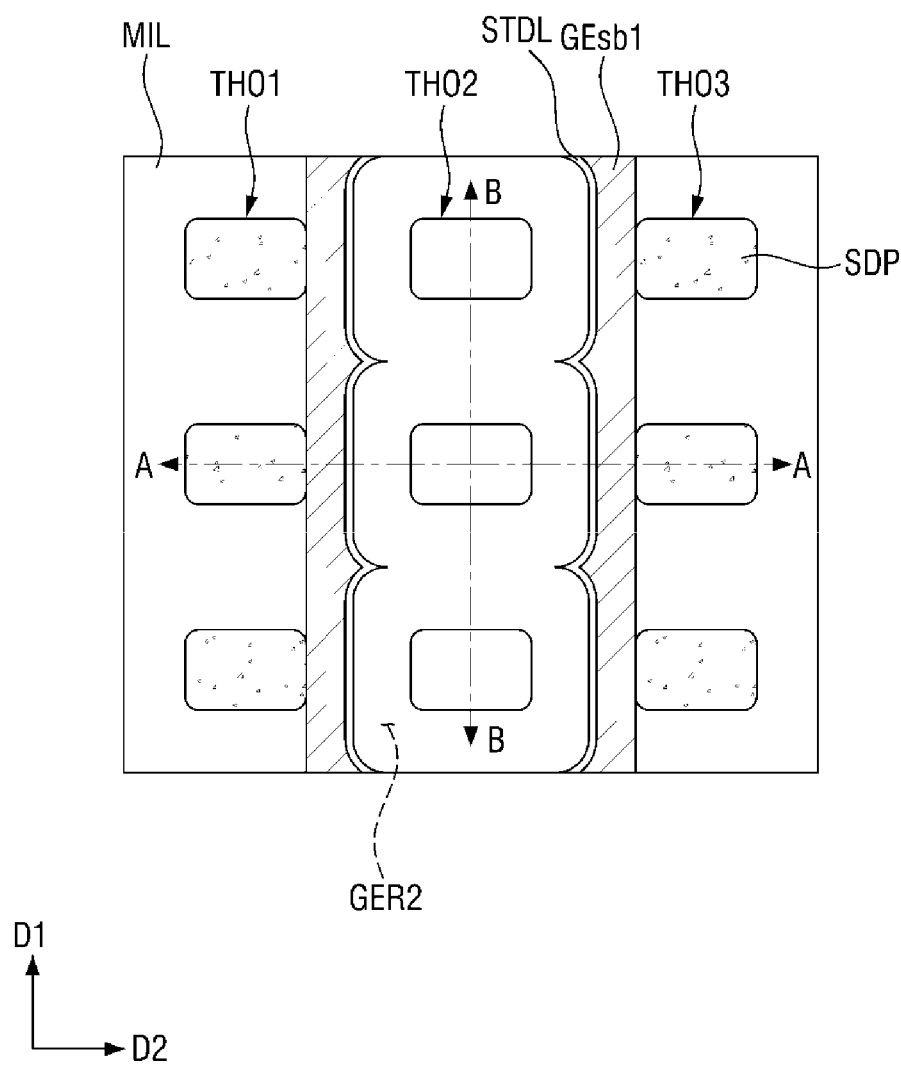
Figure 24A:
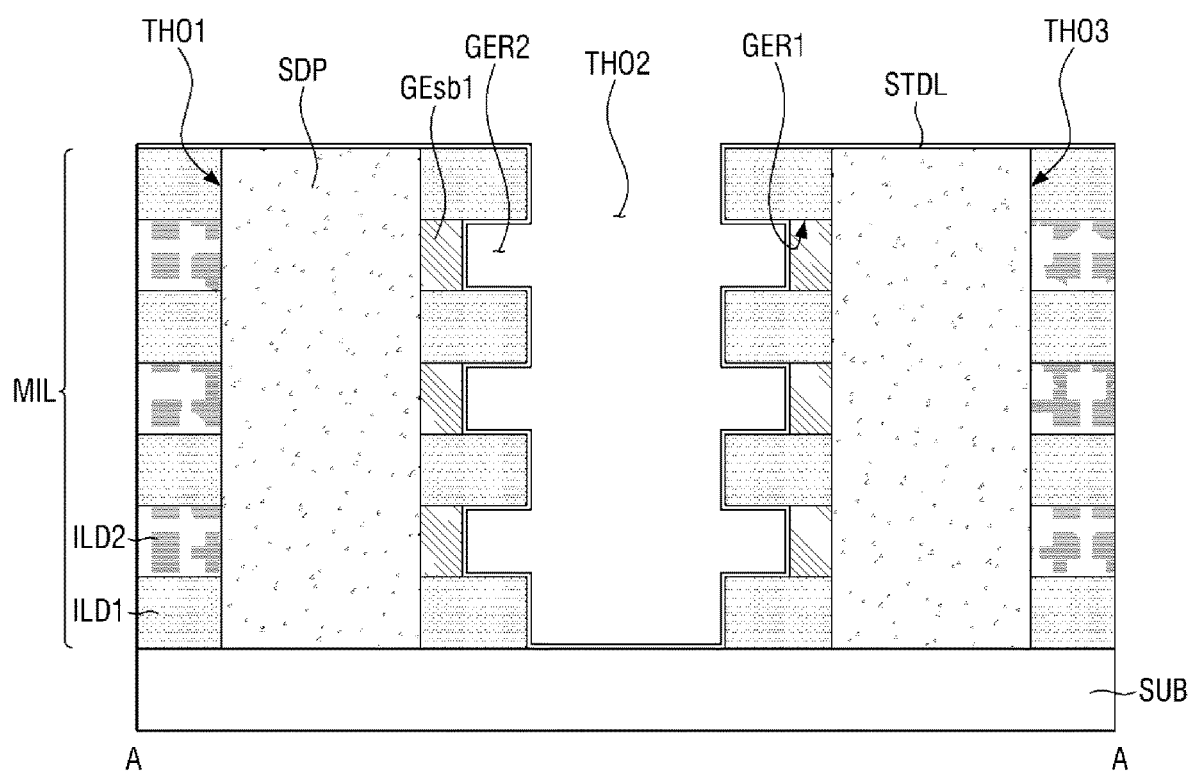
Figure 24B:
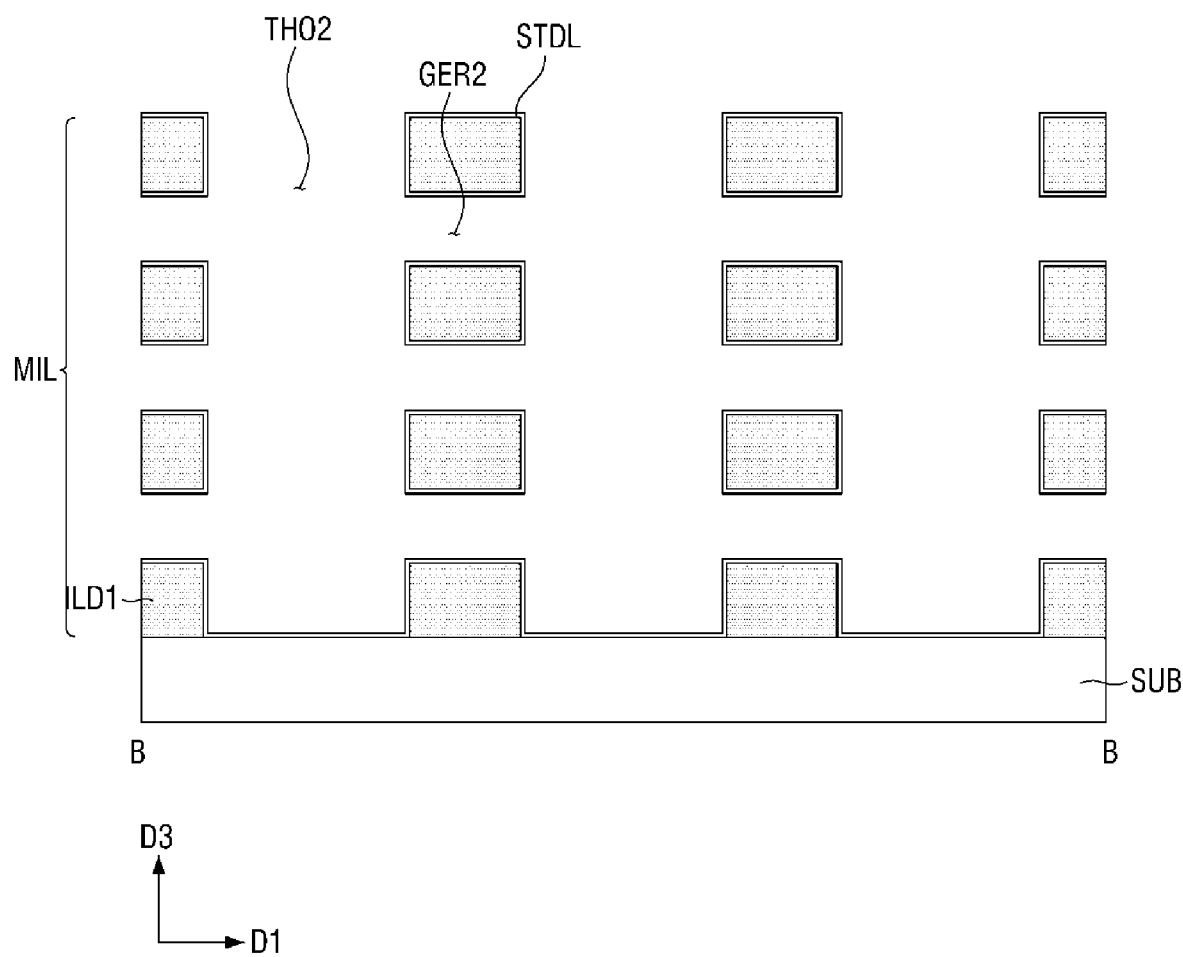

Referring to FIGS. 23 through 24B, stopper insulating films STDL may be formed on the sidewalls and the bottom of each of the second through holes THO2, along the profiles of the second gate recesses GER2.

The stopper insulating films STDL may be formed along the top surface of the mold structure MTh. The stopper insulating films STDL may be formed conformally. In some embodiments, the stopper insulating films STDL may have a uniform thickness and may be formed conformally on the underlying structure as illustrated in FIGS. 24A and 24B.

Each of the stopper insulating films STDL may include at least one of, for example, a silicon oxide film, a silicon nitride film, a silicon oxynitride film, a carbon-based silicon oxide film, a carbon-based silicon nitride film, and a carbon-based silicon oxynitride film.

Figure 25:
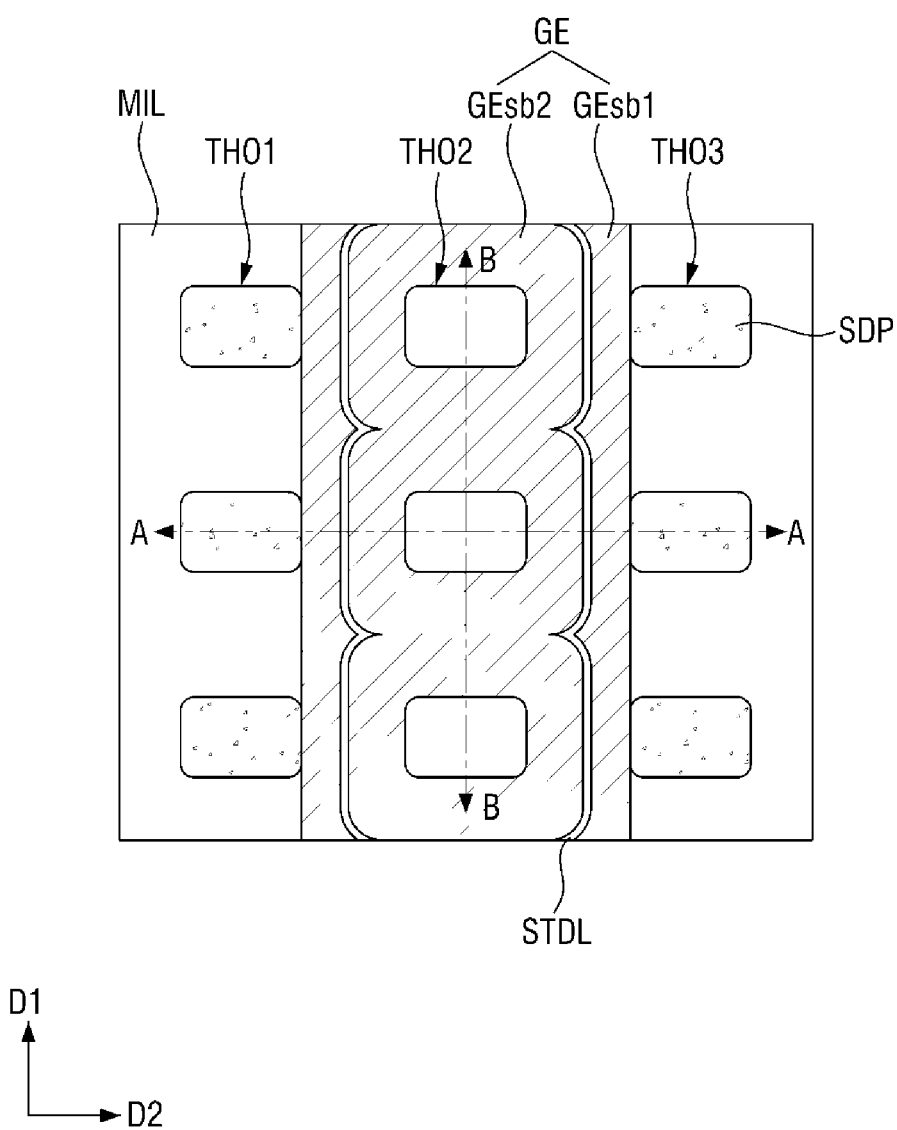
Figure 26A:
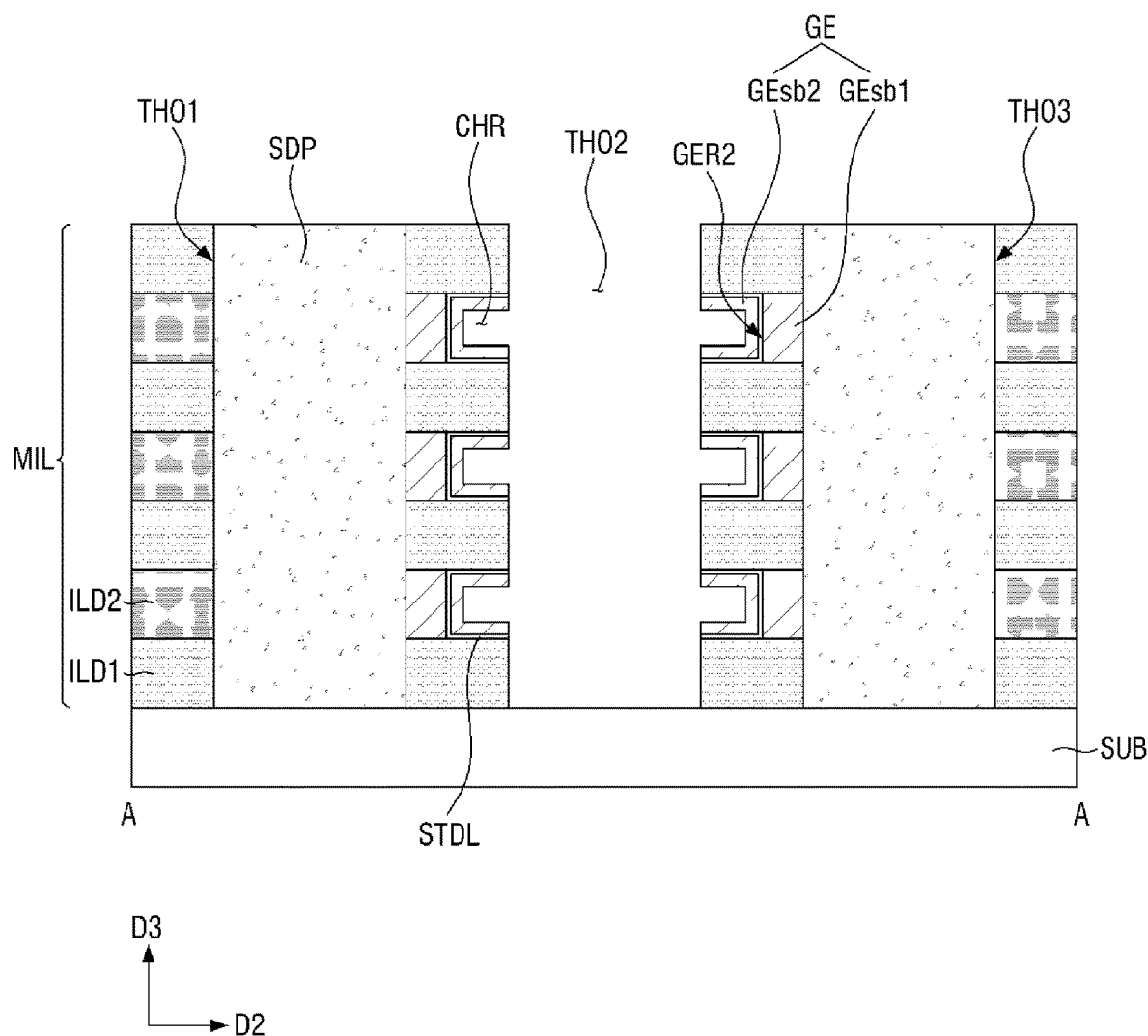
Figure 26B:
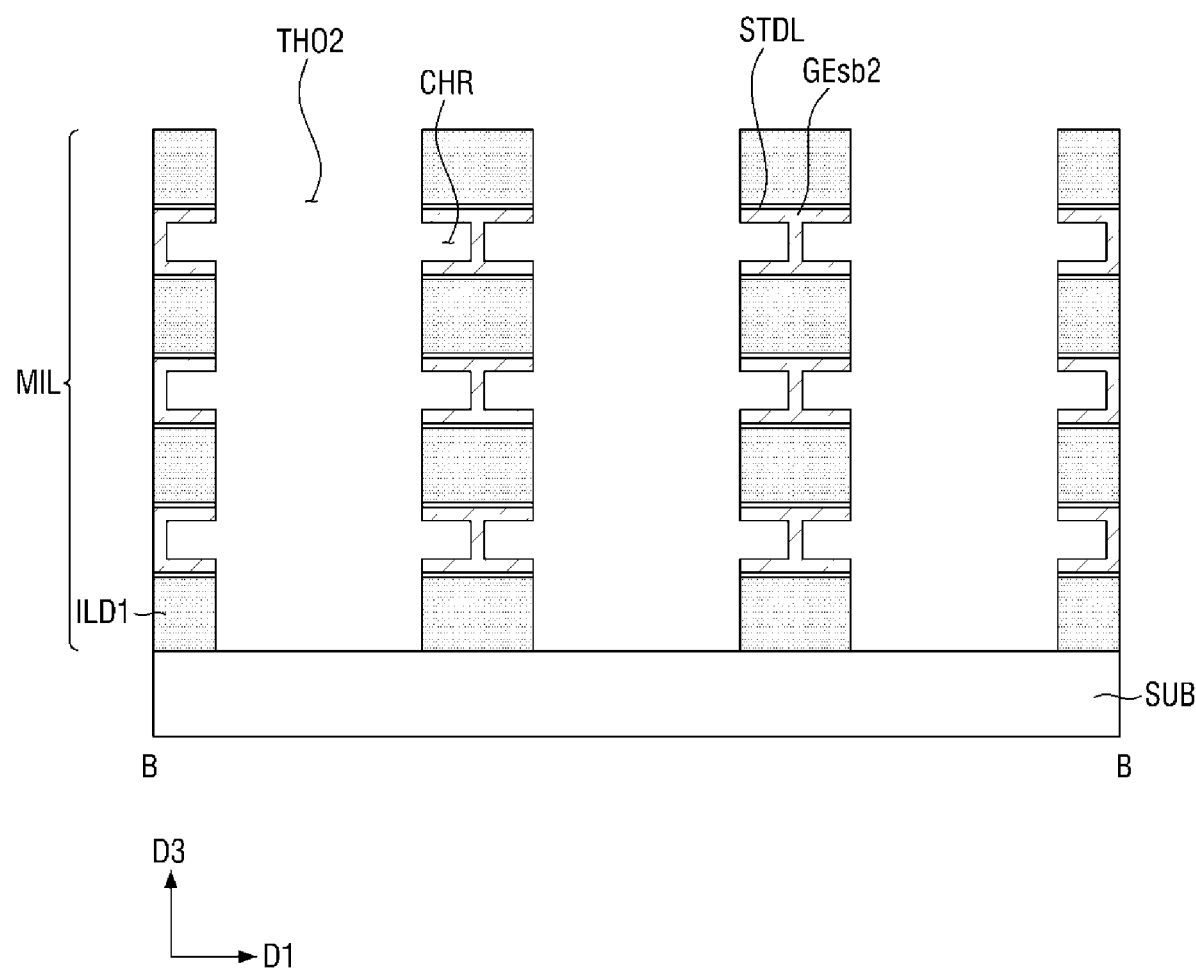

Referring to FIGS. 25 through 26B, second sub-gates GEsb2 may be formed on the stopper insulating films STDL, along the profiles of the second gate recesses GER2.

As a result, gate electrodes GE, including the first sub-gates GEsb1 and the second sub-gates GEsb2, may be formed. The first sub-gates GEsb1 and the second sub-gates GEsb2 may include the same material or different materials.

The gate electrodes GE may be formed between the pairs of adjacent first mold insulating layers ILD1 in the third direction D3. The gate electrodes GE may extend in the first direction D1. The first sub-gates GEsb1 and the second sub-gates GEsb2 may be electrically insulated by the stopper insulating films STDL.

Channel recesses CHR, which are defined by the gate electrodes GE, may be formed in the mold structure MTh.

Specifically, second sub-gate films may be formed on the stopper insulating films STDL and on the sidewalls and the bottom of each of the second through holes THO2, along the profiles of the second gate recesses GER2.

The second sub-gate films may be trimmed (e.g., may be partially etched) so that parts of the second sub-gate films, formed on the sidewalls and the bottom of each of the second through holes THO2 and along the top surface of the mold structure MIL, may be removed. That is, the entire second sub-gate films, except for parts of the second sub-gate films, formed along the profiles of the second gate recesses GER2, may be removed.

The stopper insulating films STDL are illustrated as being removed from the sidewalls and the bottom of each of the second through holes THO2 and from the top surface of the mold structure MIL, but the present disclosure is not limited thereto. In some embodiments, the stopper insulating films STDL and the first mold insulating layers ILD1 may include the same material, the stopper insulating films STDL may account for parts of the first mold insulating layers ILD1. In this case, the stopper insulating films STDL may remain on the top surface of the substrate SUB.

Figure 27:
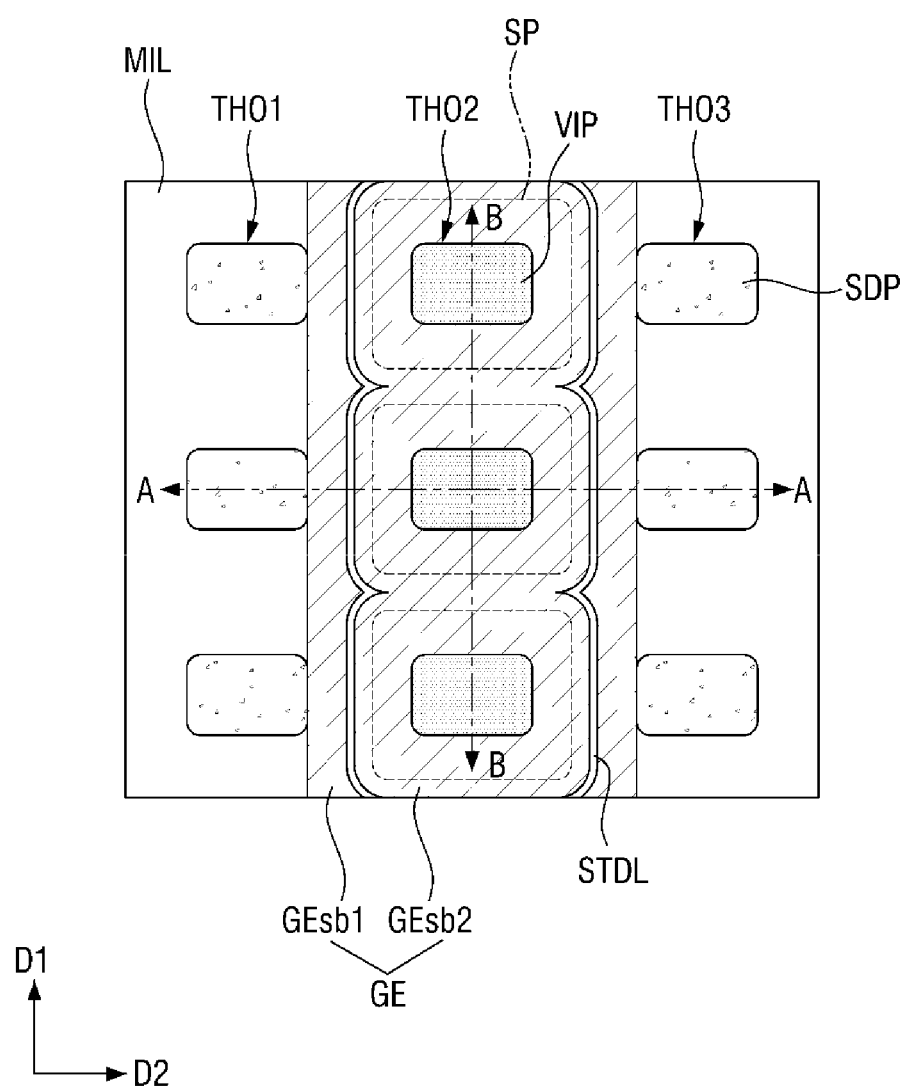
Figure 28A:
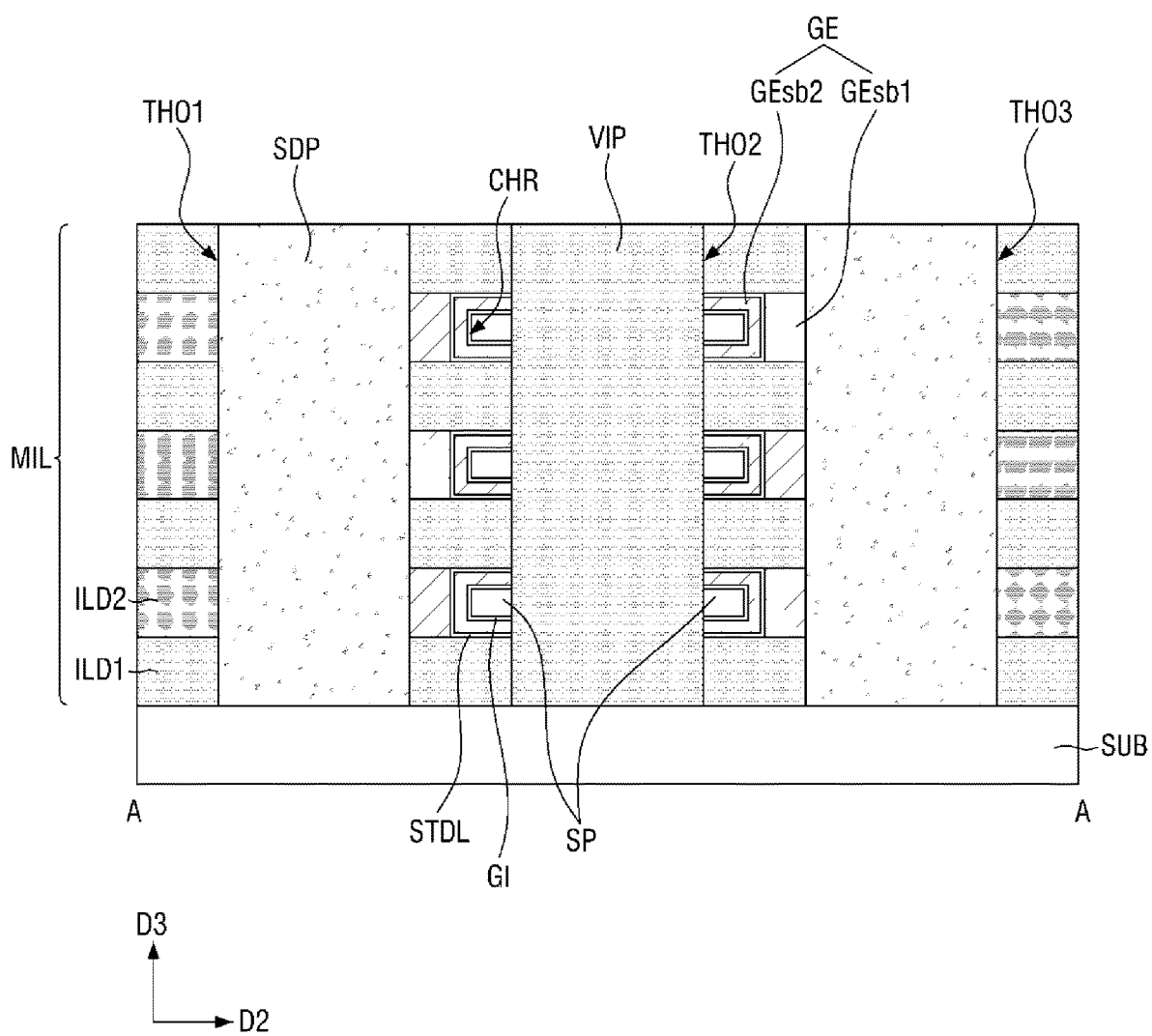
Figure 28B:
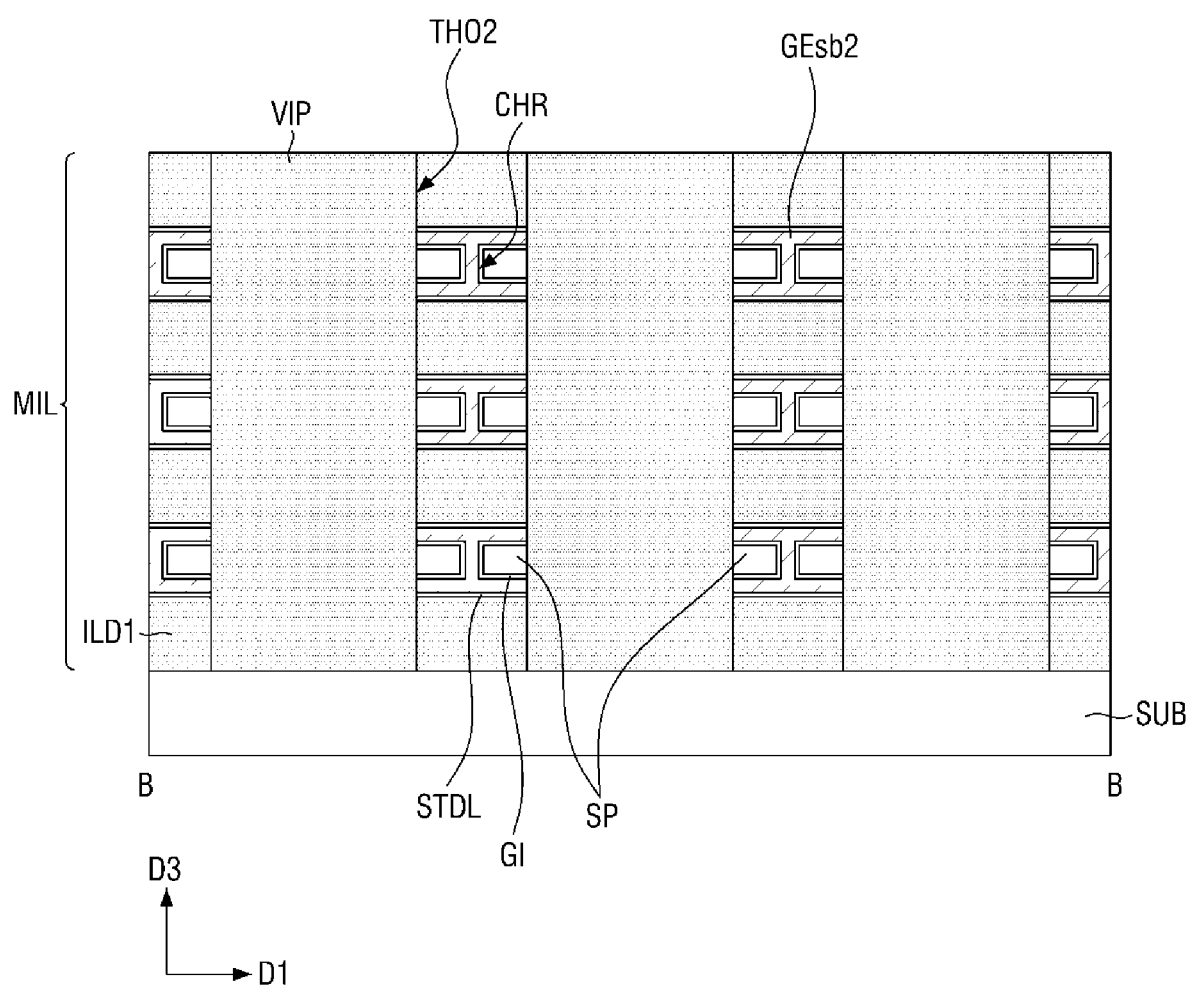

Referring to FIGS. 27 through 28B, gate insulating films GI may be formed along the profiles of the channel recesses CHR. In some embodiments, the gate insulating films GI may have a have a uniform thickness and may be formed conformally on the underlying structure as illustrated in FIGS. 28A and 28B.

Thereafter, semiconductor patterns SP may be formed on the gate insulating films GI and may be formed in (e.g., fill) the channel recesses CHR. In some embodiments, semiconductor films may be formed on the gate insulating films GI to fill the channel recesses CHR and to extend along the sidewalls of each of the second through holes THO2. The semiconductor films may be trimmed (e.g., may be partially etched) so that parts of the semiconductor films that extend along the sidewalls of each of the second through holes THO2 may be removed.

Thereafter, vertical insulating structures VIP may be formed in the second through holes THO2 to fill the second through holes THO2.

Figure 29:
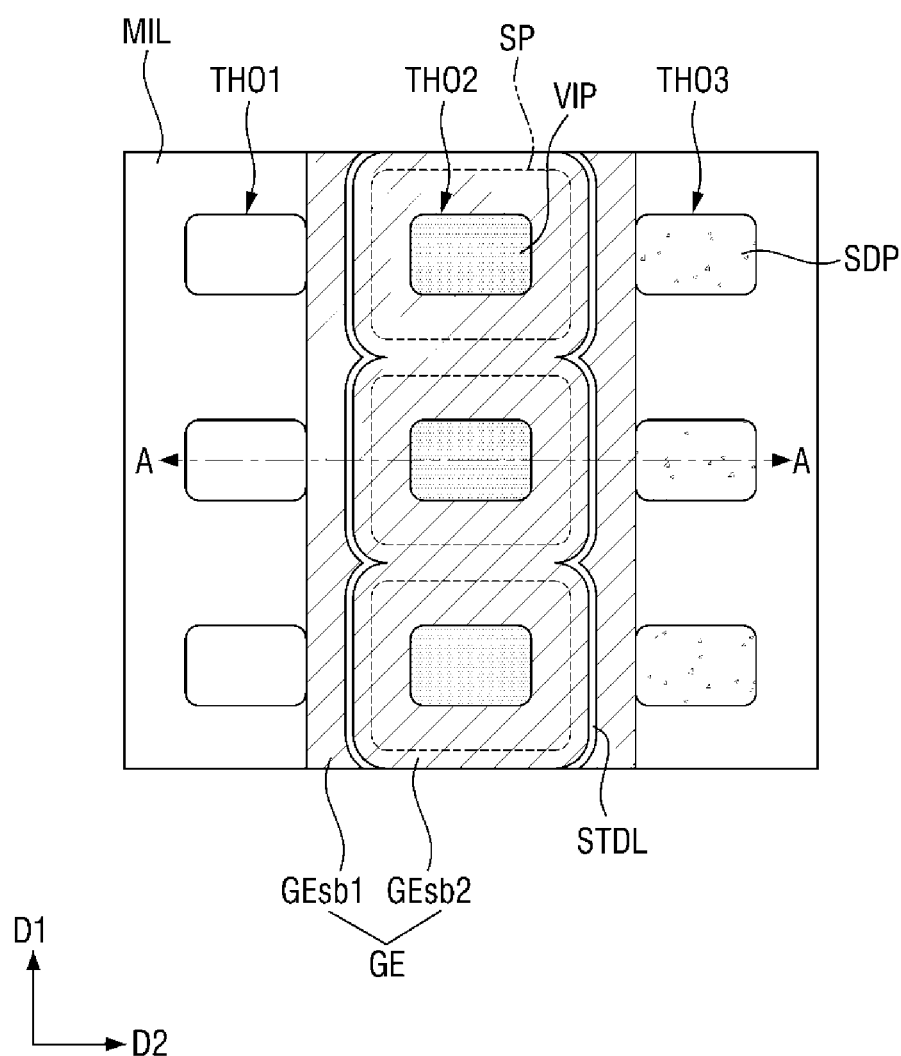
Figure 30:
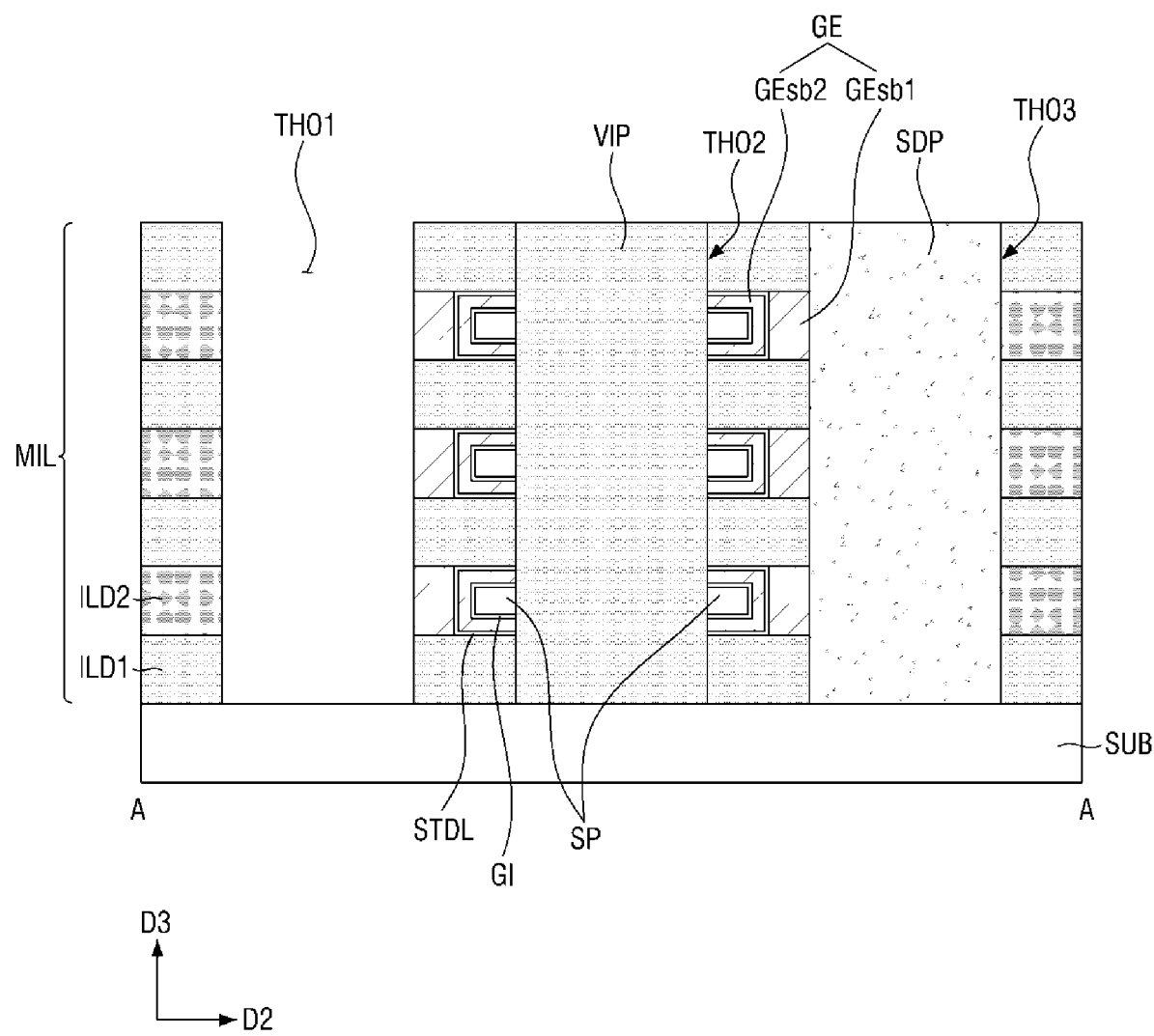

Referring to FIGS. 29 and 30, the sacrificial insulating patterns SDP in the first through holes THO1 may be removed. In some embodiments, the sacrificial insulating patterns SDP in the first through holes THO1 may be removed entirely as illustrated in FIG. 30 but the present disclosure is not limited thereto. In some embodiments, portion(s) of the sacrificial insulating patterns SDP in the first through holes THO1 may remain.

The first mold insulating layers ILD1 and the second mold insulating layers ILD2 may be exposed by the first through holes THO1.

Parts of the first sub-gates GEsb1 may also be exposed.

Figure 31:
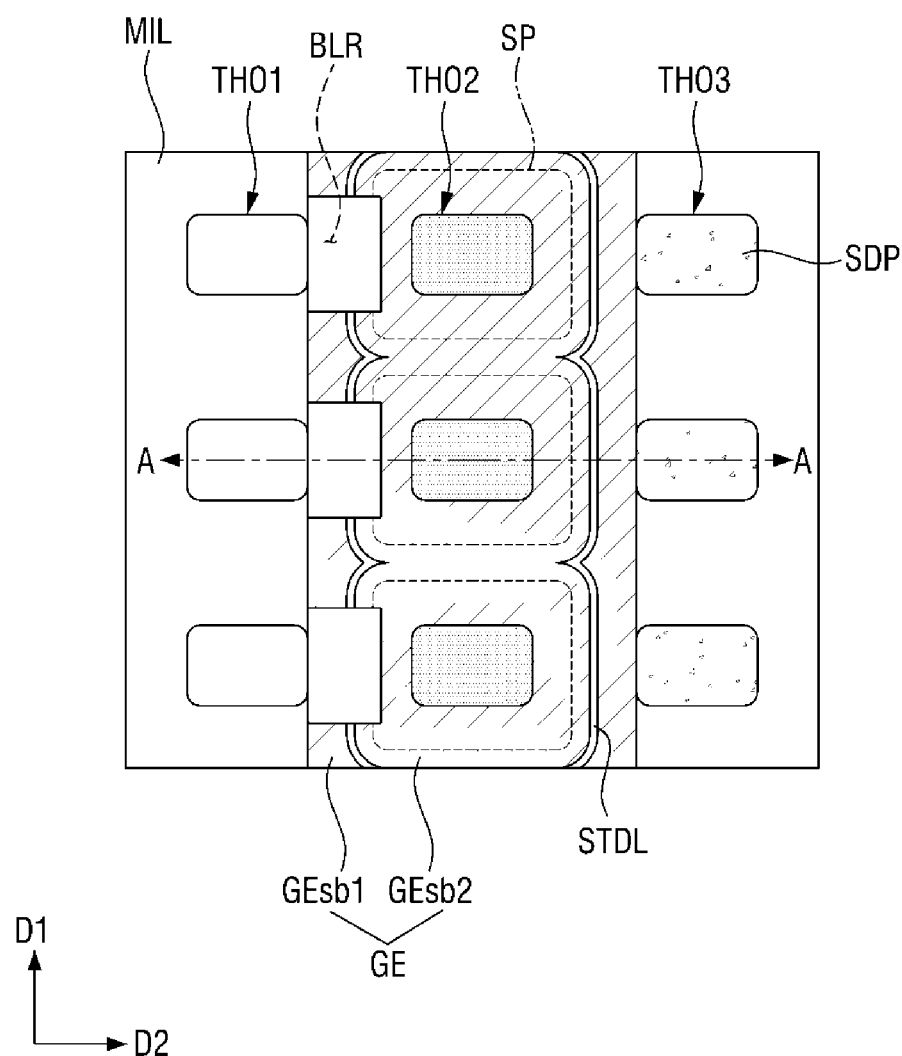
Figure 32A:
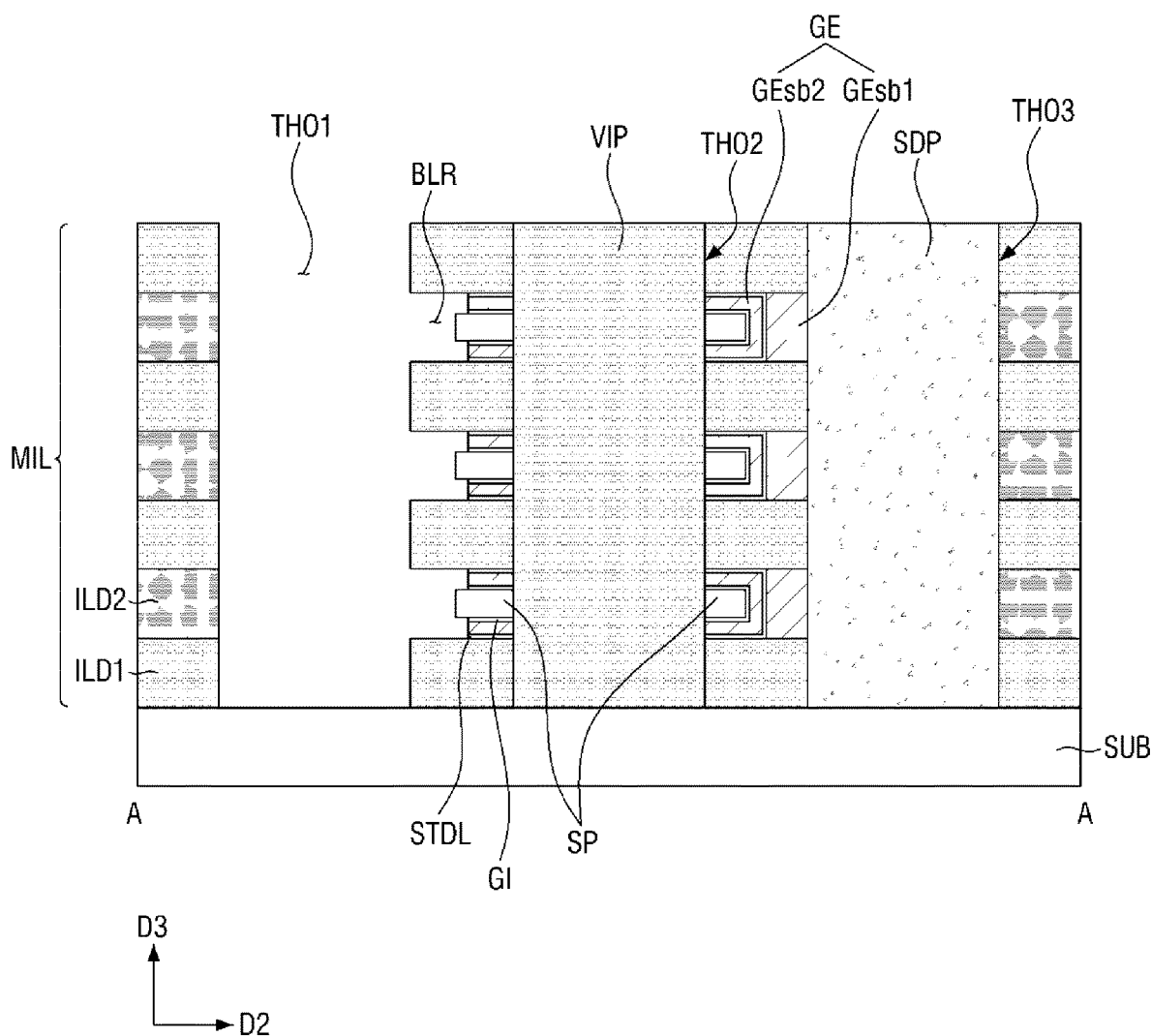
Figure 32B:
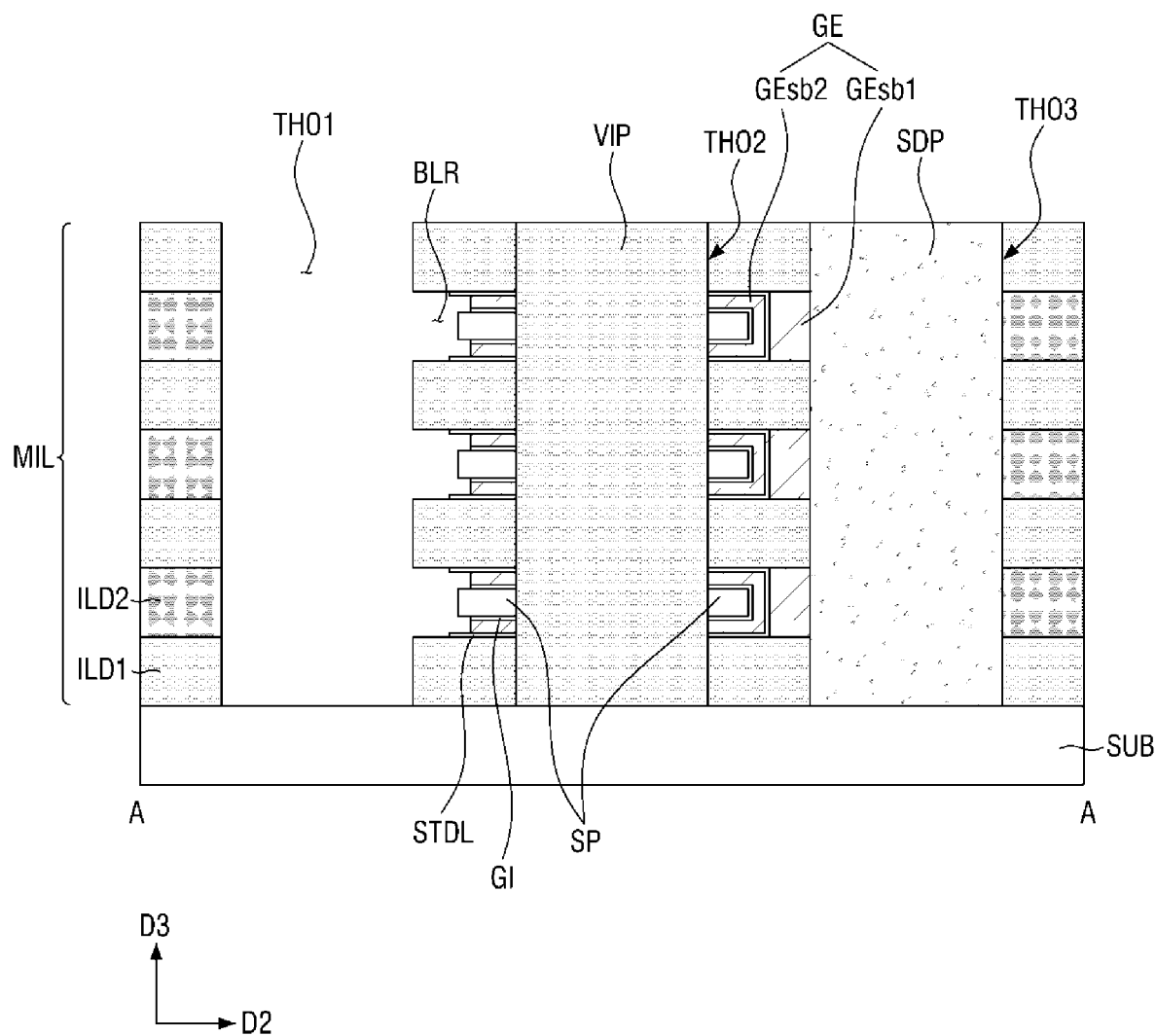

Referring to FIGS. 31 through 32B, first sides of the semiconductor patterns SP may be exposed by removing parts of the gate electrodes GE, exposed by the first through holes THO1. As a result, bitline recesses BLR may be formed in the mold structure MIL.

Specifically, the stopper insulating films STDL may be exposed by removing parts of the first-sub gates GEsb1, exposed by the first through holes TH01. While the parts of the first-sub gates GEsb1, exposed by the first through holes TH01, are being removed, the stopper insulating films STDL may reduce or possibly prevent etching of the second sub-gates GEsb2. The stopper insulating films STDL may function as blocking insulating films.

The second sub-gates GEsb2 may be exposed by removing parts of the stopper insulating films STDL that are exposed. Sidewalls of the semiconductor patterns SP on the first sides of the semiconductor patterns SP may be exposed by removing parts of the second sub-gates GEsb2, exposed by the first through holes THO1, and parts of the gate insulating films GI.

While the parts of the second sub-gates GEsb2, exposed by the first through holes THO1, are being removed, parts of the second sub-gates GEsb2 on the top surfaces and the bottom surfaces of the semiconductor patterns SP may also be removed.

Referring to FIG. 32A, parts of the stopper insulating films STDL, exposed by the bitline recesses BLR, may be aligned with parts of the second sub-gates GEsb2, exposed by the bitline recesses BLR. In some embodiments, sides of the parts of the stopper insulating films STDL exposed by the bitline recesses BLR and sides of the parts of the second sub-gates GEsb2 exposed by the bitline recesses BLR may be coplanar with each other as illustrated in FIG. 32A.

Referring to FIG. 32B, the parts of the stopper insulating films STDL, exposed by the bitline recesses BLR, may not be aligned with the parts of the second sub-gates GEsb2, exposed by the bitline recesses BLR. In some embodiments, sides of the parts of the stopper insulating films STDL exposed by the bitline recesses BLR and sides of the parts of the second sub-gates GEsb2 exposed by the bitline recesses BLR may not be coplanar with each other as illustrated in FIG. 32B. The parts of the stopper insulating films STDL, exposed by the bitline recesses BLR, will hereinafter be described as being aligned with the parts of the second sub-gates GEsb2, exposed by the bitline recesses BLR, as illustrated in FIG. 32A.

Figure 33:
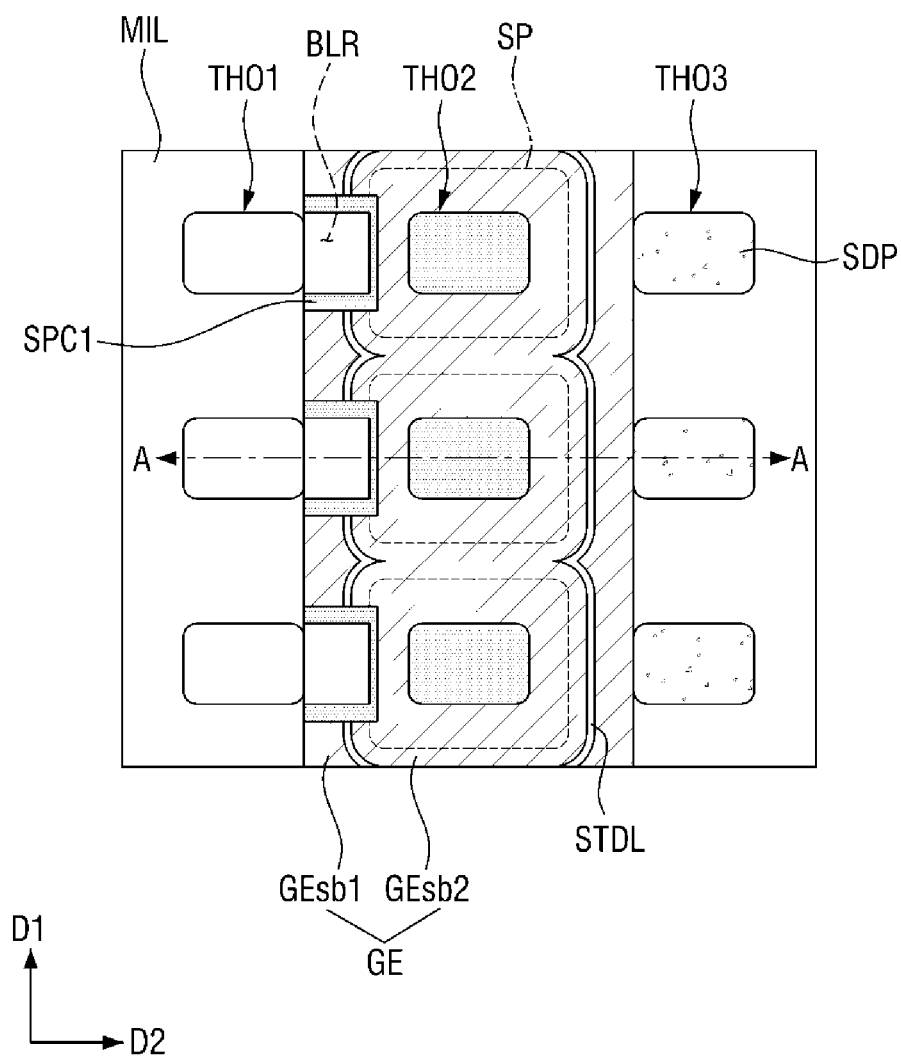
Figure 34:
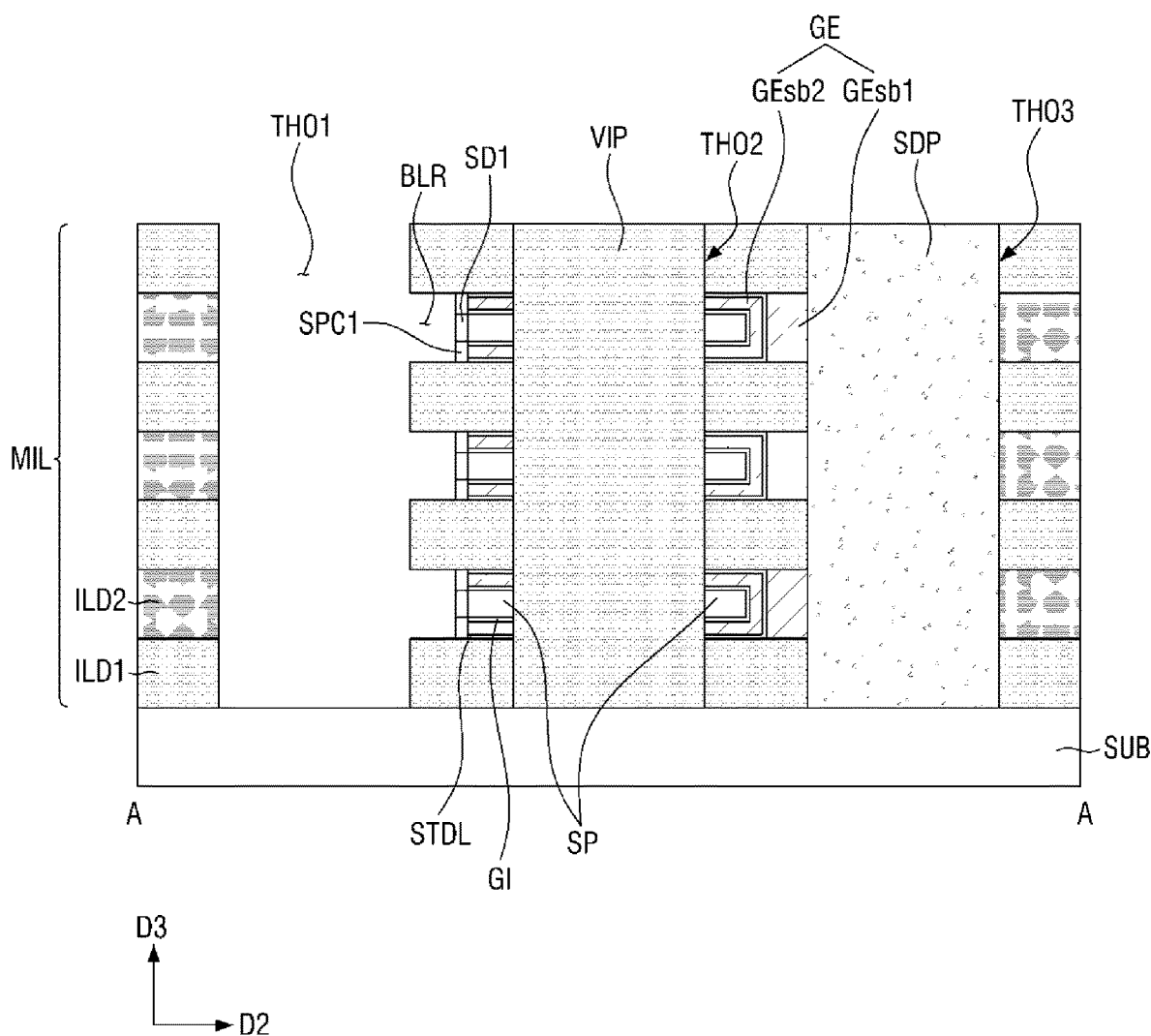

Referring to FIGS. 33 and 34, first spacers SPC1 may be formed in the bitline recesses BLR.

The first spacers SPC1 may be formed on sidewalls of the parts of the first sub-gates GEsb1, exposed by the bitline recesses BLR, and on sidewalls of the parts of the second sub-gates GEsb2, exposed by the bitline recesses BLR. After the first spacers SPC1 are formed, the first sub-gates GEsb1 and the second sub-gates GEsb2 may not be exposed by the bitline recesses BLR. First impurity regions SD1 may be formed in the semiconductor patterns SP by doping parts of the semiconductor patterns SP, exposed by the bitline recesses BLR, with impurities.

Figure 35:
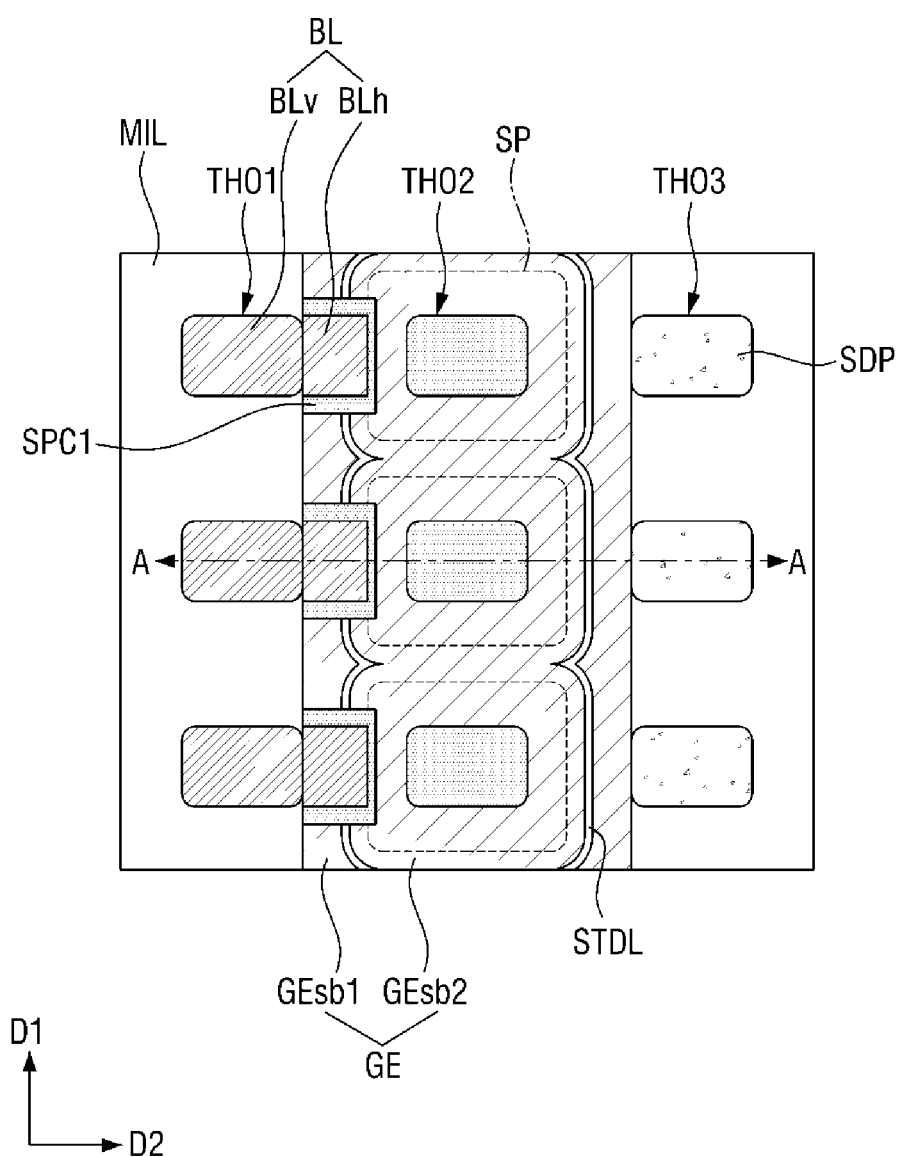
Figure 36:
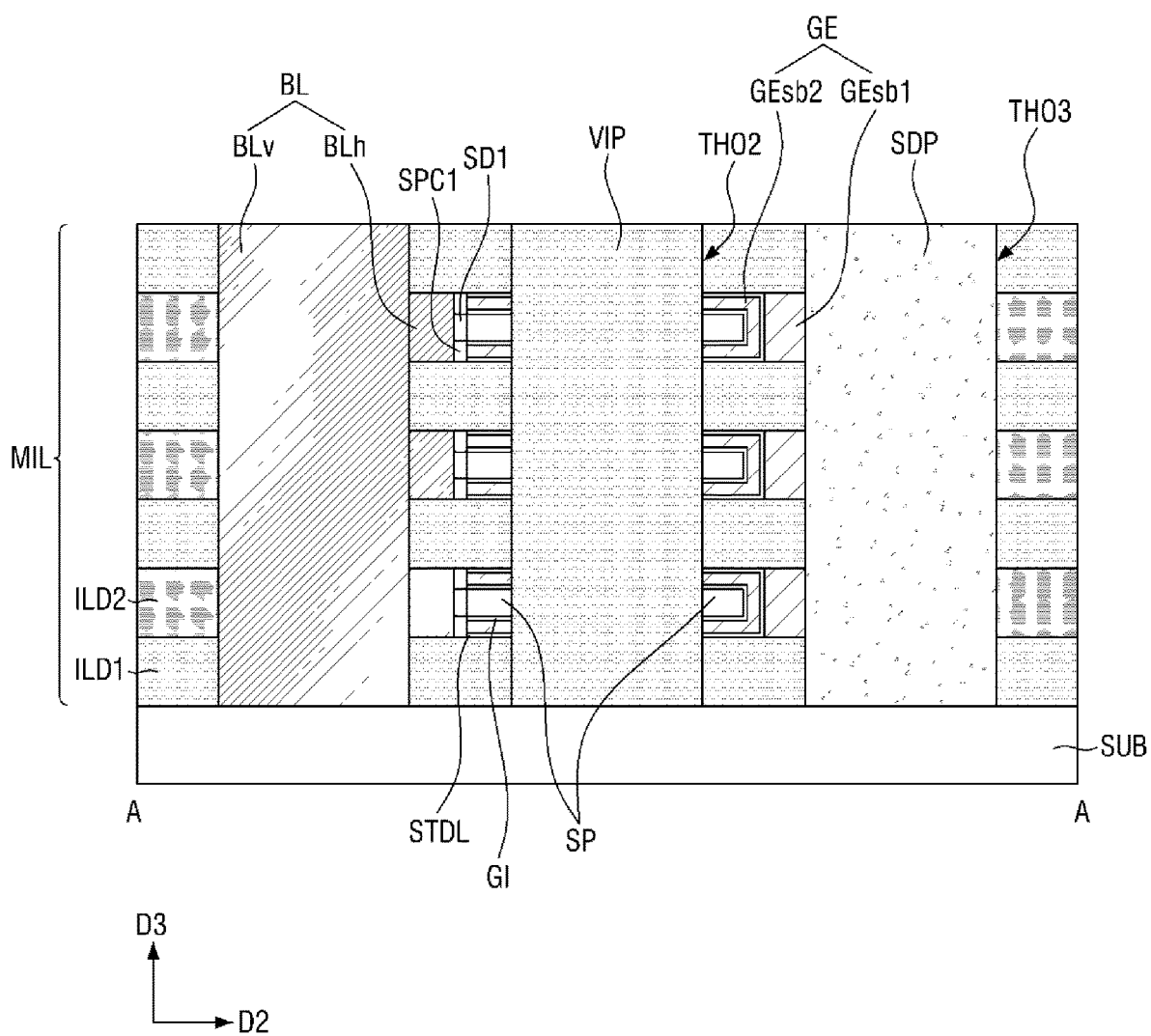

Referring to FIGS. 35 and 36, bitlines BL may be formed in the bitline recesses BLR and in the first through holes THO1. Vertical parts BLv of the bitlines BL may be formed in the first through holes THO1, and horizontal parts BLh of the bitlines BL may be formed in the bitline recesses BLR.

Figure 37:
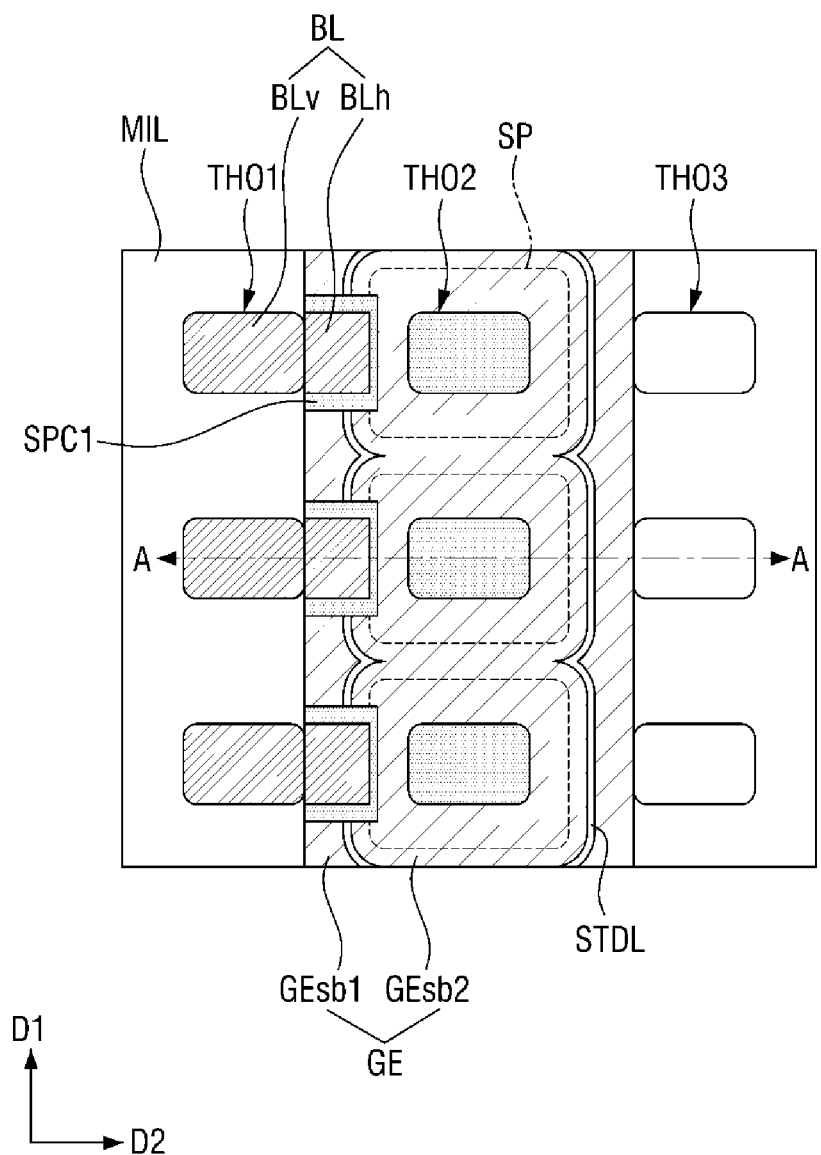
Figure 38:
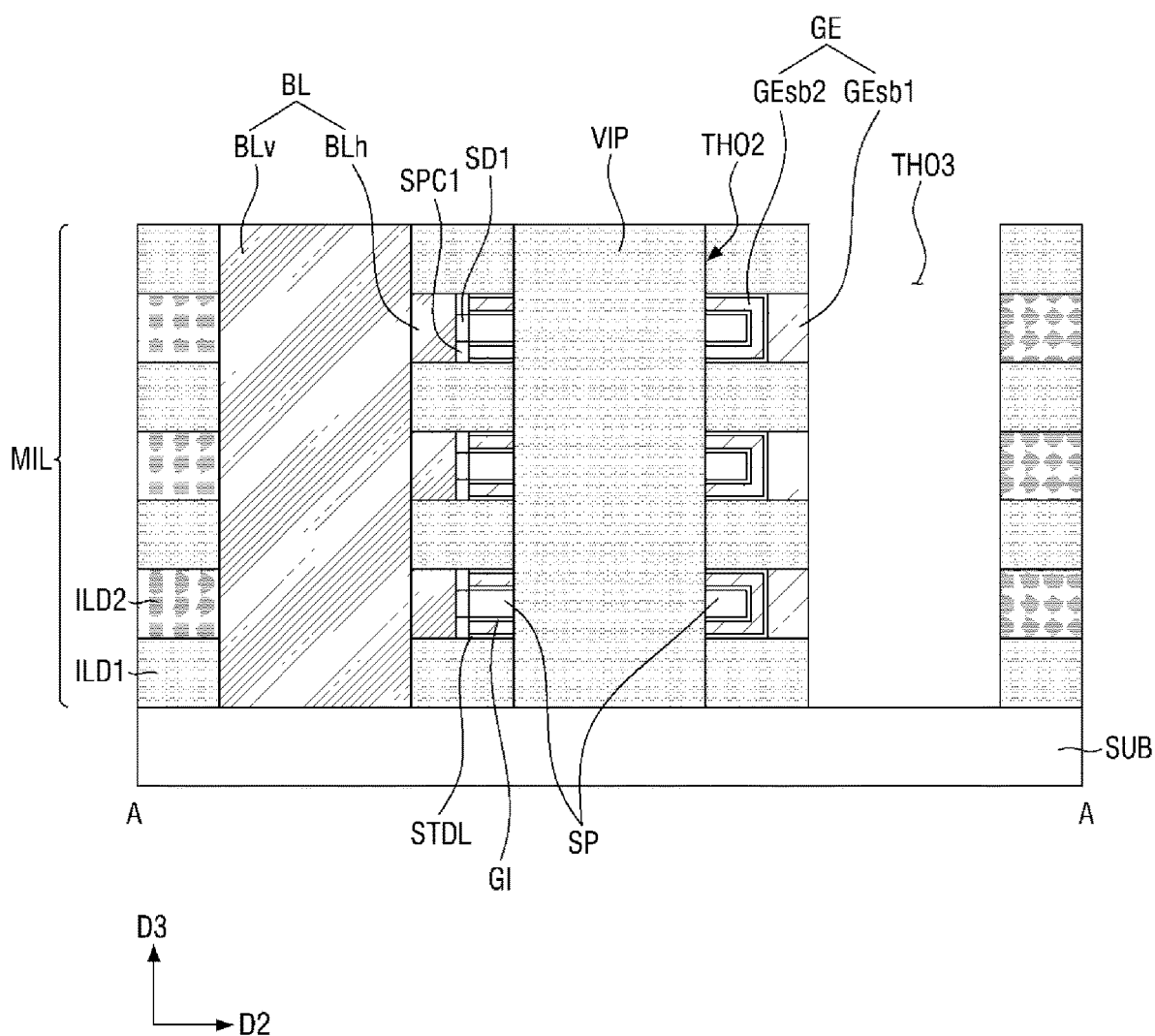

Referring to FIGS. 37 and 38, the sacrificial insulating patterns SDP in the third through holes THO3 may be removed. In some embodiments, the sacrificial insulating patterns SDP in the third through holes THO3 may be removed entirely as illustrated in FIG. 38 but the present disclosure is not limited thereto. In some embodiments, portion(s) of the sacrificial insulating patterns SDP in the third through holes THO3 may remain.

The first mold insulating layers ILD1 and the second mold insulating layers ILD2, included in the mold structure MIL, may be exposed by the third through holes THO3. Parts of the first sub-gates GEsb1 may also be exposed.

Figure 39:
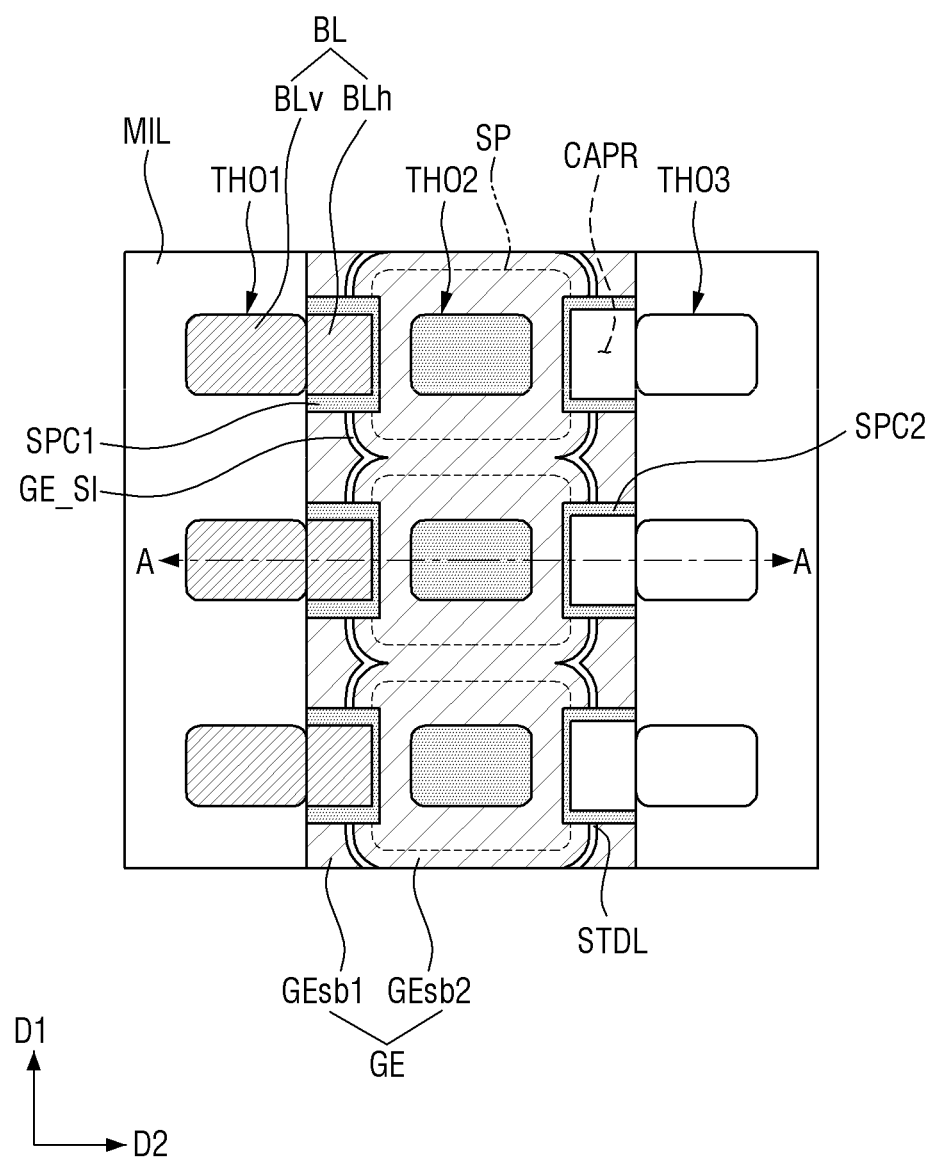
Figure 40:
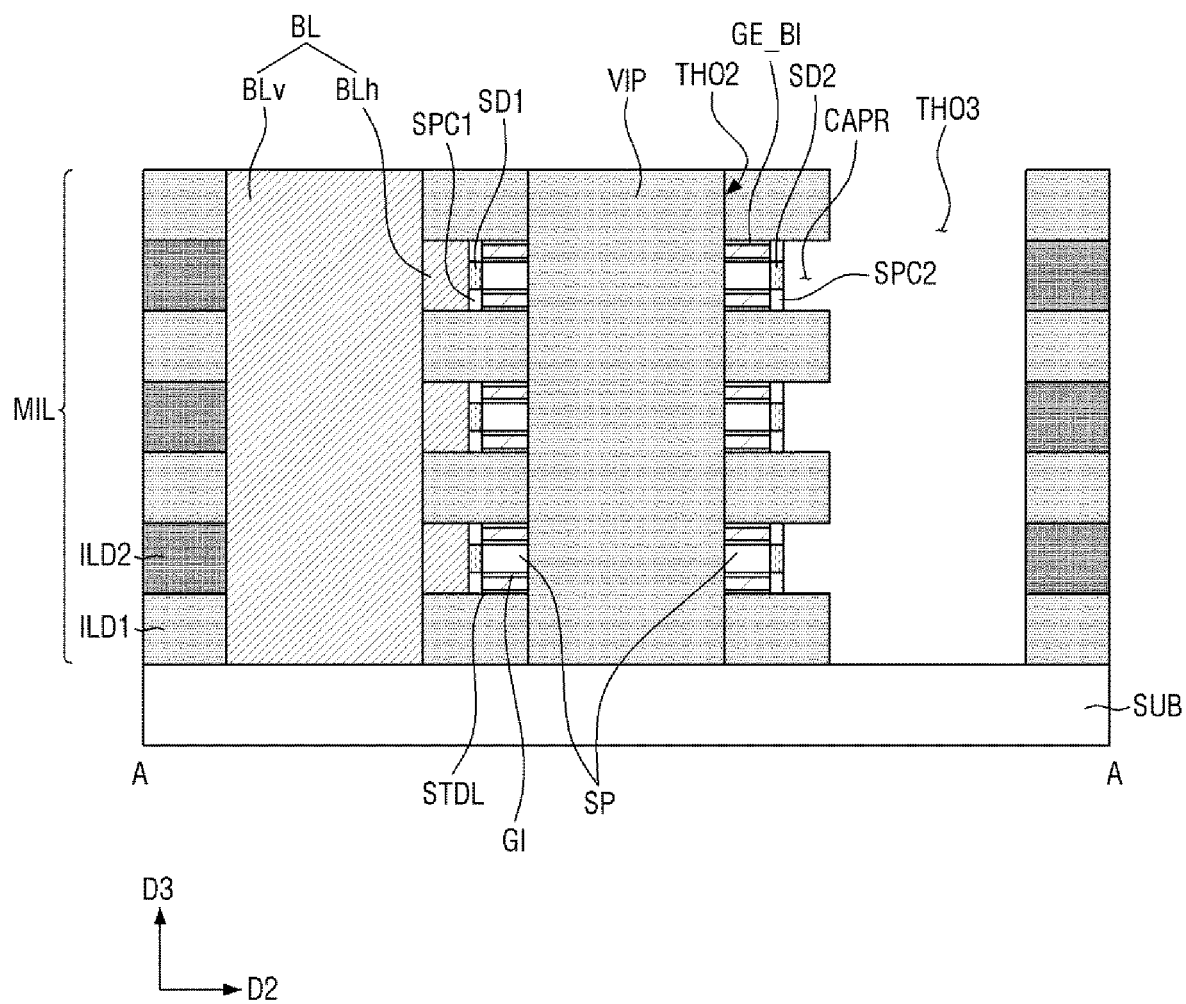

Referring to FIGS. 39 and 40, second sides of the semiconductor patterns SP may be exposed by removing parts of the gate electrodes GE, exposed by the third through holes THO3. As a result, capacitor recesses CAPR may be formed in the mold structure MIL.

Specifically, the stopper insulating films STDL may be exposed by removing parts of the first sub-gates GEsb1, exposed by the third through holes THO3.

The second sub-gates GEsb2 may be exposed by removing exposed parts of the stopper insulating films STDL. As a result of the etching of the stopper insulating films STDL for exposing the second sub-gates GEsb2, insertion insulating films GE_SI and blocking insulating films GE_BI may be formed.

Sidewalls of the semiconductor patterns SP on the second sides of the semiconductor patterns SP may be exposed by removing parts of the second sub-gates GEsb2, exposed by the third through holes THO3, and parts of the gate insulating films GI.

While the parts of the second sub-gates GEsb2, exposed by the third through holes THO3, are being removed, parts of the second sub-gates GEsb2 on the top surfaces and the bottom surfaces of the semiconductor patterns SP may also be removed. As a result, capacitor recesses CAPR may be formed between the first mold insulating layers ILD1.

Second spacers SPC2 may be formed in the capacitor recesses CAPR.

The second spacers SPC2 may be formed on sidewalls of parts of the first sub-gates GEsb1, exposed by the capacitor recesses CAPR, and sidewalls of parts of the second sub-gates GEsb2, exposed by the capacitor recesses CAPR. After the second spacers SPC2 are formed, the first sub-gates GEsb1 and the second sub-gates GEsb2 may not be exposed by the capacitor recesses CAPR.

Thereafter, second impurity regions SD2 may be formed in the semiconductor patterns SP by doping parts of the semiconductor patterns SP, exposed by the capacitor recesses CAPR, with impurities.

Figure 41:
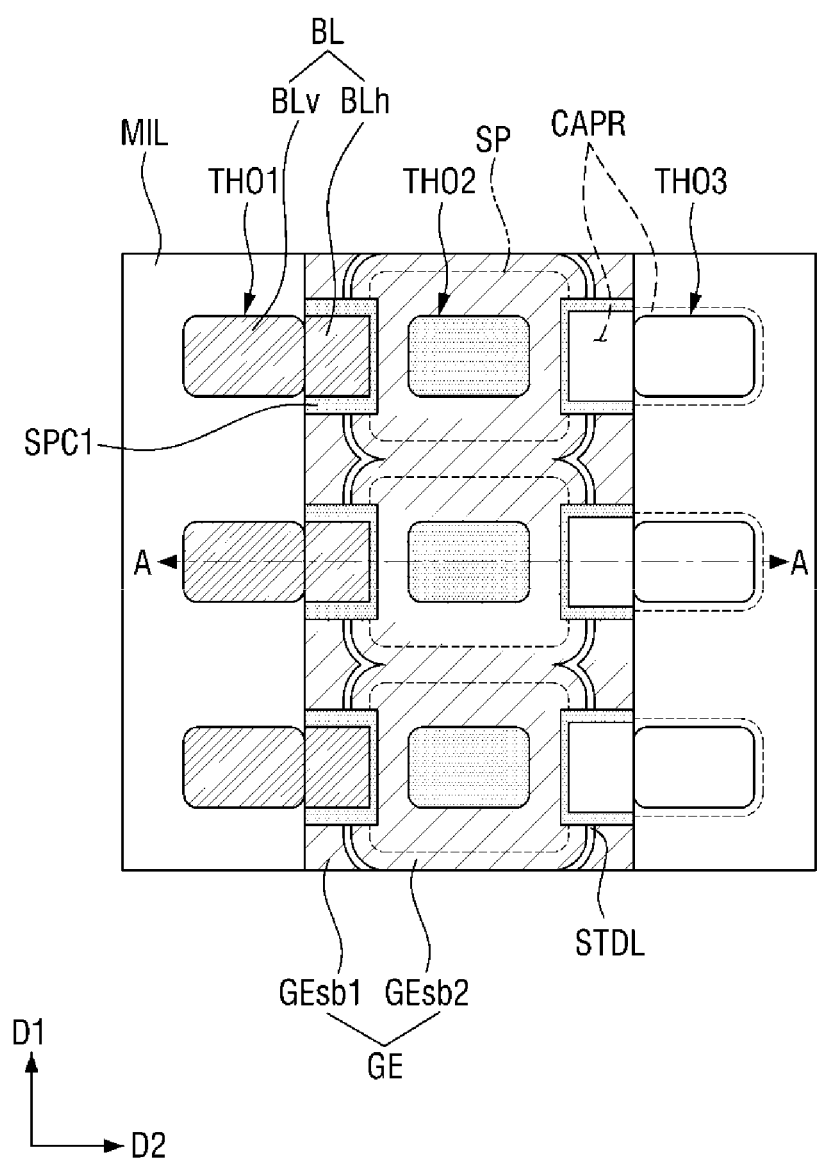
Figure 42:
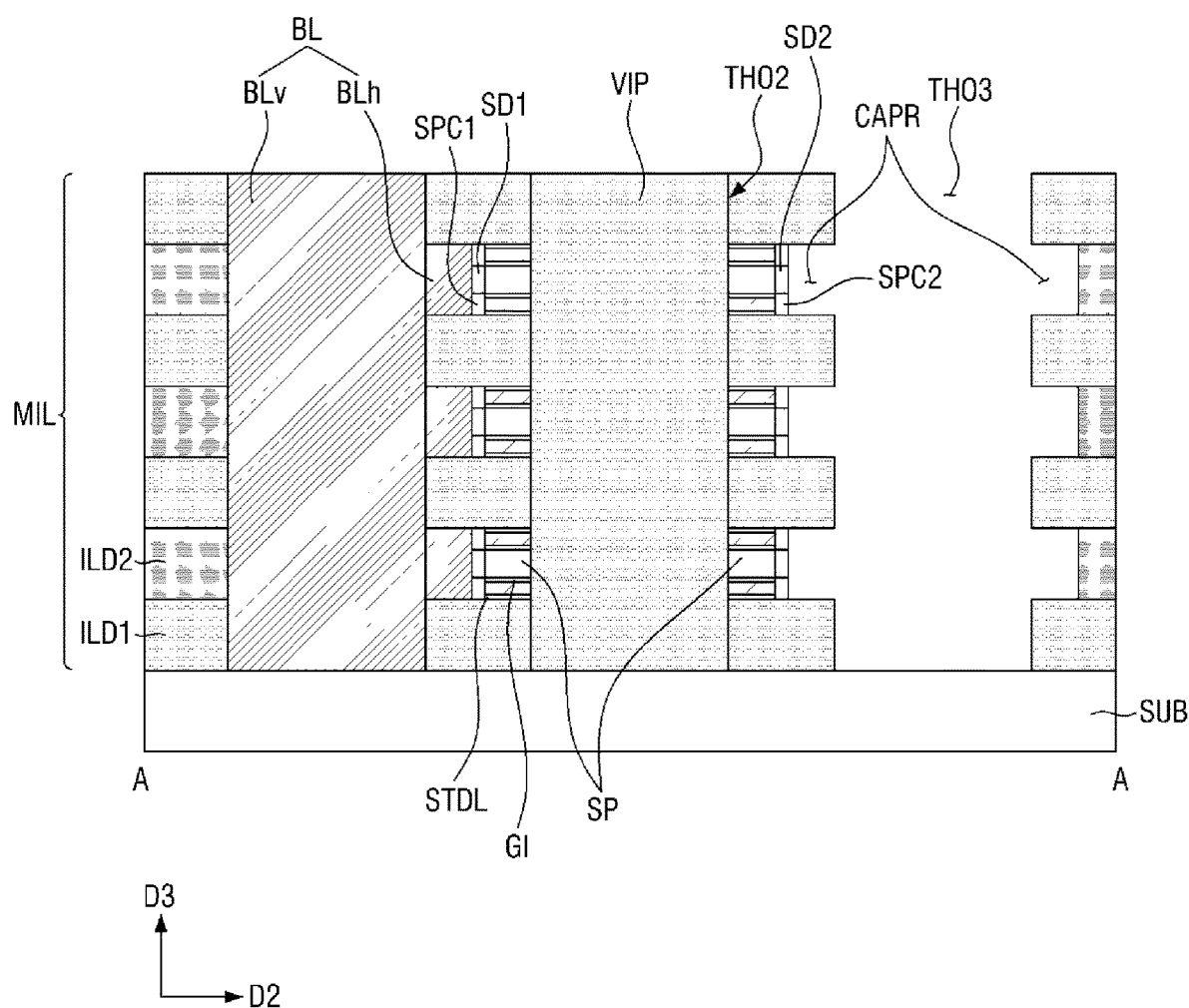

Referring to FIGS. 41 and 42, the capacitor recesses CAPR may be enlarged by etching parts of the second mold insulating layers ILD2, exposed by the third through holes THO3. In other words, the capacitor recesses CAPR may be expanded into other regions of the mold structure MTh by etching the parts of the second mold insulating layers ILD2, exposed by the third through holes THO3.

Figure 43:
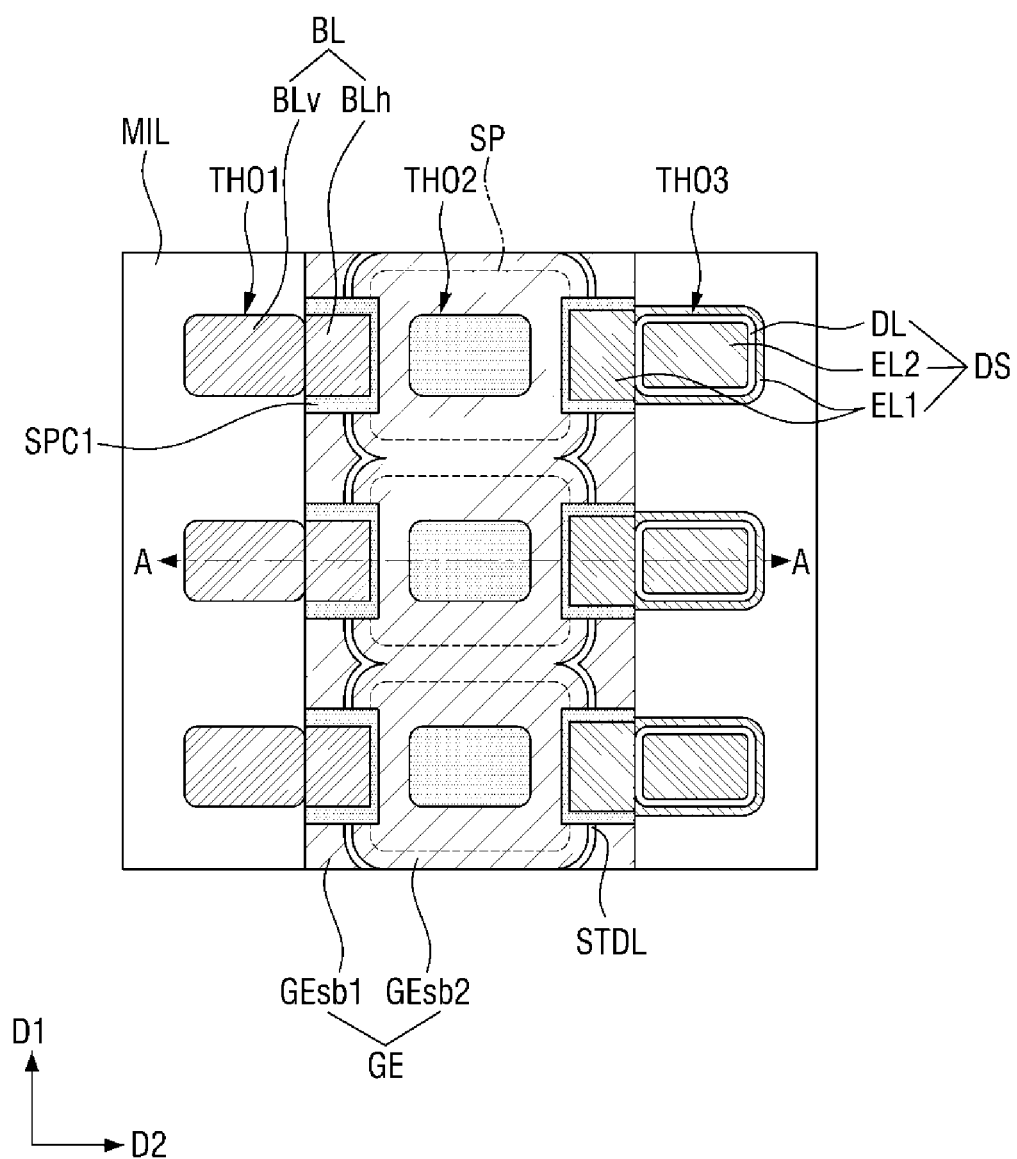
Figure 44:
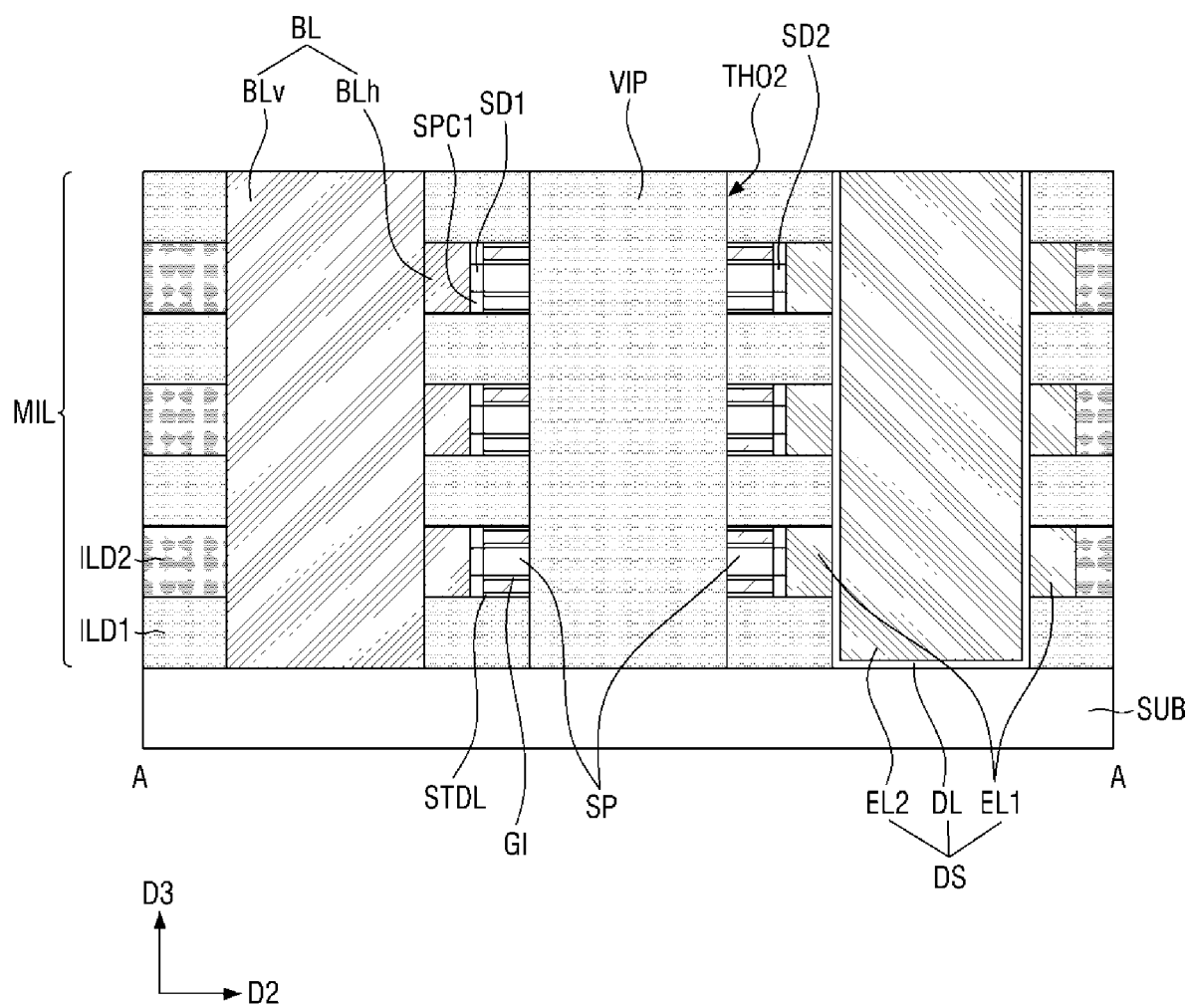

Referring to FIGS. 43 and 44, information storage elements DS, which are connected to the semiconductor patterns SP, may be formed in the capacitor recesses CAPR and the third through holes THO3.

Specifically, first electrodes EL1 may be formed to fill the capacitor recesses CAPR, and then, dielectric films DL may be formed along the sidewalls of each of the third through holes THO3 and along the sidewalls of each of the first electrodes EL1.

Thereafter, second electrodes EL2 may be formed on the dielectric films DL.

In some embodiments, the first electrodes EL1 may be formed along the profiles of the capacitor recesses CAPR, and the dielectric films DL may be formed on the first electrodes ELL along the profiles of the capacitor recesses CAPR and along the sidewalls of each of the third through holes THO3.

Thereafter, the second electrodes EL2 may be formed on the dielectric films DL to fill the capacitor recesses CAPR and the third through holes THO3. As a result, the information storage elements DS of FIGS. 6A and 6B can be obtained.

Further, in some embodiments, the first electrodes EL1 may be formed along the profiles of the capacitor recesses CAPR. Thereafter, the diameters of the third through holes THO3 may be enlarged by removing parts of the first mold insulating layers ILD1, exposed by the third through holes THO3. Thereafter, the dielectric films DL and the second electrodes EL2 may be formed. As a result, the information storage elements DS of FIG. 7 can be obtained.

In some embodiments, unlike in the embodiment of FIGS. 13 through 44, the stopper insulating films STDL may not be formed between the first sub-gates GEsb1 and the second sub-gates GEsb2.

Also, in some embodiments, unlike in the embodiment of FIGS. 13 through 44, the first sub-gates GEsb1 and the stopper insulating films STDL may not be formed, and the second sub-gates GEsb2 may be formed, depending on the shapes of the first through holes THO1, the second through holes THO2, and the third through holes THO3, the distances in the first direction D1, between the first through holes THO1, between the second through holes THO2, and between the third through holes THO3, and the distances in the second direction D2 between the first through holes THO1, the second through holes THO2, and the third through holes THO3.

The above-disclosed subject matter is to be considered illustrative, and not restrictive, and the appended claims are intended to cover all such modifications, enhancements, and other embodiments, which fall within the scope of the present inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor memory device comprising:
    a vertical insulating structure extending in a first direction on a substrate;
    a semiconductor pattern extending along a sidewall of the vertical insulating structure, the semiconductor pattern comprising first and second sides that are opposite to each other and are spaced apart from each other in a second direction different from the first direction;
    a bitline on the first side of the semiconductor pattern, the bitline extending in the first direction and being electrically connected to the semiconductor pattern;
    an information storage element on the second side of the semiconductor pattern and including first and second electrodes, the first electrode having a cylindrical shape that extends in the first direction, and the second electrode extending along a sidewall of the first electrode; and
    a gate electrode on the semiconductor pattern and extending in the second direction.

2. The semiconductor memory device of claim 1, wherein the gate electrode includes an upper gate electrode on a first surface of the semiconductor pattern, a lower gate electrode on a second surface of the semiconductor pattern, and the second surface of the semiconductor pattern is opposite to the first surface of the semiconductor pattern.

3. The semiconductor memory device of claim 2, wherein the gate electrode further includes a connecting gate electrode connecting the upper and lower gate electrodes to each other, and
    the connecting gate electrode is on an outer sidewall of the semiconductor pattern, and the outer sidewall of the semiconductor pattern connects the first and second surfaces of the semiconductor pattern to each other.

4. The semiconductor memory device of claim 1, wherein the bitline includes a vertical portion extending in the first direction, and a horizontal portion protruding from the vertical portion to connect the vertical portion to the semiconductor pattern.

5. The semiconductor memory device of claim 1, wherein the information storage element further includes a dielectric film between the first and second electrodes,
    the second electrode includes upper and lower plate regions, the upper and lower plate regions are spaced apart from each other in the first direction, and the second electrode further includes a connecting region connecting the upper and lower plate regions to each other, and
    the dielectric film extends along sidewalls of the connecting region, along a first surface of the lower plate region, and along a second surface of the upper plate region, and the first surface of the lower plate region faces the second surface of the upper plate region.

6. The semiconductor memory device of claim 1, wherein the information storage element further includes a dielectric film between the first and second electrodes,
    the second electrode includes upper and lower plate regions, the upper and lower plate regions are spaced apart from each other in the first direction, and the second electrode further includes a connecting region connecting the upper and lower plate regions to each other, and
    the dielectric film extends along first and second surfaces of the lower plate region, the first and second surfaces of the lower plate region are opposite to each other, the dielectric film extends along third and fourth surfaces of the upper plate region, and the third and fourth surfaces of the upper plate region are opposite to each other.

7. The semiconductor memory device of claim 1, wherein the information storage element further includes a dielectric film between the first and second electrodes,
    the second electrode includes top and bottom surfaces, and the top and bottom surfaces of the second electrode are spaced apart from each other in the first direction, and
    the second electrode further includes outer and inner sidewalls, and each of the outer and inner sidewalls of the second electrode connects the top and bottom surfaces of the second electrode to each other.

8. The semiconductor memory device of claim 1, wherein the vertical insulating structure extends through the semiconductor pattern.

9. The semiconductor memory device of claim 1, wherein the gate electrode encloses the sidewall of the vertical insulating structure.

10. The semiconductor memory device of claim 1, wherein the semiconductor pattern and the first electrode of the information storage element overlap each other in the second direction.

11. A semiconductor memory device comprising:
    a bitline on a substrate, the bitline extending in a first direction that is perpendicular to a top surface of the substrate;
    a gate electrode including upper and lower gate electrodes and a plurality of connecting gate electrodes, wherein each of the upper and lower gate electrodes extends in a second direction that is parallel to the top surface of the substrate, and the plurality of connecting gate electrodes are arranged in the second direction, and wherein the upper gate electrode is spaced apart from the lower gate electrode in the first direction, and each of the plurality of connecting gate electrodes connects the upper and lower gate electrodes to each other;
    a semiconductor pattern between the lower and upper gate electrodes and between a pair of adjacent connecting gate electrodes of the plurality of connecting gate electrodes, the semiconductor pattern being electrically connected to the bitline;
    a vertical insulating structure between the pair of adjacent connecting gate electrodes, the vertical insulating structure extending through the upper and lower gate electrodes and the semiconductor pattern and extending in the first direction; and
    an information storage element electrically connected to the semiconductor pattern.

12. The semiconductor memory device of claim 11, wherein the semiconductor pattern extends on a sidewall of the vertical insulating structure.

13. The semiconductor memory device of claim 11, further comprising:
a gate insulating film extending along top and bottom surfaces of the semiconductor pattern and sidewalls of the semiconductor pattern, wherein the top and bottom surfaces of the semiconductor pattern are opposite to each other and spaced apart from each other in the first direction, and each of the sidewalls of the semiconductor pattern connects the top and bottom surfaces of the semiconductor pattern to each other.

14. The semiconductor memory device of claim 11, further comprising:
a dummy gate electrode on sidewalls of the plurality of connecting gate electrodes; and
an insertion insulating film between the dummy gate electrode and the plurality of connecting gate electrodes,
wherein the insertion insulating film, the dummy gate electrode, and one of the plurality of connecting gate electrodes are arranged in a third direction, which is different from the second direction.

15. The semiconductor memory device of claim 11, wherein the information storage element includes a first electrode electrically connected to the semiconductor pattern, a second electrode on the first electrode, and a dielectric film between the first and second electrodes.

16. The semiconductor memory device of claim 15, wherein the first electrode has a closed-loop shape.

17. The semiconductor memory device of claim 11, wherein the semiconductor pattern encloses a sidewall of the vertical insulating structure.

18. A semiconductor memory device comprising:
a bitline on a substrate, the bitline extending in a first direction that is perpendicular to a top surface of the substrate;
a semiconductor pattern on the substrate, the semiconductor pattern being electrically connected to the bitline and having a first loop shape;
a gate electrode on the semiconductor pattern and extending in a second direction that is parallel to the top surface of the substrate; and
an information storage element electrically connected to the semiconductor pattern,
wherein the information storage element includes a first electrode electrically connected to the semiconductor pattern, a second electrode spaced apart from the first electrode, and a dielectric film between the first and second electrodes,
the first electrode has a second loop shape, and
the bitline, the semiconductor pattern and the information storage element are arranged along the second direction, and the semiconductor pattern is between the bitline and the information storage element.

19. The semiconductor memory device of claim 18, wherein the gate electrode includes an upper gate electrode on a first surface of the semiconductor pattern, a lower gate electrode on a second surface of the semiconductor pattern, and the second surface of the semiconductor pattern is opposite to the first surface of the semiconductor pattern.

20. The semiconductor memory device of claim 18, further comprising:
a vertical insulating structure extending through the gate electrode and the semiconductor pattern and extending in the first direction.

* * * * *